(12) United States Patent
Oota et al.

(10) Patent No.: US 11,118,059 B2
(45) Date of Patent: Sep. 14, 2021

(54) FILM, FILM FORMING METHOD, OPTICAL FILTER, LAMINATE, SOLID IMAGE PICKUP ELEMENT, IMAGE DISPLAY DEVICE, AND INFRARED SENSOR

(71) Applicant: FUJIFILM Corporation, Tokyo (JP)

(72) Inventors: Kazuya Oota, Haibara-gun (JP); Kyohei Arayama, Haibara-gun (JP); Daisuke Sasaki, Haibara-gun (JP); Tokihiko Matsumura, Haibara-gun (JP); Shunsuke Kitajima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 443 days.

(21) Appl. No.: 16/052,051

(22) Filed: Aug. 1, 2018

(65) Prior Publication Data

US 2018/0340070 A1  Nov. 29, 2018

Related U.S. Application Data

(63) Continuation of application No. PCT/JP2017/003587, filed on Feb. 1, 2017.

(30) Foreign Application Priority Data

Feb. 3, 2016 (JP) .............................. JP2016-019130

(51) Int. Cl.
*G02B 5/22* (2006.01)
*C09B 11/28* (2006.01)
(Continued)

(52) U.S. Cl.
CPC ............. *C09B 11/28* (2013.01); *C09B 11/12* (2013.01); *C09B 11/24* (2013.01); *C09B 23/00* (2013.01);
(Continued)

(58) Field of Classification Search
CPC ........ G03F 7/0007; G03F 7/038; G03F 7/105; G03F 7/38; G02B 5/201; G02B 5/206; G02B 5/208; G02B 5/223; G02B 5/22
(Continued)

(56) References Cited

U.S. PATENT DOCUMENTS

2002/0110767 A1   8/2002  Tanaka et al.
2002/0175983 A1*  11/2002  Ishikawa ................ C09D 11/30
                                                      347/100
(Continued)

FOREIGN PATENT DOCUMENTS

CN   131933230 A   3/2011
CN   104854486 A   8/2015
(Continued)

OTHER PUBLICATIONS

Japanese Office Action dated Jul. 23, 2019, for corresponding Japanese Patent Application No. 2017-565585, with English translation.
(Continued)

*Primary Examiner* — John A McPherson
(74) *Attorney, Agent, or Firm* — Birch, Stewart, Kolasch & Birch, LLP

(57) ABSTRACT

Provided are a film having excellent heat resistance and a film forming method. In addition, provided are an optical filter, a laminate, a solid image pickup element, an image display device, and an infrared sensor. The film includes an aggregate of a dye and a resin, in which an average particle size of the aggregate of the dye is 30 to 450 nm.

29 Claims, 1 Drawing Sheet

(51) Int. Cl.
  *G03F 7/038* (2006.01)
  *C09B 57/00* (2006.01)
  *G02B 5/20* (2006.01)
  *G02B 3/00* (2006.01)
  *G03F 7/00* (2006.01)
  *C09B 11/24* (2006.01)
  *C09B 11/12* (2006.01)
  *C09B 23/01* (2006.01)
  *G03F 7/105* (2006.01)
  *C09B 23/00* (2006.01)
  *C09B 57/10* (2006.01)
  *G03F 7/38* (2006.01)
  *G02B 1/11* (2015.01)
  *C09D 11/328* (2014.01)

(52) U.S. Cl.
  CPC .......... *C09B 23/0075* (2013.01); *C09B 57/00* (2013.01); *C09B 57/007* (2013.01); *C09B 57/10* (2013.01); *G02B 3/0056* (2013.01); *G02B 5/201* (2013.01); *G02B 5/208* (2013.01); *G02B 5/22* (2013.01); *G03F 7/0007* (2013.01); *G03F 7/038* (2013.01); *G03F 7/105* (2013.01); *G03F 7/38* (2013.01); *C09D 11/328* (2013.01); *G02B 1/11* (2013.01)

(58) Field of Classification Search
  USPC .................................................. 430/7, 281.1
  See application file for complete search history.

(56) References Cited

U.S. PATENT DOCUMENTS

| | | | |
|---|---|---|---|
| 2011/0012075 A1 | 1/2011 | Nii et al. | |
| 2015/0287756 A1 | 10/2015 | Ezoe et al. | |
| 2016/0091643 A1 | 3/2016 | Arayama et al. | |
| 2017/0010528 A1 | 1/2017 | Takishita et al. | |
| 2017/0015484 A1 | 1/2017 | Kaimoto et al. | |
| 2018/0319989 A1* | 11/2018 | Haraguchi | C09B 57/002 |

FOREIGN PATENT DOCUMENTS

| | | |
|---|---|---|
| EP | 2927716 A1 | 10/2015 |
| JP | 2001/117201 A | 4/2001 |
| JP | 2006-208480 A | 8/2006 |
| JP | 2007-148072 A | 6/2007 |
| JP | 2009-263614 A | 11/2009 |
| JP | 2013-213982 A | 10/2013 |
| JP | 2014-130343 A | 7/2014 |
| JP | 2015-17244 A | 1/2015 |
| JP | 2015-34261 A | 2/2015 |
| KR | 10-2015-0081315 A | 7/2015 |
| TW | 201428068 A | 7/2014 |
| WO | WO 2014/084288 A1 | 6/2014 |
| WO | WO 2015/159865 A1 | 10/2015 |
| WO | WO 2015/166779 A1 | 11/2015 |

OTHER PUBLICATIONS

Taiwanese Office Action and Search Report for corresponding Taiwanese Application No. 106101830, dated Jun. 4, 2020, with an English translation.
Chinese Office Action dated Jul. 29, 2020 for corresponding Application No. 201780009346.X, along with an English translation.
Chinese Office Action for corresponding Chinese Application No. 201780009346.X, dated Nov. 10, 2020, with an English translation.
Japanese Office Action, dated Mar. 3, 2020, for corresponding Japanese Application No. 2017-565585, with an English translation.
Chinese Office Action and Search Report, dated Mar. 5, 2020, for corresponding Chinese Application No. 201780009346.X, with an English translation.
International Preliminary Report on Patentability and Written Opinion of the International Searching Authority (Forms PCT/IB/326, PCT/IB/373, and PCT/ISA/237) for International Application No. PCT/JP2017/003587, dated Aug. 16, 2018, with English translation.
International Search Report (Form PCT/ISA/210) for International Application No. PCT/JP2017/003587, dated May 9, 2017, with English translation.
Taiwanese Office Action, dated Nov. 30, 2020, for Taiwanese Application No. 106101830, with an English translation.
Chinese Decision of Rejection for corresponding Chinese Application No. 201780009346.X, dated Apr. 2, 2021, with English translation.

* cited by examiner

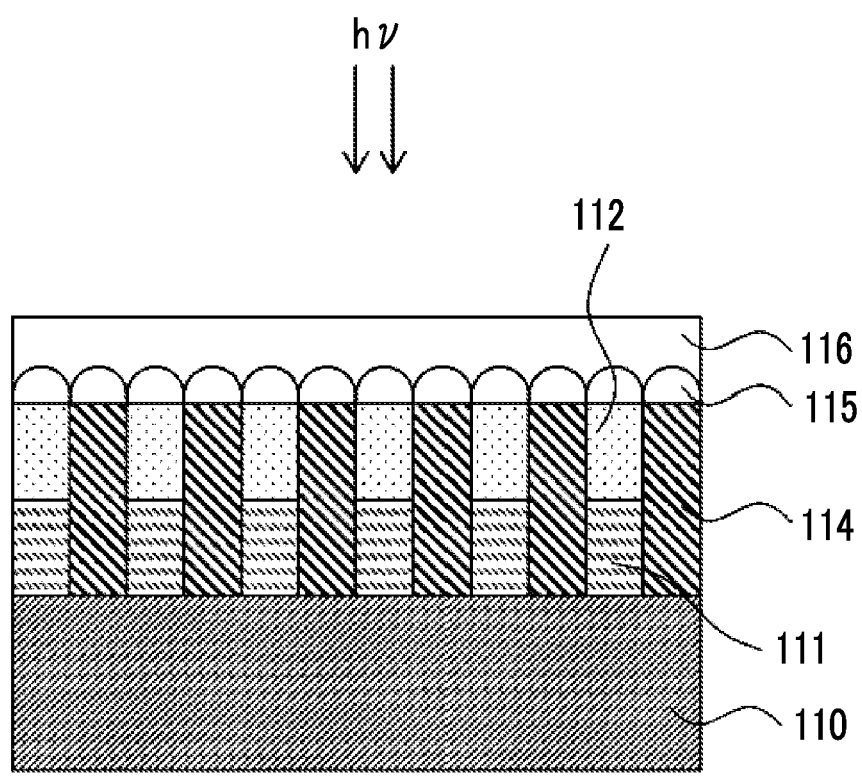

FILM, FILM FORMING METHOD, OPTICAL FILTER, LAMINATE, SOLID IMAGE PICKUP ELEMENT, IMAGE DISPLAY DEVICE, AND INFRARED SENSOR

CROSS-REFERENCE TO RELATED APPLICATIONS

This application is a Continuation of PCT International Application No. PCT/JP2017/003587 filed on Feb. 1, 2017, which claims priority under 35 U.S.C. § 119(a) to Japanese Patent Application No. 2016-019130 filed on Feb. 3, 2016. Each of the above application(s) is hereby expressly incorporated by reference, in its entirety, into the present application.

BACKGROUND OF THE INVENTION

1. Field of the Invention

The present invention relates to a film, a film forming method, an optical filter, a laminate, a solid image pickup element, an image display device, and an infrared sensor.

2. Description of the Related Art

Using a composition including a coloring material such as a pigment or a dye, a film such as an infrared cut filter has been formed.

For example, JP2015-17244A and JP2009-263614A describe that a film such as an infrared cut filter is formed using a composition including a pyrrolopyrrole compound. In addition, JP2015-34261A describes that a film such as an infrared cut filter is formed using a composition including a cyanine compound.

SUMMARY OF THE INVENTION

For example, in a case where a film is used for an optical filter such as an infrared cut filter, it is necessary that heat resistance as a property required for the film is excellent. Recently, further improvement of the property has been required.

On the other hand, in a case where a dye is used, time and efforts for dispersing or the like can be saved as compared to a case where a pigment is used. Therefore, a composition including a dye has an advantageous effect in that, for example, time and efforts for manufacturing a composition can be saved. In addition, a dye has an advantageous effect in that it has a higher color value than a pigment, and thus excellent spectral characteristics can be easily obtained in a film including a dye. However, a dye may have lower heat resistance than a pigment. Therefore, in a film including a composition including a dye, heat resistance tends to be lower than that of a film including a pigment.

Accordingly, an object of the present invention is to provide a film including a dye and having excellent heat resistance, and a film forming method. In addition, another object of the present invention is to provide an optical filter, a laminate, a solid image pickup element, an image display device, and an infrared sensor.

The present inventors performed a thorough investigation on a film including a dye, and found that the above-described object can be achieved by causing the dye to appropriately aggregate during formation of the film, thereby completing the present invention. The present invention provides the following.

<1> A film comprising:
an aggregate of a dye; and
a resin,
wherein an average particle size of the aggregate of the dye is 30 to 450 nm.

<2> The film according to <1>,
in which a glass transition temperature of the resin is 0° C. to 100° C.

<3> The film according to <1> or <2>,
in which a weight-average molecular weight of the resin is 20000 to 60000.

<4> The film according to any one of <1> to <3>,
in which the dye is a compound having an absorption maximum in a wavelength range of 650 to 1000 nm.

<5> The film according to any one of <1> to <4>,
in which the dye is at least one selected from the group consisting of a pyrrolopyrrole dye, a cyanine dye, and a squarylium dye.

<6> The film according to any one of <1> to <5>, further comprising:
a coloring material that allows transmission of at least a part of light in an infrared range and shields light in a visible range.

<7> A film forming method of forming the film according to any one of <1> to <6>, the film forming method comprising:
a step of applying a composition including a dye, a resin, and a solvent to a support to form a composition layer on the support; and
a step of causing the dye included in the composition layer to aggregate.

<8> The film forming method according to <7>,
in which the step of causing the dye included in the composition layer to aggregate is performed by heating the composition layer at a temperature that is higher than the glass transition temperature of the resin by 20° C. to 80° C.

<9> The film forming method according to <7> or <8>,
in which the resin includes a resin having a polymerizable group and the composition further includes a photopolymerization initiator, or the composition includes a polymerizable compound other than the resin and a photopolymerization initiator, and
the film forming method further comprises a step of exposing the composition layer after the step of causing the dye included in the composition layer to aggregate.

<10> The film forming method according to <9>,
in which the composition includes the polymerizable compound, and
a mass ratio resin/polymerizable compound of the resin to the polymerizable compound is 3 to 10.

<11> The film forming method according to any one of <7> to <10>, further comprising:
a step of forming a pattern.

<12> An optical filter comprising:
the film according to any one of <1> to <6>.

<13> The optical filter according to <12>,
in which the optical filter is a color filter, an infrared cut filter, or an infrared transmitting filter.

<14> The optical filter according to <12> or <13>, further comprising: an antireflection film.

<15> An optical filter comprising:
a pixel that includes the film according to any one of <1> to <6>; and
a pixel selected from the group consisting of a red pixel, a green pixel, a blue pixel, a magenta pixel, a yellow pixel, a cyan pixel, a black pixel, and an achromatic pixel.

<16> A laminate comprising:
an infrared cut filter that includes the film according to any one of <1> to <5>; and
a color filter that includes a chromatic colorant.
<17> A solid image pickup element comprising:
the film according to any one of <1> to <6>.
<18> An image display device comprising:
the film according to any one of <1> to <6>.
<19> An infrared sensor comprising:
the film according to any one of <1> to <6>.

According to the present invention, a film having excellent heat resistance and a film forming method can be provided. In addition, an optical filter, a laminate, a color filter, a solid image pickup element, an image display device, and an infrared sensor can be provided.

BRIEF DESCRIPTION OF THE DRAWING

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only irradiation using light but also drawing using a corpuscular beam such as an electron beam or an ion beam. In addition, regarding the exposure, "light" denotes an actinic ray or radiation. "Actinic ray" or "radiation" denotes, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes acrylate and methacrylate, "(meth)acryl" denotes acryl and methacryl, and "(meth)acryloyl" denotes acryloyl and methacryloyl.

In this specification, a weight-average molecular weight and a number-average molecular weight are defined as values in terms of polystyrene obtained by gel permeation chromatography (GPC).

In this specification, in a chemical formula, Me represents a methyl group, Et represents an ethyl group, Bu represents a butyl group, and Ph represents a phenyl group.

Near infrared light denotes light (electromagnetic wave) having an absorption maximum in a wavelength range of 700 to 2500 nm.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

In this specification, a dye denotes a compound that is soluble in a solvent. The dye used in the present invention has a solubility of preferably 1 mass % or higher and more preferably 5 mass % or higher in at least one solvent selected from the group consisting of cyclopentanone, cyclohexanone, and propylene glycol monomethyl ether acetate at 23° C.

In this specification, a pigment denotes a compound that is insoluble in a solvent. For example, the pigment has a solubility of preferably 0.1 mass % or lower and more preferably 0.01 mass % or lower in any solvent of cyclopentanone, cyclohexanone, and propylene glycol monomethyl ether acetate at 23° C.

<Film>

A film according to the present invention includes: an aggregate of a dye; and a resin, in which an average particle size of the aggregate of the dye is 30 to 450 nm. The film according to the present invention includes the aggregate of the dye having an average particle size of 30 to 450 nm. As a result, the film can have excellent heat resistance although the film includes the dye.

In addition, the average particle size of the aggregate is in the above-described range. As a result, for example, in a case where a pattern is formed on the film according to the present invention, appearing of the aggregate on the pattern or formation of residues of the aggregate can be suppressed, and the occurrence of defects can be suppressed. That is, a pattern in which defects are suppressed can be formed.

Whether or not an aggregate present in a film is an aggregate of a dye can be determined as follows.

That is, a cut cross-section of a film on which an aggregate is exposed is dipped in each of cyclopentanone, cyclohexanone, and propylene glycol monomethyl ether acetate at 23° C. and is stirred for 5 hours. In a case where it is found that the film in the film is not dissolved in the solvent or is present as particles without being dissolved in the solvent, it can be said that the aggregate is an aggregate of a pigment (not an aggregate of a dye). On the other hand, in a case where it is found that the aggregate is dissolved in the solvent, it can be said that the aggregate is an aggregate of a dye. Whether or not the aggregate is dissolved in the solvent can be determined by measuring an absorbance of the solvent from which a solid matter such as particles is removed after dipping the film therein. That is, in a case where the aggregate is dissolved in the solvent, an absorption spectrum derived from a dye is found.

<<Aggregate of Dye (Dye Aggregate)>>

In the film according to the present invention, the average particle size of the dye aggregate is 30 to 450 nm. The lower limit is preferably 40 nm or more and more preferably 50 nm or more. The upper limit is preferably 400 nm or less and more preferably 300 nm or less. In the present invention, the average particle size of the dye aggregate refers to a value measured using the following method. That is, the film surface is observed (magnification: 30000 times) using a scanning electron microscope (SEM) (S-4800, manufactured by Hitachi High-Technologies Corporation). Particle sizes of 50 aggregates are measured, and an average value thereof is obtained as the average particle size of the aggregate.

The kind of the dye constituting the aggregate is not particularly limited. Examples of the dye include a pyrrolopyrrole dye, a cyanine dye, a squarylium dye, a triarylmethane dye, a xanthene dye, a pyrromethene dye, an anthraquinone dye, a quinophthalone dye, a phthalocyanine dye, a subphthalocyanine dye, an azo dye, a pyrazolotriazole dye, an isoindoline dye, a thiazole dye, a benzimidazolone dye, a perinone dye, a diimonium dye, a naphthalocyanine dye, a rylene dye, a dibenzofuranone dye, a merocyanine dye, a croconium dye, and an oxonol dye. Among these, a pyrrolopyrrole dye, a cyanine dye, a squarylium dye, a triarylmethane dye, a xanthene dye, or a pyrromethene dye, is preferable, and a pyrrolopyrrole dye, a cyanine dye, or a squarylium dye is more preferable.

The dye may be a dye having an absorption in a visible range or a dye having an absorption in a near infrared range. A dye having an absorption in a near infrared range is preferable, and a dye having an absorption maximum in a wavelength range of 650 to 1000 nm is more preferable. Most of dyes having an absorption in a near infrared range have low heat resistance and tend to be modified by heat such that the visible transmittance decreases and spectral characteristics vary. However, according to the present invention, even in a case where the dye having low heat resistance is used, spectral variation caused by heat is not likely to occur, and a film having excellent heat resistance can be formed. Therefore, in a case where a dye having an absorption in a near infrared range is used as the dye, the effect of the present invention is particularly significant. Examples of the dye having an absorption in a near infrared range include a pyrrolopyrrole dye, a cyanine dye, and a squarylium dye, and these dyes can be preferably used.

(Pyrrolopyrrole Dye)

In the present invention, it is preferable that the pyrrolopyrrole dye is a compound represented by the following Formula (I). The following compound is preferably a dye having an absorption in a near infrared range and more preferably a dye having an absorption maximum in a wavelength range of 650 to 1000 nm.

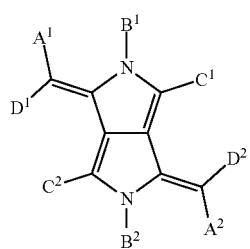

(I)

In Formula (I), $A^1$ and $A^2$ each independently represent a heteroaryl group.

$B^1$ and $B^2$ each independently represent a $-BR^1R^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

In Formula (I), $A^1$ and $A^2$ each independently represent a heteroaryl group. $A^1$ and $A^2$ may represent the same group or different groups. It is preferable that $A^1$ and $A^2$ represent the same group.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 10. It is preferable that the heteroaryl group is a 5-membered or 6-membered ring.

It is preferable that the heteroaryl group is a group represented by the following Formula (A-1) or a group represented by the following Formula (A-2).

(A-1)

(A-2)

In Formula (A-1), $X^1$'s each independently represent O, S, $NR^{X1}$, or $CR^{X2}R^{X3}$, $R^{X1}$ to $R^{X3}$ each independently represent a hydrogen atom or a substituent, $R^3$ and $R^4$ each independently represent a hydrogen atom or a substituent, and $R^3$ and $R^4$ may be bonded to each other to form a ring. * represents a binding site in Formula (I).

Preferable examples of the substituent represented by $R^3$, $R^4$, and $R^{X1}$ to $R^{X3}$ include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group.

The number of carbon atoms in the alkyl group is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the above-described groups such as a halogen atom or an aryl group.

The number of carbon atoms in the aryl group is preferably 6 to 30, more preferably 6 to 20, and still more preferably 6 to 12. The aryl group may have a substituent or may be unsubstituted. Examples of the substituent include the above-described groups such as a halogen atom or an alkyl group.

Examples of the halogen atom include a fluorine atom, a chlorine atom, a bromine atom, and an iodine atom.

The ring which is formed by $R^3$ and $R^4$ being bonded to each other is preferably an aromatic ring. In a case where $R^3$ and $R^4$ are bonded to each other to form a ring, for example, (A-1) represents a group represented by the following (A-1-1) or a group represented by the following (A-1-2).

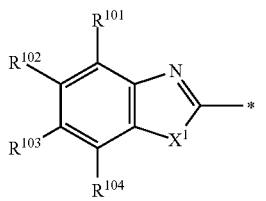
(A-1-1)

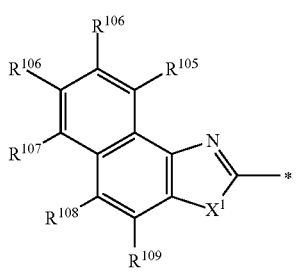
(A-1-2)

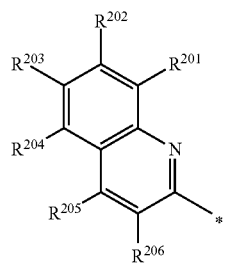
(A-2-1)

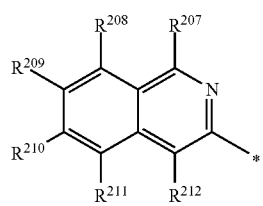
(A-2-2)

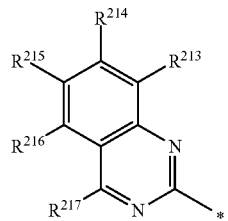
(A-2-3)

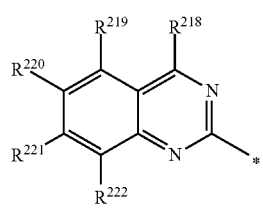
(A-2-4)

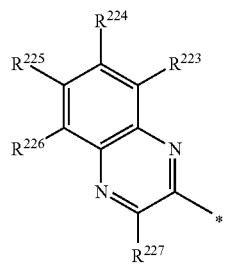
(A-2-5)

In the formula, $X^1$'s each independently represent O, S, $NR^{X1}$, or $CR^{X2}R^{X3}$, $R^{X1}$ to $R^{X3}$ each independently represent a hydrogen atom or a substituent, and $R^{101}$ to $R^{109}$ each independently represent a hydrogen atom or a substituent. * represents a binding site in Formula (I).

In Formula (A-2), $Y^1$ to $Y^4$ each independently represent N or $CR^{Y1}$, at least two of $Y^1$, $Y^2$, $Y^3$, or $Y^4$ represent $CR^{Y1}$, $R^{Y1}$ represents a hydrogen atom or a substituent, and adjacent $R^{Y1}$'s may be bonded to each other to form a ring. * represents a binding site in Formula (I).

Examples of the substituent represented by $R^{Y1}$ include the above-described substituents. Among these, an alkyl group, an aryl group, or a halogen atom is preferable. The number of carbon atoms in the alkyl group is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the above-described substituents such as a halogen atom or an aryl group.

The number of carbon atoms in the aryl group is preferably 6 to 30, more preferably 6 to 20, and still more preferably 6 to 12. The aryl group may have a substituent or may be unsubstituted. Examples of the substituent include the above-described substituents such as a halogen atom or an alkyl group.

Examples of the halogen atom include a fluorine atom, a chlorine atom, a bromine atom, and an iodine atom.

At least two of $Y^1$, $Y^2$, $Y^3$, or $Y^4$ represent $CR^{Y1}$, and adjacent $R^{Y1}$'s may be bonded to each other to form a ring. The ring which is formed by adjacent $R^{Y1}$'s being bonded to each other is preferably an aromatic ring. In a case where adjacent $R^{Y1}$'s form a ring, for example, (A-2) represents a group represented by any one of the following (A-2-1) to (A-2-5).

In the formula, $R^{201}$ to $R^{227}$ each independently represent a hydrogen atom or a substituent, and * represents a binding site in Formula (I).

Specific examples of $A^1$ and $A^2$ are as follows. In the following description, Bu represents a butyl group.

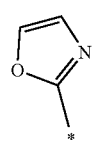
A-1

A-2 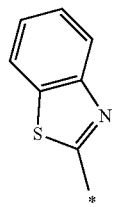
A-3 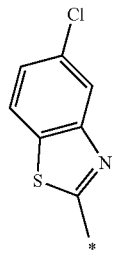
A-4 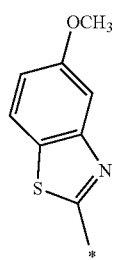
A-5 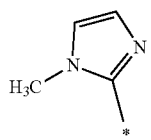
A-6 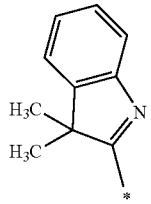
A-7 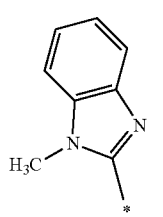
-continued
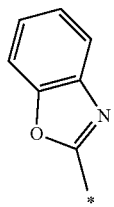 A-8
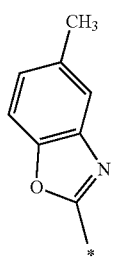 A-9
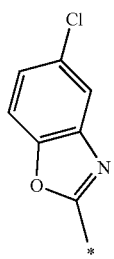 A-10
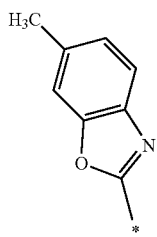 A-11
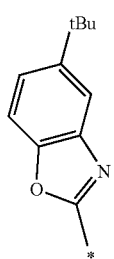 A-12
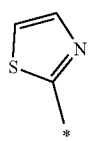 A-13
 A-14

A-15
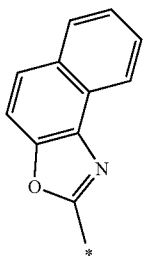
A-16
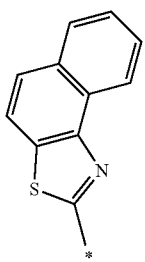
A-17
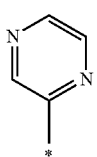
A-18
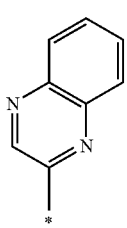
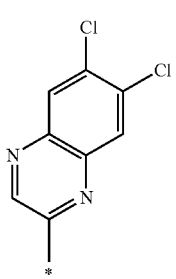
A-20
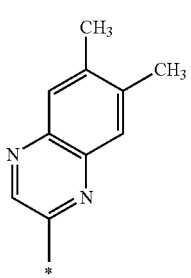
A-21
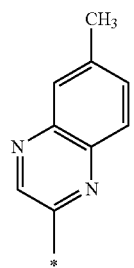
A-22
A-23
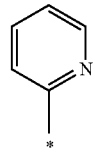
A-24
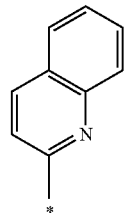
A-25
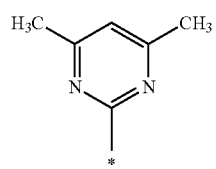
A-26
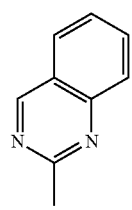
A-27

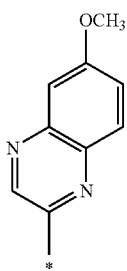

A-28

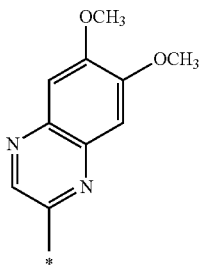

A-29

In Formula (I), $B^1$ and $B^2$ each independently represent a $BR^1R^2$ group, and $R^1$ and $R^2$ each independently represent a substituent. $R^1$ and $R^2$ may be bonded to each other to form a ring. Examples of the substituent include the groups described regarding $A^1$ and $A^2$. Among these, a halogen atom, an alkyl group, an alkenyl group, an alkoxy group, an aryl group, or a heteroaryl group is preferable, a halogen atom, an aryl group, or a heteroaryl group is more preferable, and an aryl group or a heteroaryl group is still more preferable. $R^1$ and $R^2$ may represent the same group or different groups. It is preferable that $R^1$ and $R^2$ represent the same group. In addition, $B^1$ and $B^2$ may represent the same group or different groups. It is preferable that $B^1$ and $B^2$ represent the same group.

As the halogen atom, a fluorine atom, a chlorine atom, a chlorine atom, a bromine atom, or an iodine atom is preferable, and a fluorine atom is more preferable.

The number of carbon atoms in the alkyl group is preferably 1 to 40. For example, the lower limit is more preferably 3 or more. For example, the upper limit is more preferably 30 or less and still more preferably 25 or less. The alkyl group may be linear, branched, or cyclic and is preferably linear or branched.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic.

The number of carbon atoms in the alkoxy group is preferably 1 to 40. For example, the lower limit is more preferably 3 or more. For example, the upper limit is more preferably 30 or less and still more preferably 25 or less. The alkoxy group may be linear, branched, or cyclic.

The number of carbon atoms in the aryl group is preferably 6 to 20 and more preferably 6 to 12. The aryl group may have a substituent or may be unsubstituted. Examples of the substituent include an alkyl group, an alkoxy group, and a halogen atom. The details of the groups are as described above.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 5. It is preferable that the heteroaryl group is a 5-membered or 6-membered ring. The heteroaryl group may have a substituent or may be unsubstituted. Examples of the substituent include an alkyl group, an alkoxy group, and a halogen atom. The details of the groups are as described above.

$R^1$ and $R^2$ of the $-BR^1R^2$ group may be bonded to each other to form a ring. Examples of the ring include structures represented by the following (B-1) to (B-4). In the following formulae, R represents a substituent, $R^{a1}$ to $R^{a4}$ each independently represent a hydrogen atom or a substituent, m1 to m3 each independently represent an integer of 0 to 4, and * represents a binding site in Formula (I). Examples of the substituent represented by R and $R^{a1}$ to $R^{a4}$ include the substituents described above regarding $R^1$ and $R^2$. Among these, a halogen atom or an alkyl group is preferable.

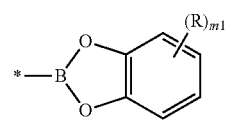

(B-1)

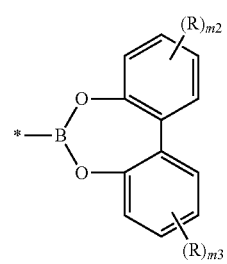

(B-2)

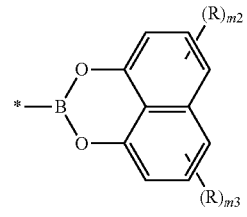

(B-3)

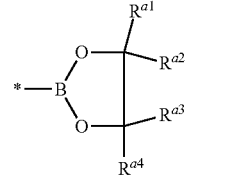

(B-4)

Specific examples of $B^1$ and $B^2$ are as follows. In the following formulae, Me represents a methyl group, and Bu represents a butyl group.

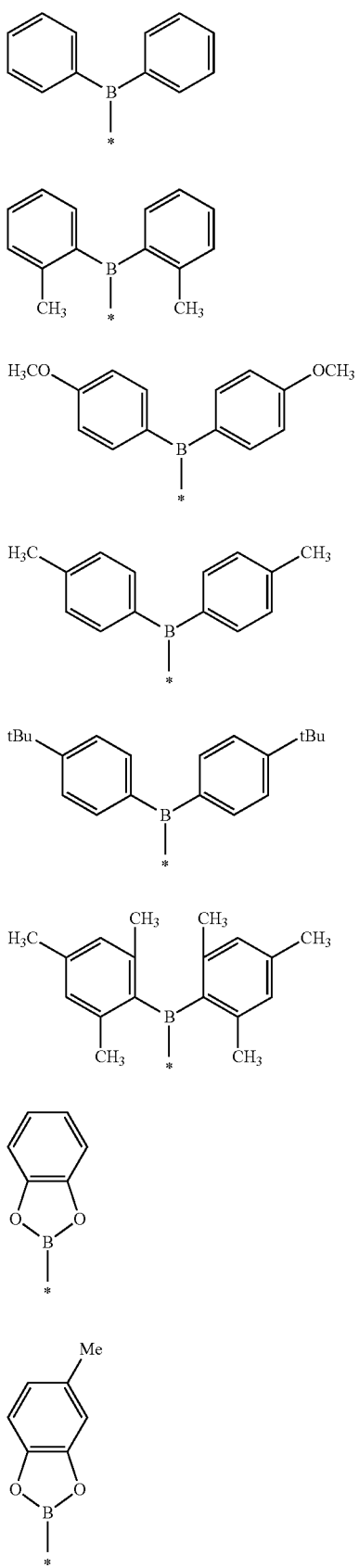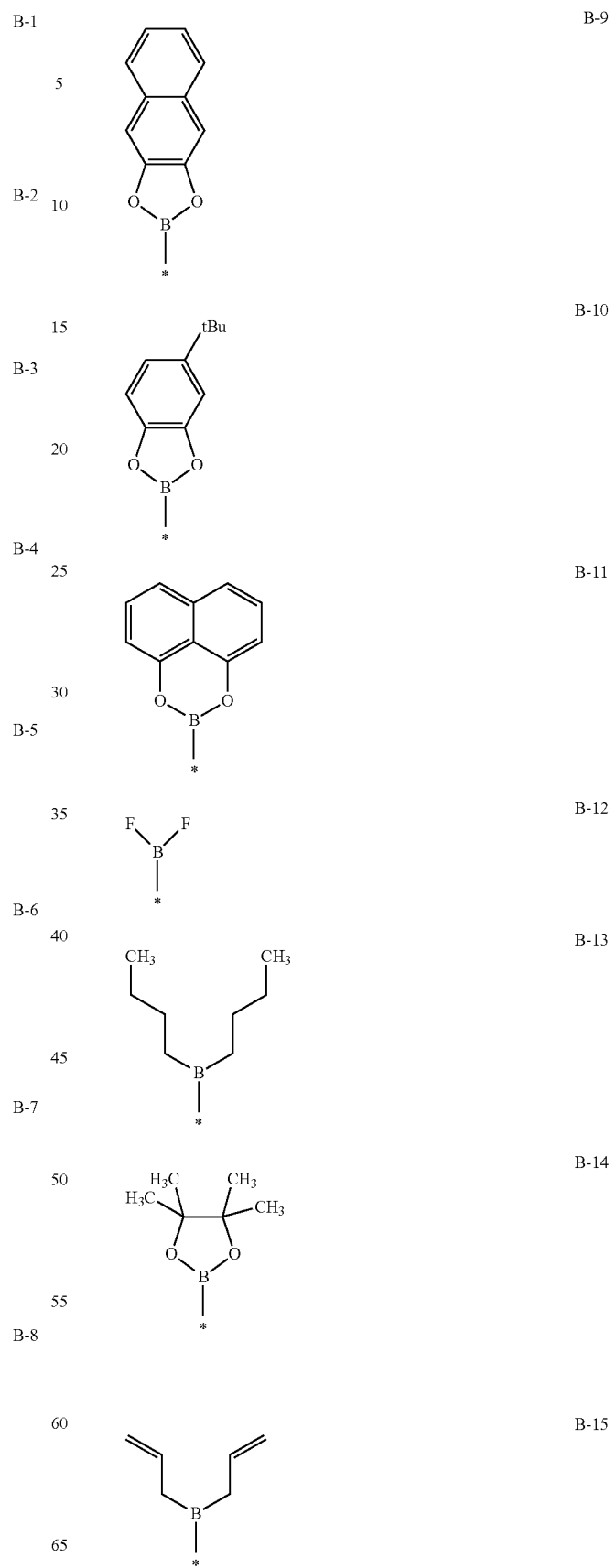

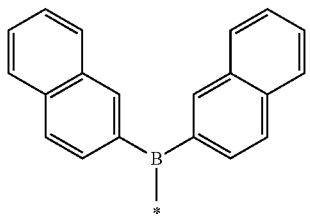

B-16

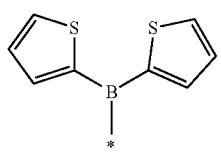

B-17

In Formula (I), $C^1$ and $C^2$ each independently represent an alkyl group, an aryl group, or a heteroaryl group. $C^1$ and $C^2$ may represent the same group or different groups. It is preferable that $C^1$ and $C^2$ represent the same group. $C^1$ and $C^2$ each independently represent preferably an aryl group or a heteroaryl group, and more preferably an aryl group.

The number of carbon atoms in the alkyl group is preferably 1 to 40, more preferably 1 to 30, and still more preferably 1 to 25. The alkyl group may be linear, branched, or cyclic and is preferably linear or branched and more preferably branched.

As the aryl group, an aryl group having 6 to 20 carbon atoms is preferable, and an aryl group having 6 to 12 carbon atoms is more preferable. A phenyl group or a naphthyl group is still more preferable.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, and still more preferably 3 to 12.

The alkyl group, the aryl group, and the heteroaryl group may have a substituent or may be unsubstituted. It is preferable that the groups have a substituent.

Examples of the substituent include a hydrocarbon group which may have an oxygen atom, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group.

Examples of the halogen atom include a fluorine atom, a chlorine atom, a bromine atom, and an iodine atom.

Examples of the hydrocarbon group include an alkyl group, an alkenyl group, and an aryl group.

The number of carbon atoms in the alkyl group is preferably 1 to 40. The lower limit is more preferably 3 or more, still more preferably 5 or more, even still more preferably 8 or more, and even yet still more preferably 10 or more. The upper limit is more preferably 35 or less and still more preferably 30 or less. The alkyl group may be linear, branched, or cyclic and is preferably linear or branched and more preferably branched. The number of carbon atoms in the branched alkyl group is preferably 3 to 40. The lower limit is, for example, more preferably 5 or more, still more preferably 8 or more, and even still more preferably 10 or more. The upper limit is more preferably 35 or less and still more preferably 30 or less. For example, the number of branches in the branched alkyl group is preferably 2 to 10 and more preferably 2 to 8.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic and is preferably linear or branched and more preferably branched. The number of carbon atoms in the branched alkenyl group is preferably 3 to 40. The lower limit is, for example, more preferably 5 or more, still more preferably 8 or more, and even still more preferably 10 or more. The upper limit is more preferably 35 or less and still more preferably 30 or less. The number of branches in the branched alkenyl group is preferably 2 to 10 and more preferably 2 to 8.

The number of carbon atoms in the aryl group is preferably 6 to 30, more preferably 6 to 20, and still more preferably 6 to 12.

Examples of the hydrocarbon group having an oxygen atom include a group represented by -L-$R^{x1}$.

L represents —O—, —CO—, —COO—, —OCO—, —(O$R^{x2}$)$_m$—, or —($R^{x2}$O)$_m$—. $R^{x1}$ represents an alkyl group, an alkenyl group, or an aryl group. $R^{x2}$ represents an alkylene group or an arylene group. m represents an integer of 2 or more, and an m number of $R^{x2}$, s may be the same as or different from each other.

L represents preferably —O—, —(O$R^{x2}$)$_m$—, or —($R^{x2}$O)$_m$—, and more preferably —O—.

The alkyl group, the alkenyl group, and the aryl group represented by $R^{x1}$ have the same definitions and the same preferable ranges as described above. $R^{x1}$ represents preferably an alkyl group or an alkenyl group and more preferably an alkyl group.

The number of carbon atoms in the alkylene group represented by $R^{x2}$ is preferably 1 to 20, more preferably 1 to 10, and still more preferably 1 to 5. The alkylene group may be linear, branched, or cyclic and is preferably linear or branched. The number of carbon atoms in the arylene group represented by $R^{x2}$ is preferably 6 to 20 and more preferably 6 to 12. $R^{x2}$ represents preferably an alkylene group.

m represents an integer of 2 or more, preferably 2 to 20, and more preferably 2 to 10.

The substituent which may be included in the alkyl group, the aryl group, and the heteroaryl group is preferably a group having a branched alkyl structure. In addition, as the substituent, a hydrocarbon group which may have an oxygen atom is preferable, and a hydrocarbon group having an oxygen atom is more preferable. The hydrocarbon group having an oxygen atom is preferably a group represented by —O—$R^{x1}$. $R^{x1}$ represents preferably an alkyl group or an alkenyl group, more preferably an alkyl group, and still more preferably a branched alkyl group. That is, the substituent is more preferably an alkoxy group and still more preferably a branched alkoxy group. In a case where the substituent is an alkoxy group, a film having excellent heat resistance and light fastness can be easily obtained. The number of carbon atoms in the alkoxy group is preferably 1 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkoxy group may be linear, branched, or cyclic and is preferably linear or branched and more preferably branched. The number of carbon atoms in the branched alkoxy group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkoxy group is preferably 2 to 10 and more preferably 2 to 8.

Specific examples of $C^1$ and $C^2$ are as follows. In the following formulae, Me represents a methyl group, and Bu represents a butyl group.

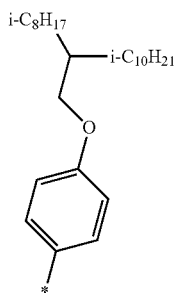
C-1

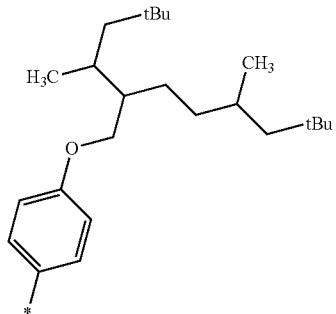
C-2

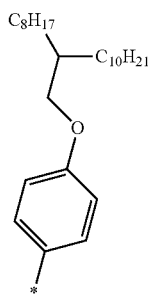
C-3

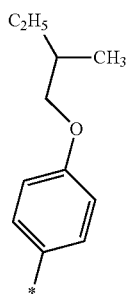
C-4

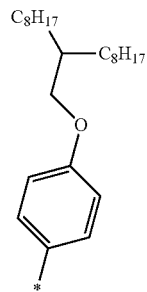
C-5

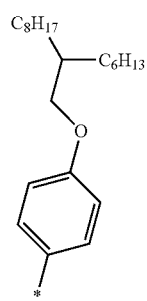
C-6

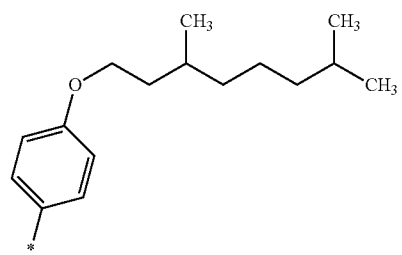
C-7

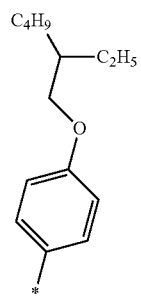
C-8

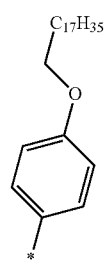
C-9

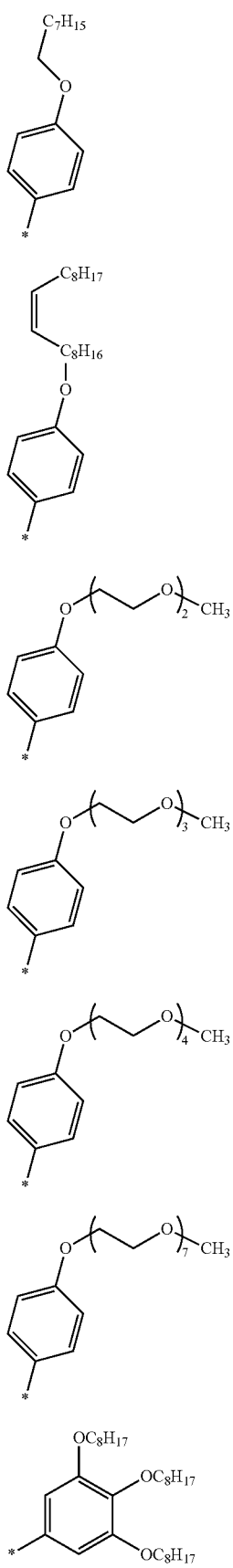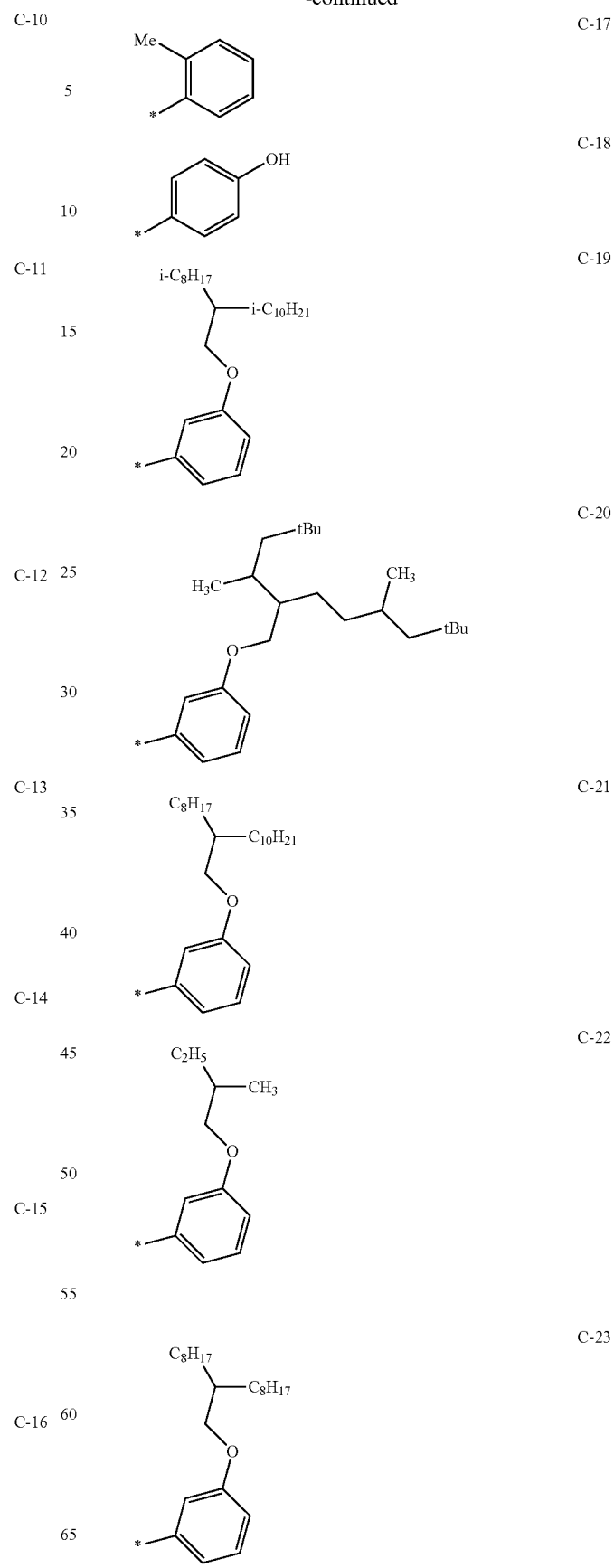

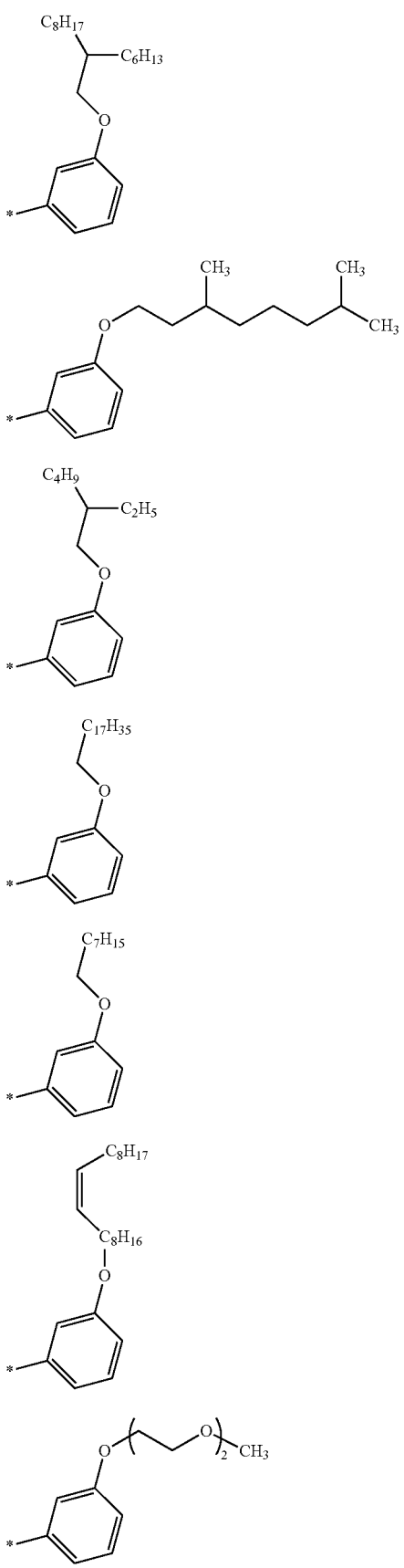
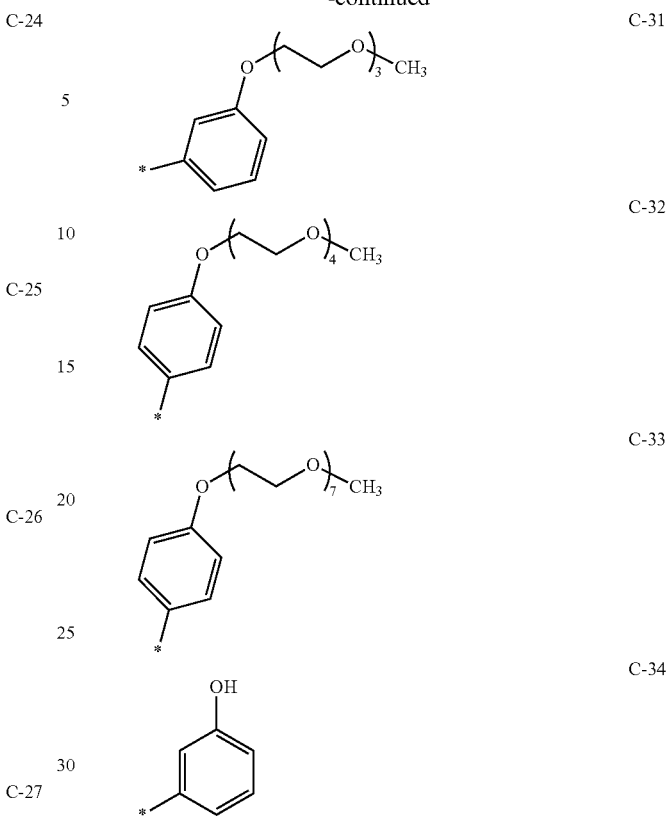

In Formula (I), $D^1$ and $D^2$ each independently represent a substituent. $D^1$ and $D^2$ may represent the same group or different groups. It is preferable that $D^1$ and $D^2$ represent the same group.

Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group. It is preferable that $D^1$ and $D^2$ represents an electron-withdrawing group.

A substituent having a positive Hammett sigma para value (σp value) functions as an electron-withdrawing group. In the present invention, a substituent having a Hammett σp value of 0.2 or higher can be used as an example of the electron-withdrawing group. The σp value of the substituent is preferably 0.25 or higher, more preferably 0.3 or higher, and still more preferably 0.35 or higher. The upper limit is not particularly limited and is preferably 0.80. Specific examples of the electron-withdrawing group include a cyano group (σp value=0.66), a carboxyl group (for example, —COOH; σp value=0.45), an alkoxycarbonyl group (—COOMe: σp value=0.45), an aryloxycarbonyl group (for example, —COOPh; σp value=0.44), a carbamoyl group (for example, —CONH$_2$; σp value=0.36), an alkylcarbonyl group (for example, —COMe; σp value=0.50), an arylcarbonyl group (for example, —COPh; σp value=0.43), an alkylsulfonyl group (for example, —SO$_2$Me; σp value=0.72), and an arylsulfonyl group (for example, —SO$_2$Ph; σp value=0.68). As the electron-withdrawing group, a cyano group, an alkylcarbonyl group, an alkylsulfonyl group, or an arylsulfonyl group is preferable, and a cyano group is more preferable. Here, Me represents a methyl group, and Ph represents a phenyl group. The details of the Hammett σp value can be found in paragraphs "0024" and "0025" of JP2009-263614A, the content of which is incorporated herein by reference.

Specific examples of D$^1$ and D$^2$ are as follows.

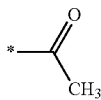

D-1

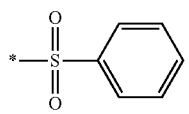

D-2

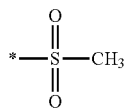

D-3

D-4

It is preferable that the pyrrolopyrrole compound is a compound represented by the following Formula (II) or a compound represented by the following Formula (III). According to this aspect, a film having excellent infrared shielding properties and light fastness can be easily formed.

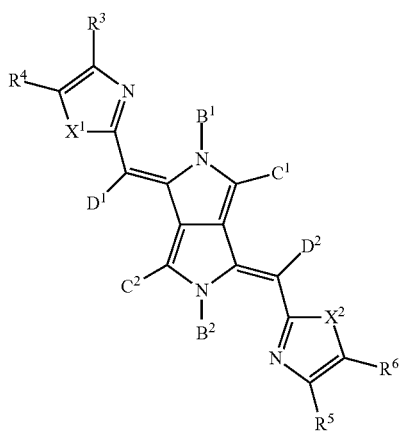

(II)

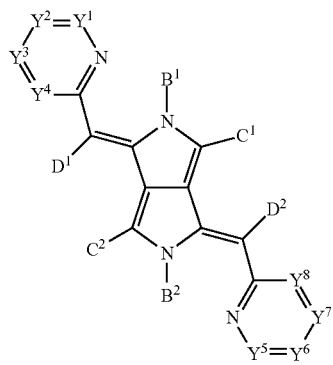

(III)

In Formula (II), X$^1$ and X$^2$ each independently represent O, S, NR$^{X1}$, or CR$^{X2}$R$^{X3}$, and R$^{X1}$ to R$^{X3}$ each independently represent a hydrogen atom or a substituent.

R$^3$ to R$^6$ each independently represent a hydrogen atom or a substituent.

R$^3$ and R$^4$, or R$^5$ and R$^6$ may be bonded to form a ring.

B$^1$ and B$^2$ each independently represent a —BR$^1$R$^2$ group, R$^1$ and R$^2$ each independently represent a substituent, and R$^1$ and R$^2$ may be bonded to each other to form a ring.

C$^1$ and C$^2$ each independently represent an alkyl group, an aryl group, or a heteroaryl group.

D$^1$ and D$^2$ each independently represent a substituent.

B$^1$, B$^2$, C$^1$, C$^2$, D$^1$, and D$^2$ in Formula (II) have the same definitions and the same preferable ranges as B$^1$, B$^2$, C$^1$, C$^2$, D$^1$, and D$^2$ in Formula (I). X$^1$, X$^2$, and R$^3$ to R$^6$ in Formula (II) have the same definitions and the same preferable ranges as X$^1$, R$^3$, and R$^4$ in Formula (A-1).

In Formula (III), Y$^1$ to Y$^8$ each independently represent N or CR$^{Y1}$, at least two of Y$^1$, Y$^2$, Y$^3$, or Y$^4$ represent CR$^{Y1}$, at least two of Y$^5$, Y$^6$, Y$^7$, or Y$^8$ represent CR$^{Y1}$, R$^{Y1}$ represents a hydrogen atom or a substituent, and adjacent R$^{Y1}$'s may be bonded to each other to form a ring.

B$^1$ and B$^2$ each independently represent a —BR$^1$R$^2$ group, R$^1$ and R$^2$ each independently represent a substituent, and R$^1$ and R$^2$ may be bonded to each other to form a ring.

C$^1$ and C$^2$ each independently represent an alkyl group, an aryl group, or a heteroaryl group.

D$^1$ and D$^2$ each independently represent a substituent.

B$^1$, B$^2$, C$^1$, C$^2$, D$^1$, and D$^2$ in Formula (III) have the same definitions and the same preferable ranges as B$^1$, B$^2$, C$^1$, C$^2$, D$^1$, and D$^2$ in Formula (I). Y$^1$ to Y$^8$ in Formula (III) have the same definitions and the same preferable ranges as Y$^1$ to Y$^4$ in Formula (A-2).

Specific examples of the pyrrolopyrrole compound include the following compounds. In the following structural formulae, Bu represents a butyl group, and Ph represents a phenyl group.

II-9
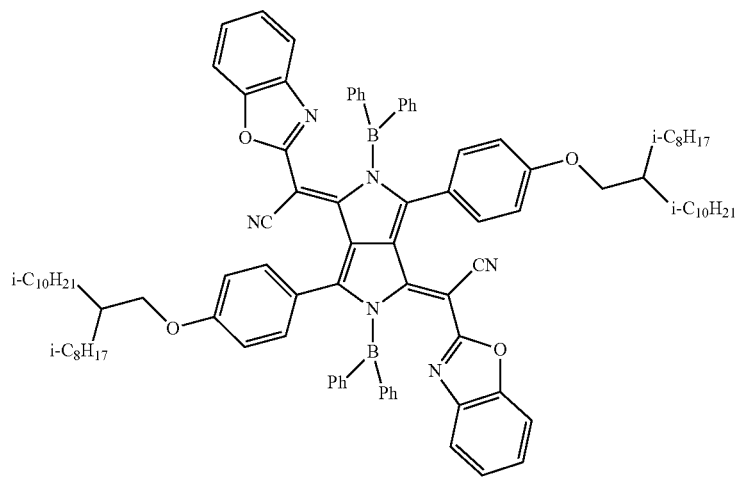
II-10
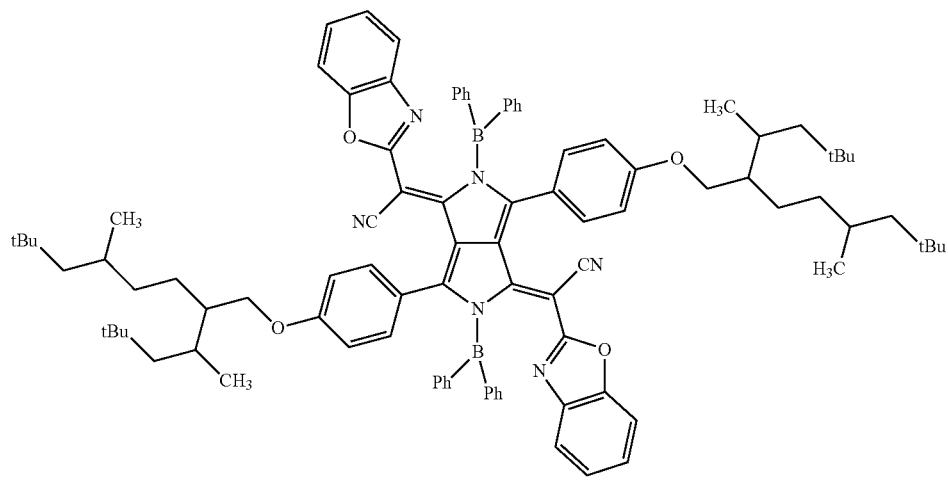
II-27
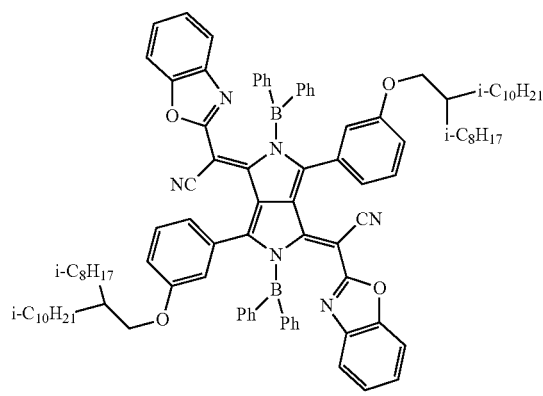

-continued
II-43
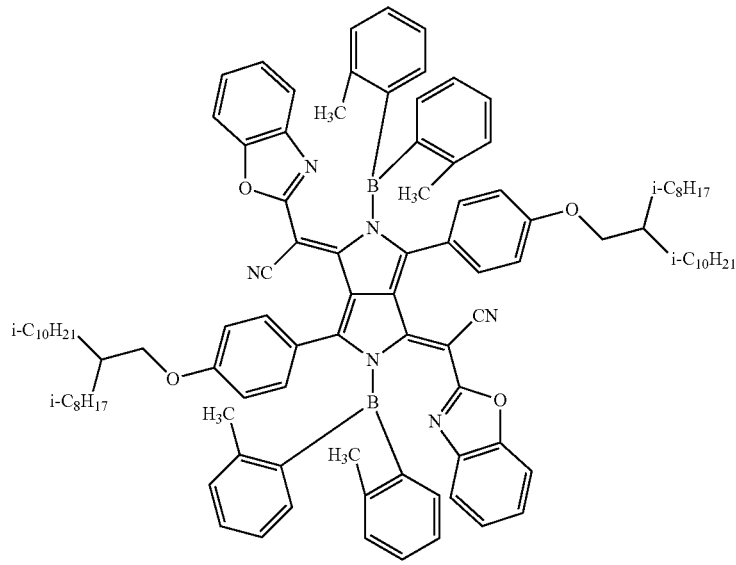
II-44
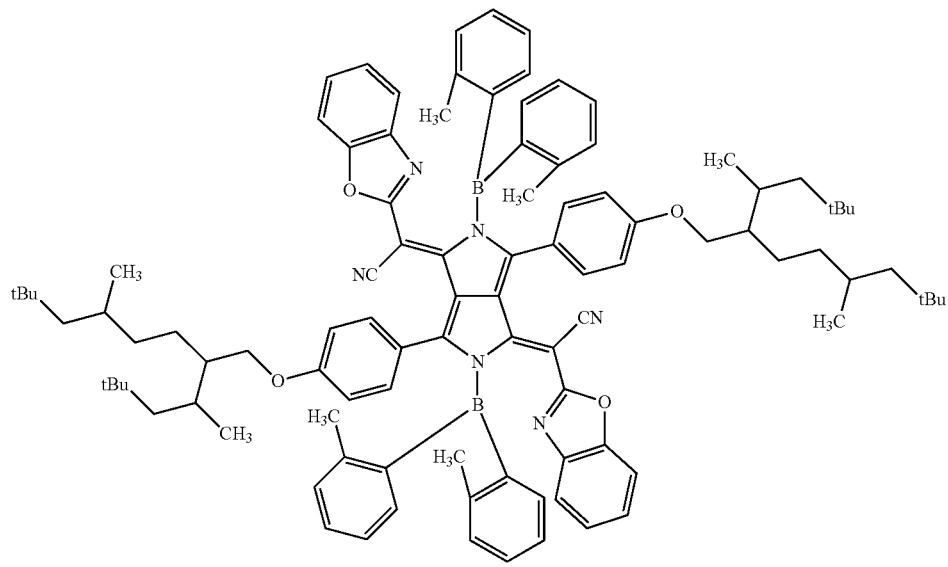
II-91
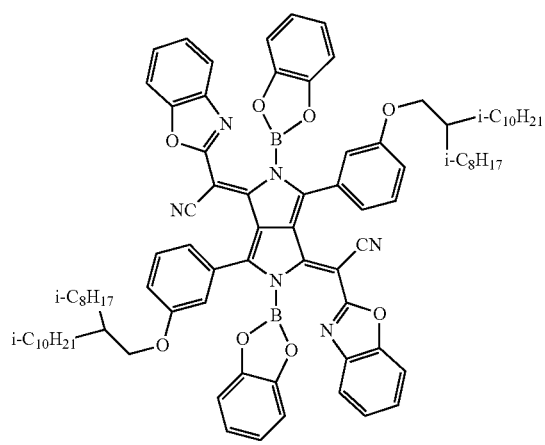

II-167
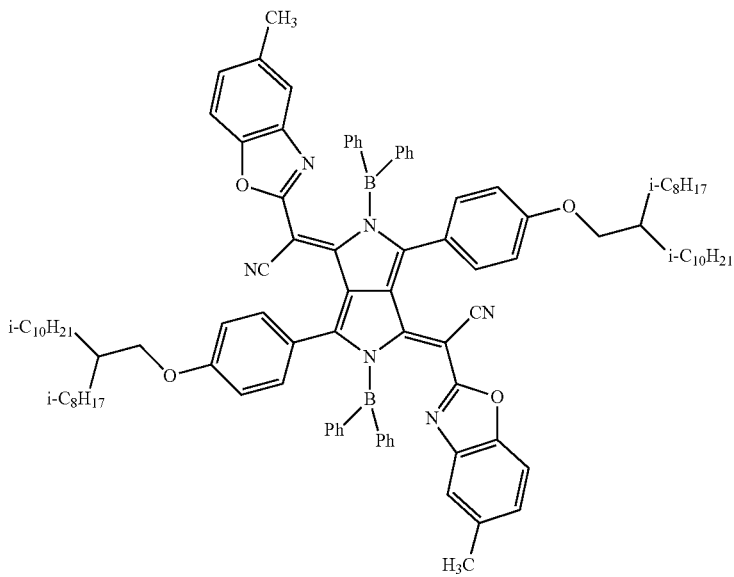
II-168
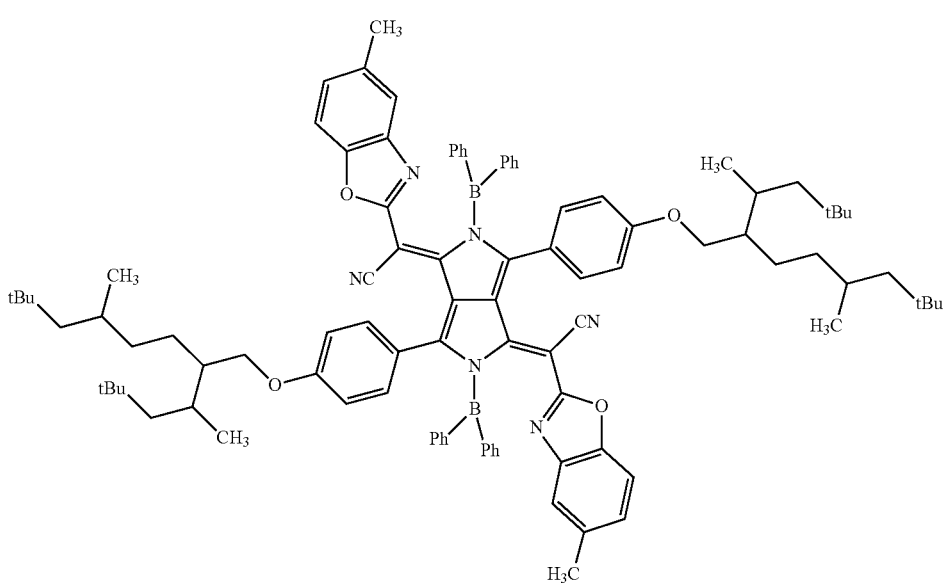

II-184
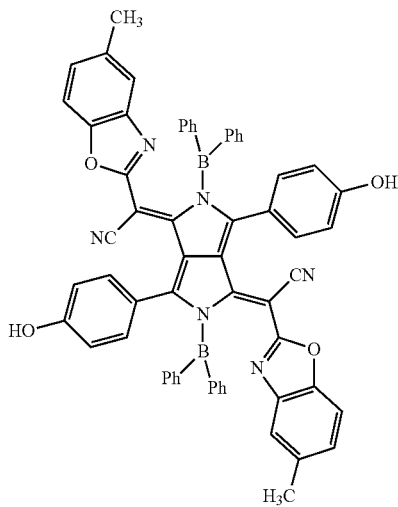
II-185
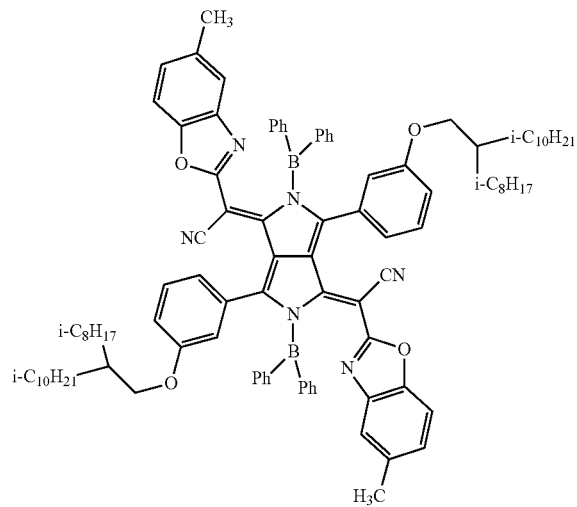
II-186
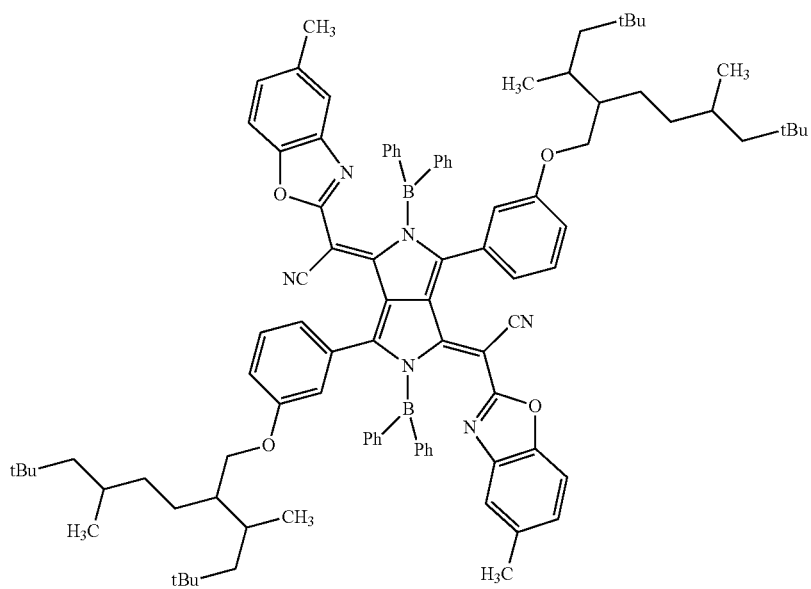

II-201
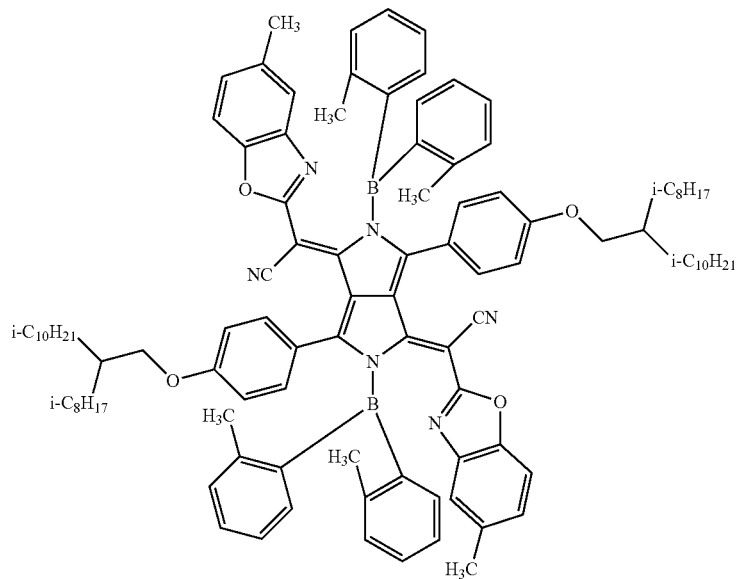
II-202
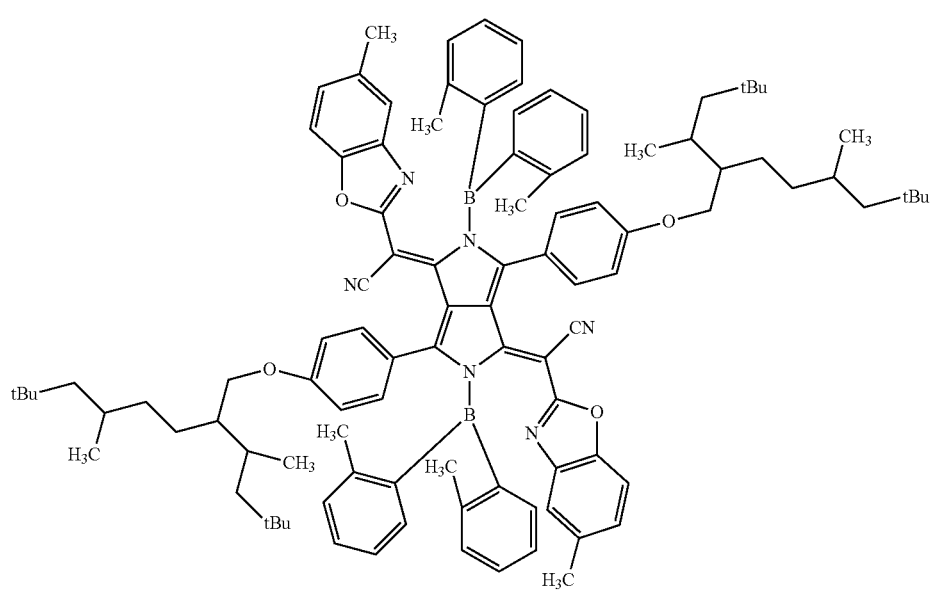

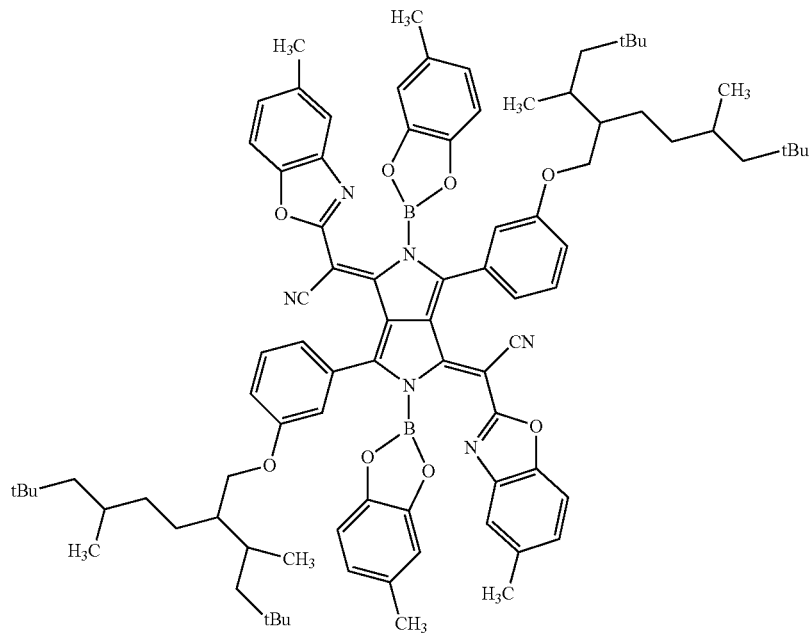
II-269
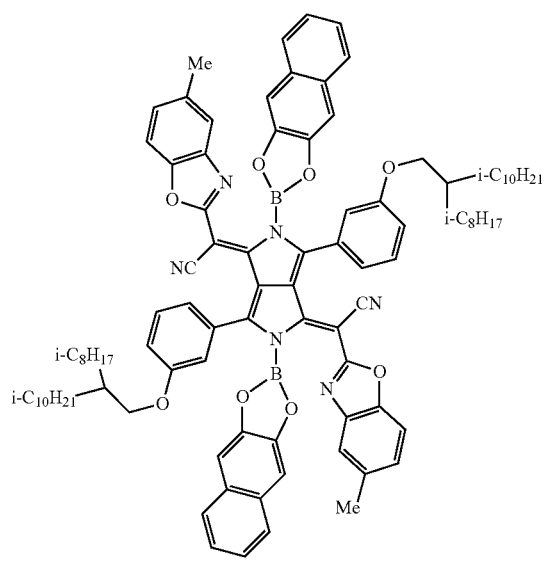
II-274

-continued
II-275
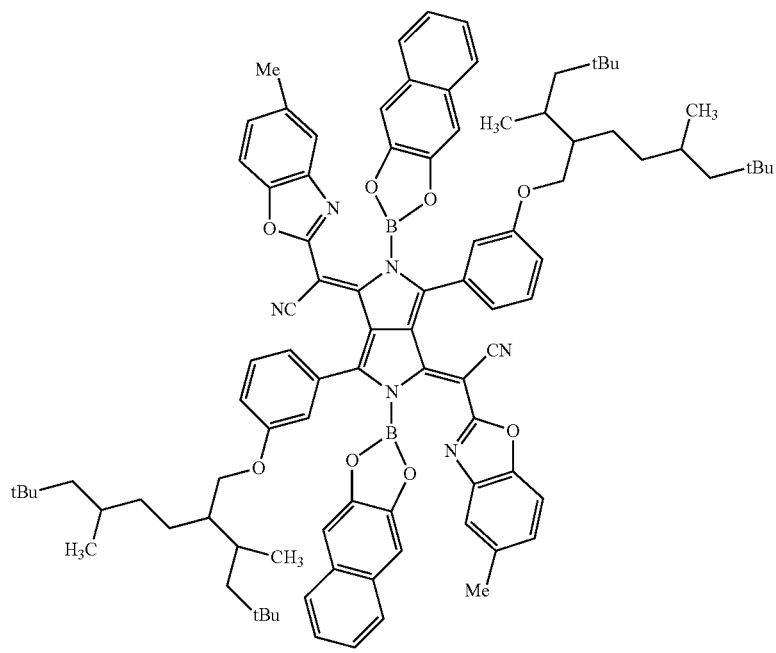
II-325
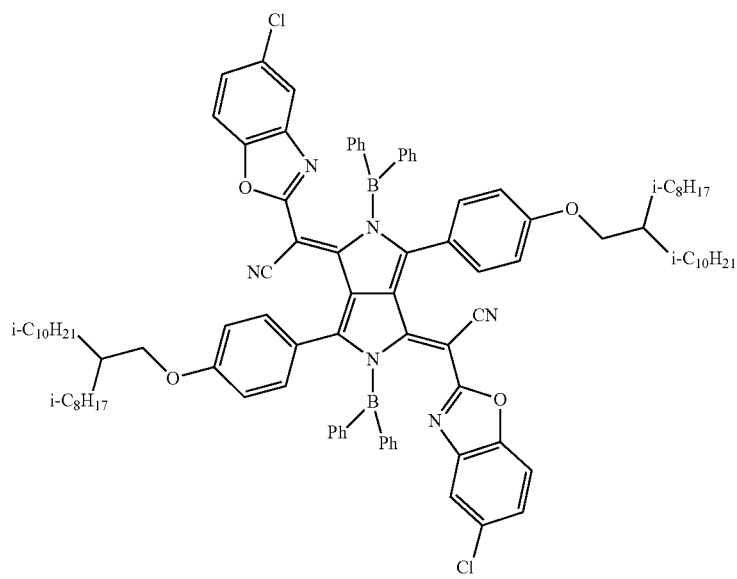

II-408
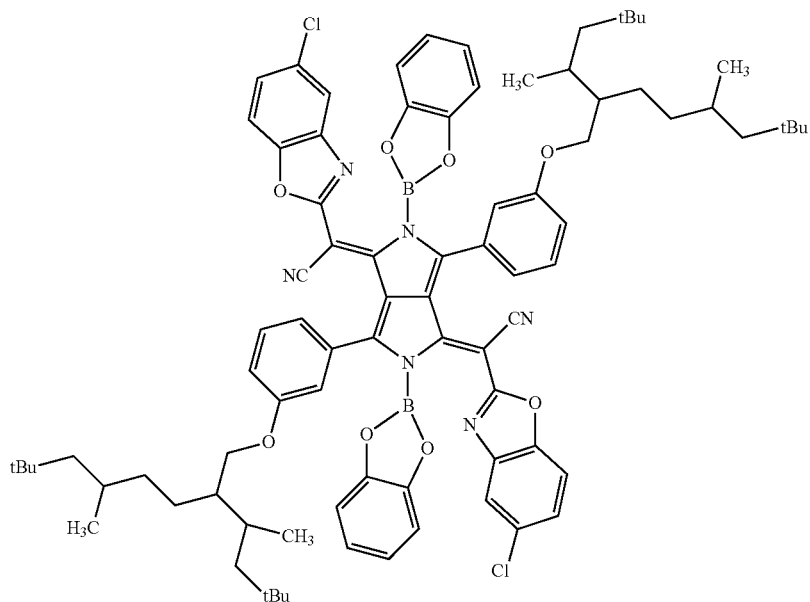
II-507
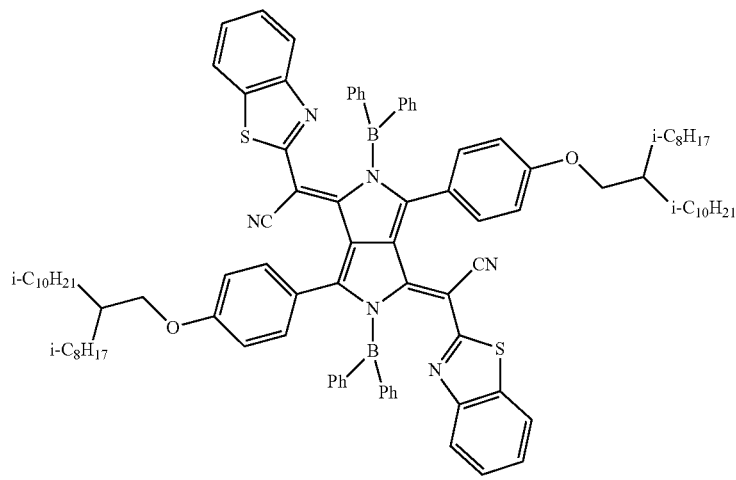
II-508
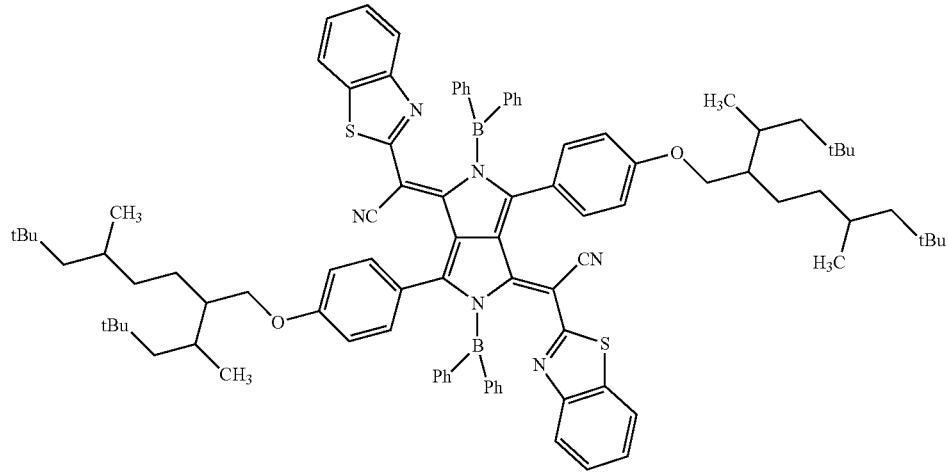

II-524
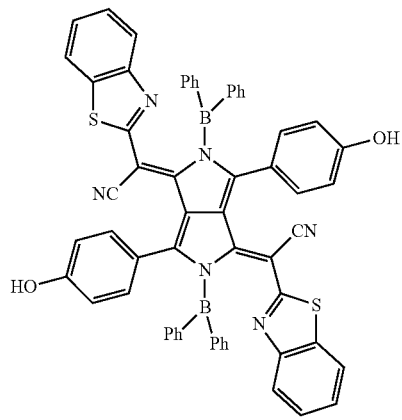
II-525
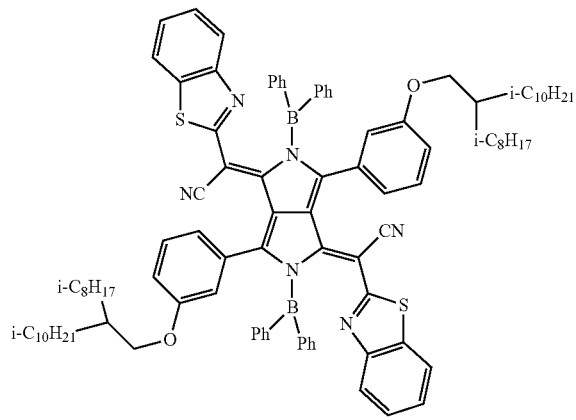
II-541
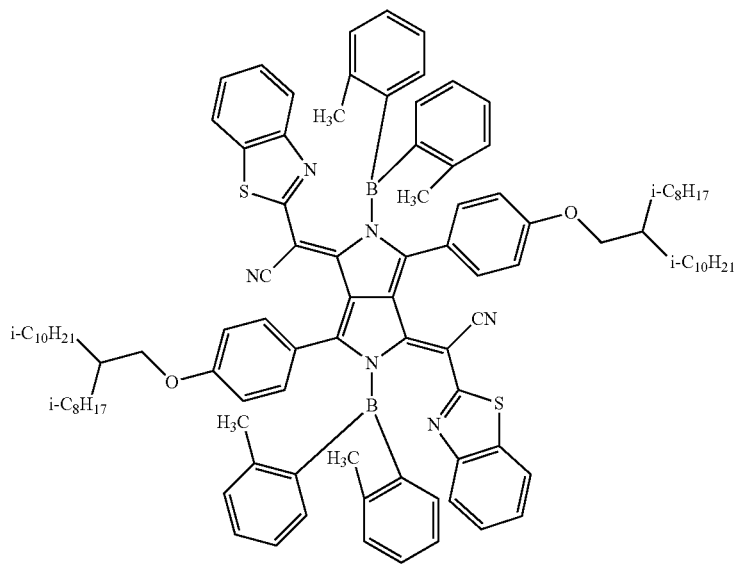
II-589
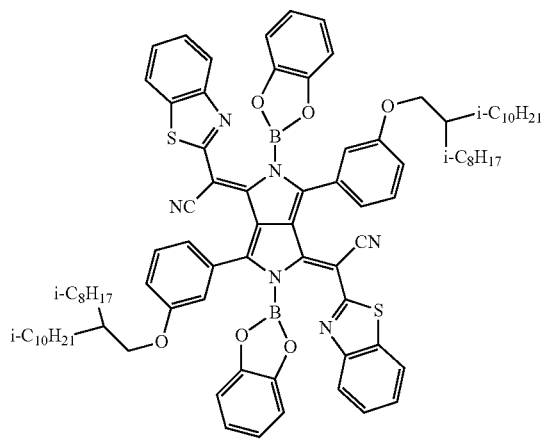

II-590
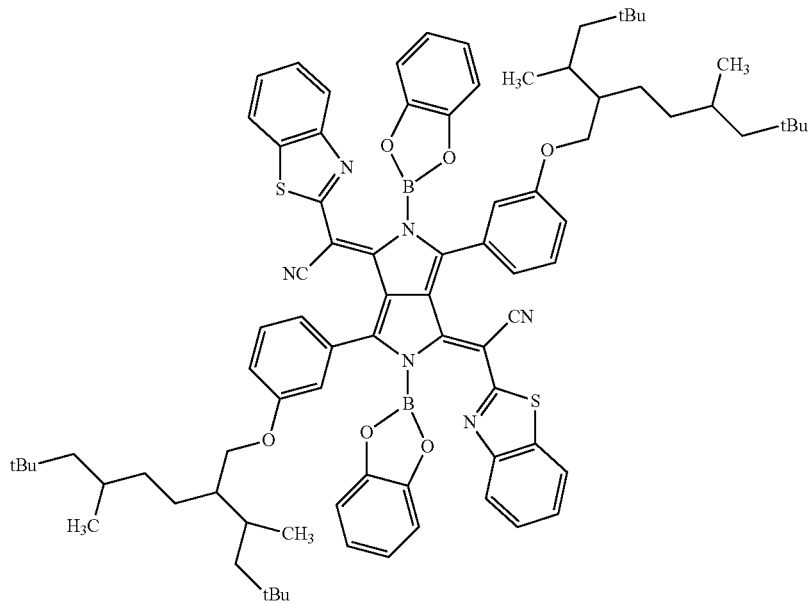
II-673
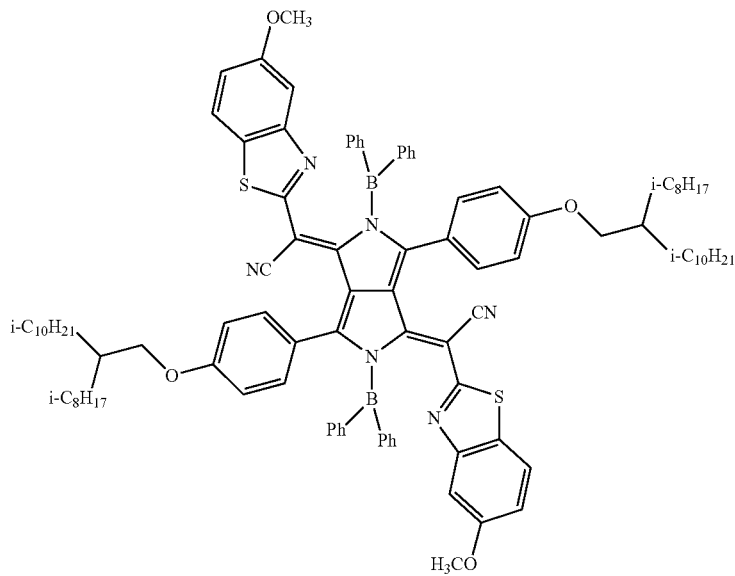
II-697
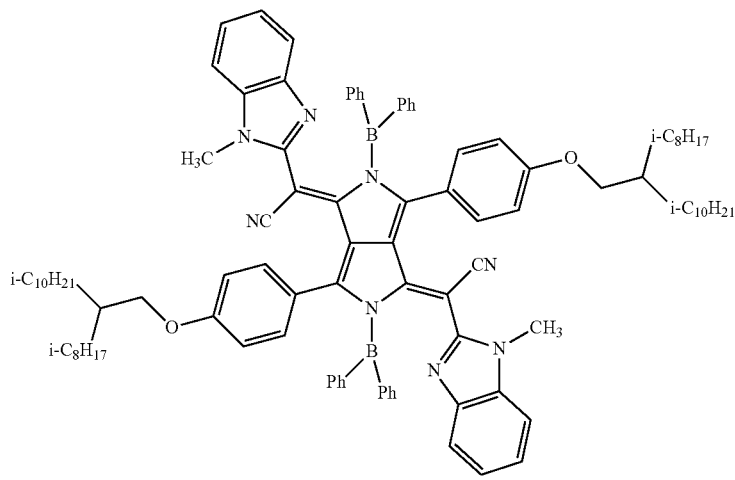

-continued
II-715
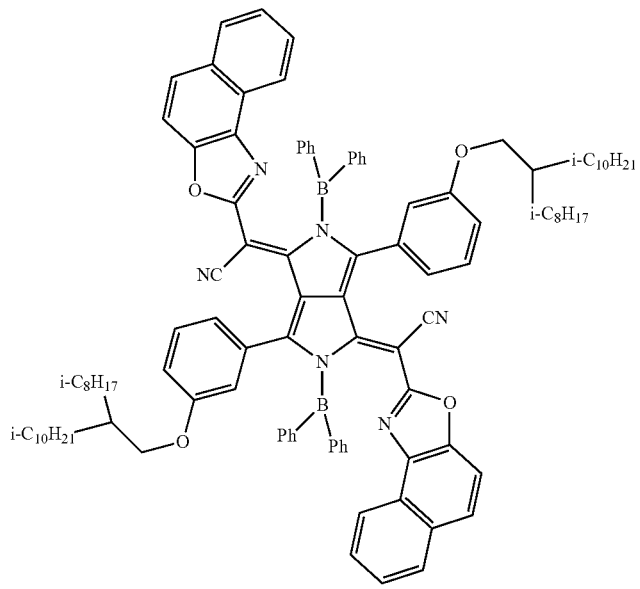
III-9
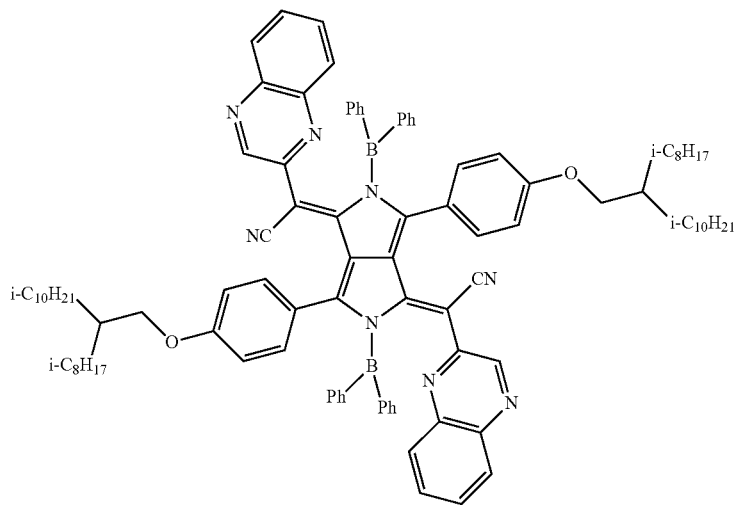
III-28
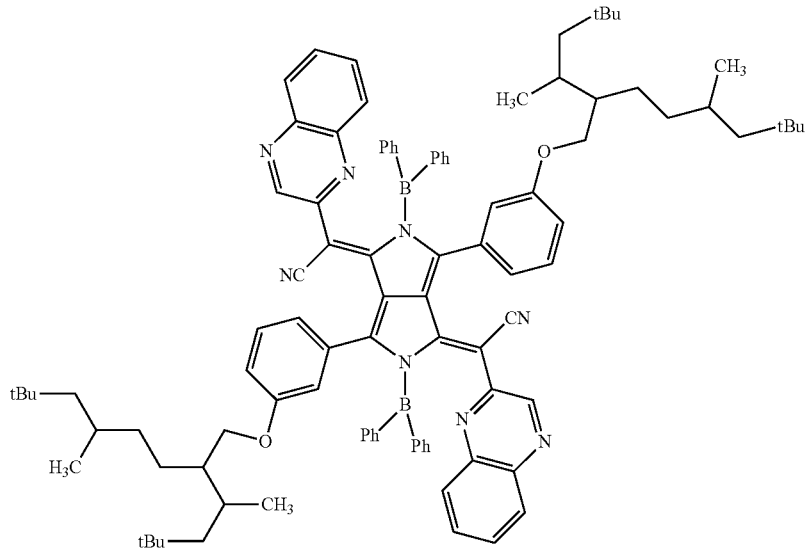

III-29
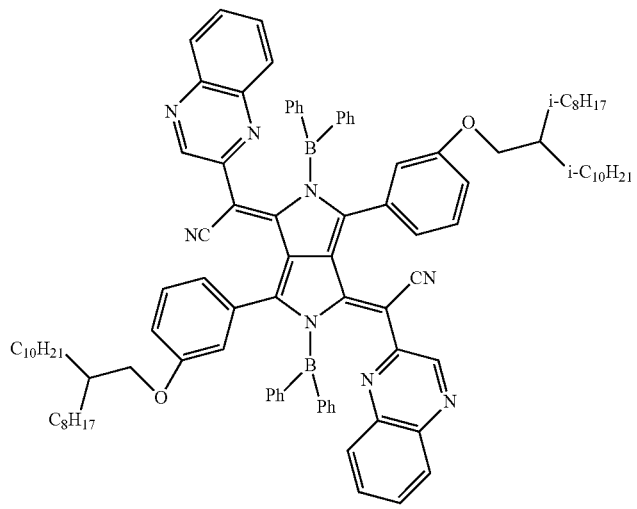
III-167
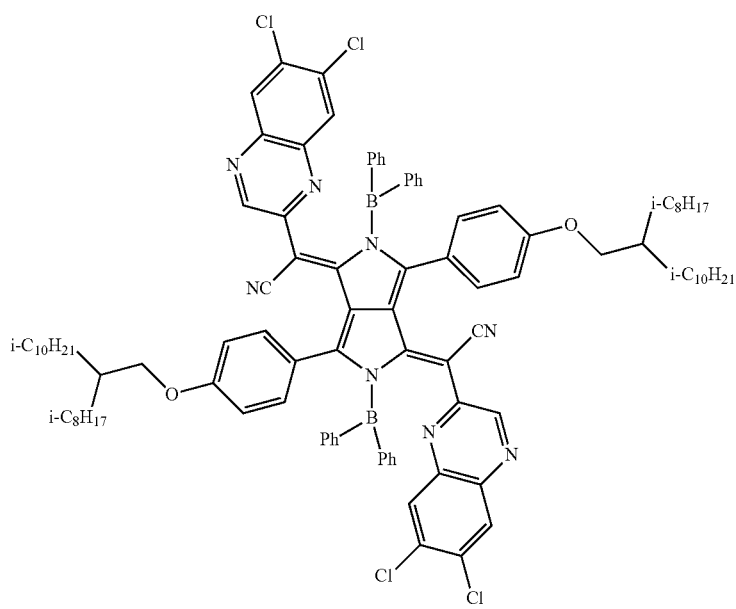

-continued
III-168
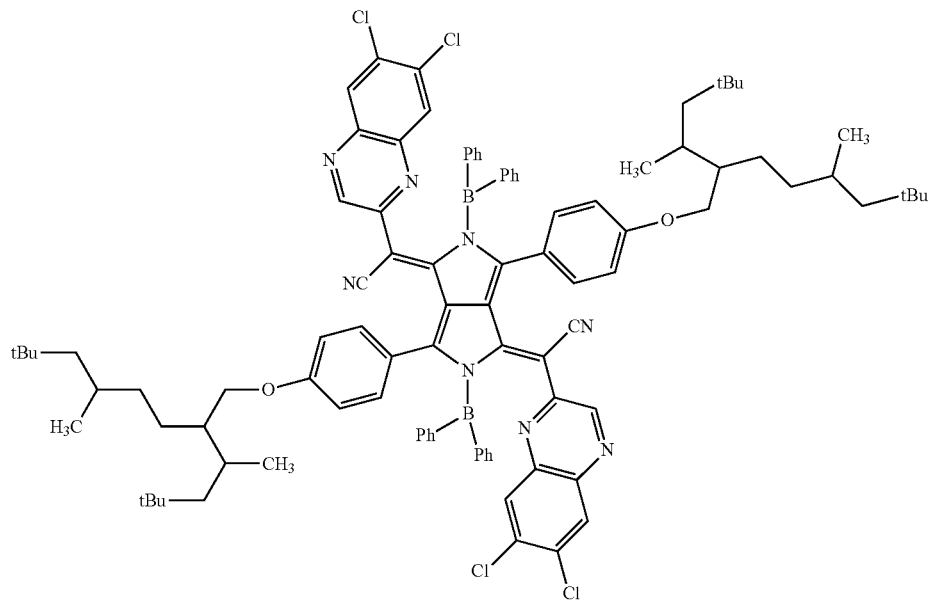
III-328
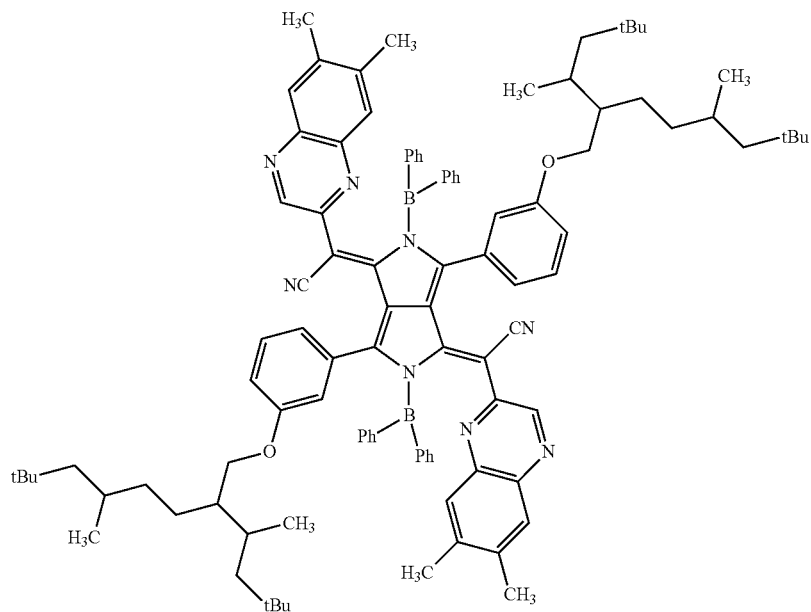
III-349
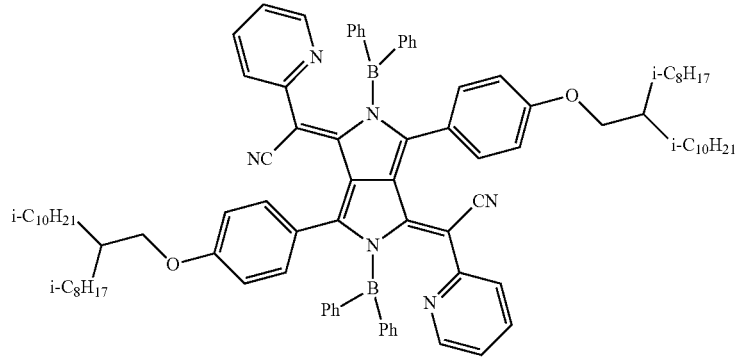

-continued
III-358
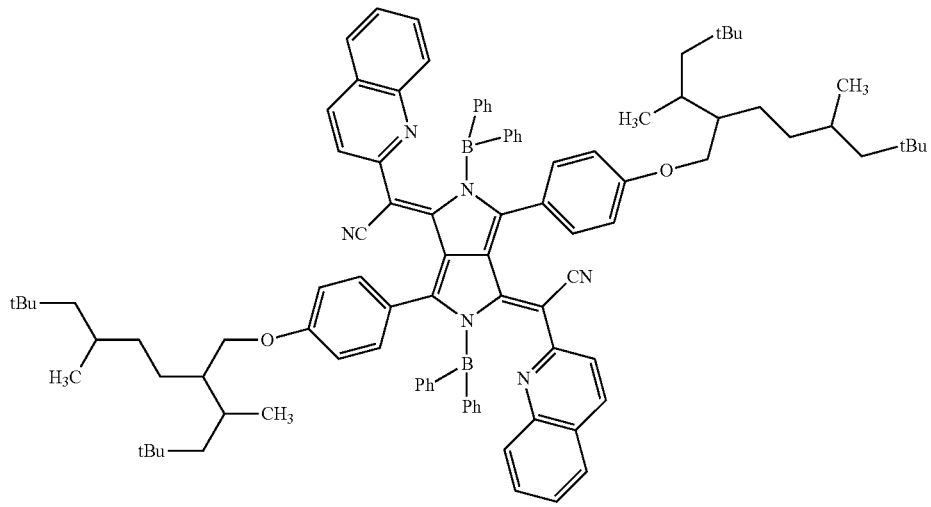
III-365
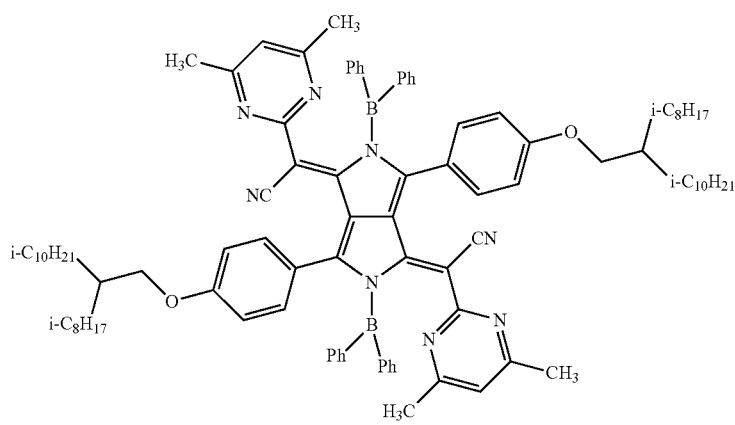
IV-7
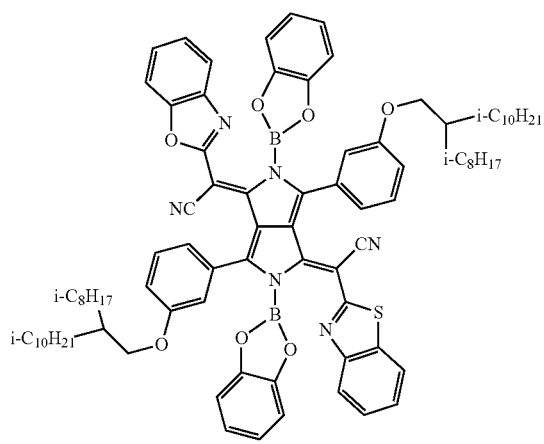
IV-91
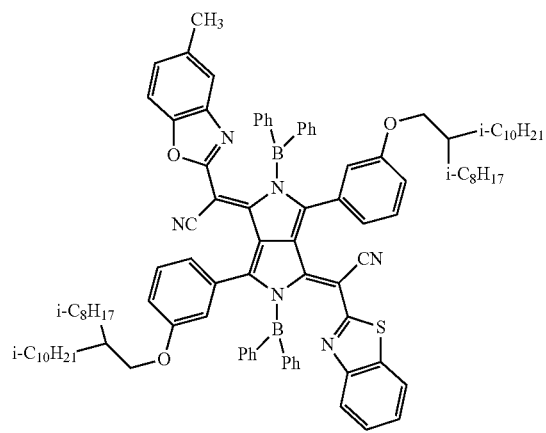

IV-92

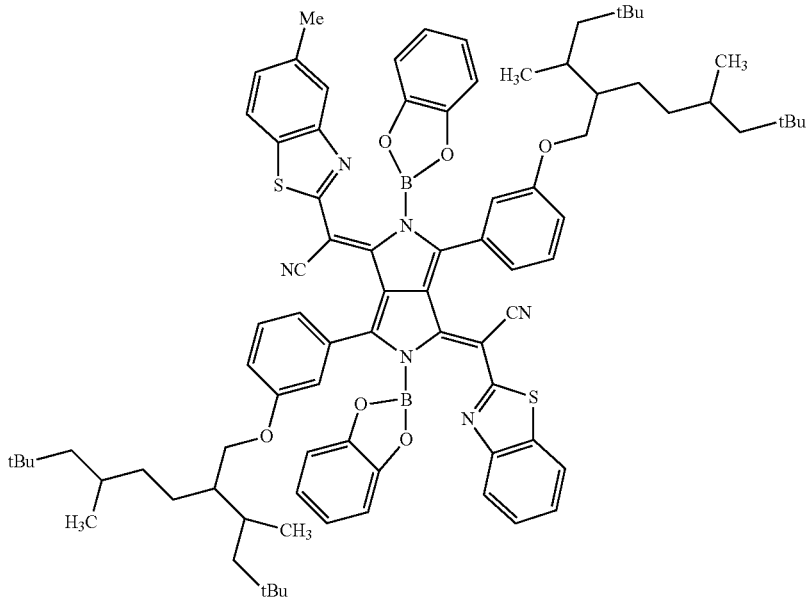

(Squarylium Dye)

In the present invention, it is preferable that the squarylium dye is a compound represented by the following Formula (1). The following compound is preferably a dye having an absorption in a near infrared range and more preferably a dye having an absorption maximum in a wavelength range of 650 to 1000 nm.

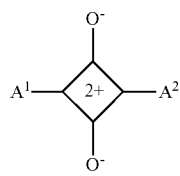

(1)

In Formula (1), $A^1$ and $A^2$ each independently represent an aryl group, a heteroaryl group, or a group represented by the following Formula (2).

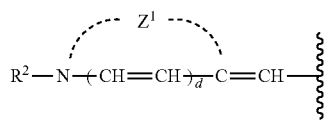

(2)

In Formula (2), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond to Formula (1).

In Formula (1), $A^1$ and $A^2$ each independently represent an aryl group, a heteroaryl group, or a group represented by the following Formula (2), and preferably a group represented by Formula (2).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

It is preferable that the heteroaryl group represented by $A^1$ and $A^2$ is a 5-membered or 6-membered ring. In addition, the heteroaryl group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom included in the heterocyclic group include a nitrogen atom, an oxygen atom, and a sulfur atom. Among these, a nitrogen atom or a sulfur atom is preferable. The number of heteroatoms is preferably 1 to 3 and more preferably 1 or 2. Specific examples include a heteroaryl group derived from a monocycle or a polycyclic aromatic ring such as a 5-membered or 6-membered ring containing at least one of a nitrogen atom, an oxygen atom, or a sulfur atom.

The aryl group and the heteroaryl group may have a substituent. In a case where the aryl group and the heteroaryl group have two or more substituents, the substituents may be the same as or different from each other.

Examples of the substituent include a halogen atom, a cyano group, a nitro group, an alkyl group, an alkenyl group, an alkynyl group, an aryl group, a heteroaryl group, an aralkyl group, —$OR^{10}$, —$COR^{11}$, —$COOR^{12}$, —$OCOR^{13}$, —$NR^{14}R^{15}$, —$NHCOR^{16}$, —$CONR^{17}R^{18}$, —$NHCONR^{19}R^{20}$, $NHCOOR^{21}$, —$SR^{22}$, —$SO_2R^{23}$, —$SO_2OR^{24}$, —$NHSO_2R^{25}$, and —$SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in —$COOR^{12}$ represents a hydrogen atom (that is, a carboxyl group), the hydrogen atom may be dissociable (that is, a carbonate group) or may be in the form of a salt. In a case where $R^{24}$ in —$SO_2OR^{24}$ represents a hydrogen atom (that is, a sulfo group), the hydrogen atom may be dissociable (that is, a sulfonate group) or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5-membered or 6-membered ring. The number of carbon atoms constituting the ring of the heteroaryl group is preferably 3 to 30, more preferably 3 to 18, and still more preferably 3 to 12. Examples of the heteroaryl group include a pyridine ring, a piperidine ring, a furan ring, a furfuran ring, a thiophene ring, a pyrrole ring, a quinoline ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, and a thiadiazole ring.

The alkyl group, the alkenyl group, the alkynyl group, the aralkyl group, the aryl group, and the heteroaryl group may have a substituent or may be unsubstituted. Examples of the substituent include the above-described substituents.

Next, the group represented by Formula (2) which is represented by $A^1$ and $A^2$ will be described.

In Formula (2), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and even still more preferably 2 or 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (2), the nitrogen-containing heterocycle formed by $Z^1$ is preferably a 5-membered or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the above-described substituents. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (2) is a group represented by the following Formula (3) or (4).

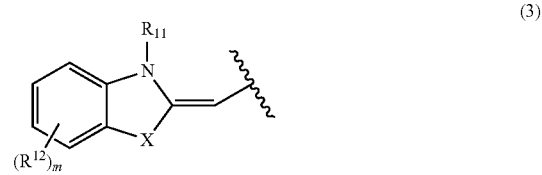

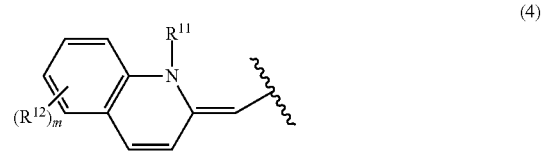

In Formulae (3) and (4), $R^{11}$ represents an alkyl group, an alkenyl group, or an aralkyl group, $R^{12}$ represents a substituent, in a case where m represents 2 or more, $R^{12}$'s may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a direct bond to Formula (1).

$R^{11}$ in Formulae (3) and (4) has the same definition and the same preferable range as $R^2$ in Formula (2).

$R^{12}$ in Formulae (3) and (4) represents a substituent. Examples of the substituent include the substituents described above regarding the Formula (1). For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring through a linking group, examples of the linking group include —CO—, —O—, —NH—, a divalent aliphatic group, a divalent aromatic group, and a combination thereof. For example, it is preferable that $R^{12}$, s may be linked to each other to form a benzene ring.

In Formula (3), X represents a nitrogen atom or $CR^{13}R^{14}$, and $R^{13}$ and $R^{14}$ each independently represent a hydrogen atom or a substituent. Examples of the substituent include the substituents described above regarding the Formula (1). For example, the substituent is an alkyl group. The number of carbon atoms in the alkyl group is preferably 1 to 20, more preferably 1 to 10, still more preferably 1 to 5, even still more preferably 1 to 3, and most preferably 1. The alkyl group is preferably linear or branched and more preferably linear.

m represents an integer of 0 to 4 and preferably 0 to 2.

As shown below, cations in Formula (1) are present without localized.

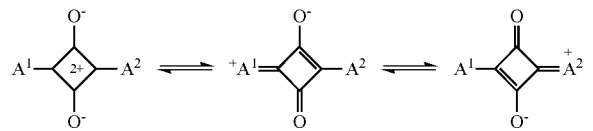

It is preferable that the squarylium dye is a compound represented by the following Formula (5).

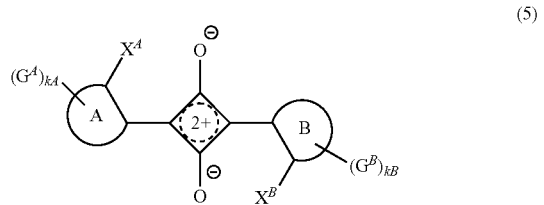

(5)

A ring A and a ring B each independently represent an aromatic ring or a heteroaromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represent integers representing the maximum numbers of $G^A$'s and $G^B$'s which may be substituted in the ring A and the ring B, respectively.

$X^A$ and $G^A$, or $X^B$ and $G^B$ may be bonded to each other to form a ring, and in a case where a plurality of $G^A$'s and a plurality of $G^B$'s are present, $G^A$'s and $G^B$'s may be bonded to each other to form ring structures, respectively.

$G^A$ and $G^B$ each independently represent a substituent. Examples of the substituent include the substituents described above regarding the Formula (1).

$X^A$ and $X^B$ each independently represent a substituent. Examples of the substituent include the substituents described above regarding the Formula (1). Among these, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable.

R$^{X1}$ and R$^{X1}$ each independently represent a hydrogen atom or a substituent. Examples of the substituent include an alkyl group, an alkenyl group, an alkynyl group, an aryl group, and a heteroaryl group. Among these, an alkyl group is preferable. The alkyl group is preferably linear or branched. The details of the alkyl group, the alkenyl group, the alkynyl group, the aryl group, and the heteroaryl group are the same as the ranges described regarding the substituents.

The ring A and the ring B each independently represent an aromatic ring or a heteroaromatic ring.

The aromatic ring and the heteroaromatic ring may be a monocycle or a fused ring.

Specific examples of the aromatic ring and the heteroaromatic ring include a benzene ring, a naphthalene ring, a pentalene ring, an indene ring, an azulene ring, a heptalene ring, an indacene ring, a perylene ring, a pentacene ring, an acenaphthylene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable.

The aromatic ring may be unsubstituted or may have a substituent. Examples of the substituent include the substituents described above regarding the Formula (1).

$X^A$ and $G^A$, or $X^B$ and $G^B$ may be bonded to each other to form a ring, and in a case where a plurality of $G^A$'s and a plurality of $G^B$'s are present, $G^A$'s and $G^B$'s may be bonded to each other to form rings, respectively.

It is preferable that the ring is a 5-membered or 6-membered ring. The ring may be a monocycle or a polycycle.

In a case where $X^A$ and $G^A$, $X^B$ and $G^B$, $G^A$'s, or $G^B$'s are bonded to each other to form a ring, the groups may be directly bonded to each other to form a ring, or may be bonded to each other through a divalent linking group selected from the group consisting of an alkylene group, —CO—, —O—, —NH—, —BR—, and a combination thereof to form a ring. It is preferable that $X^A$ and $G^A$, $X^B$ and $G^B$, $G^A$'s, or $G^B$'s are bonded to each other through —BR— to form a ring.

R represents a hydrogen atom or a substituent. Examples of the substituent include the substituents described above regarding Formula (1). Among these, an alkyl group or an aryl group is preferable.

kA represents an integer of 0 to nA, kB represents an integer of 0 to nB, nA represents an integer representing the maximum number of $G^A$'s which may be substituted in the ring A, and nB represents an integer representing the maximum number of $G^B$'s which may be substituted in the ring B.

kA and kB each independently represent preferably an integer of 0 to 4, more preferably 0 to 2, and still more preferably 0 or 1.

As an embodiment of the squarylium dye, a compound represented by the following Formula (6) is used. This compound has excellent heat resistance.

Formula (6)

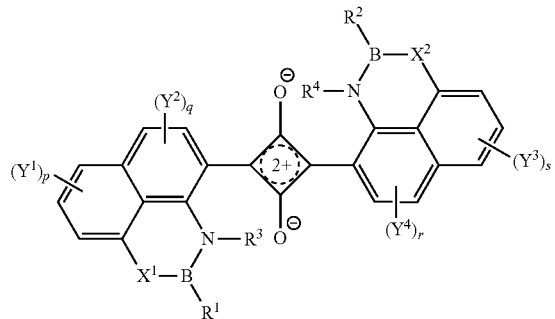

In the formula, $R^1$ and $R^2$ each independently represent a substituent.

$R^3$ and $R^4$ each independently represent a hydrogen atom or an alkyl group.

$X^1$ and $X^2$ each independently an oxygen atom or $-N(R^5)-$.

$R^5$ represents a hydrogen atom, an alkyl group, an aryl group, or a heteroaryl group.

$Y^1$ to $Y^4$ each independently represent a substituent, and $Y^1$ and $Y^2$, or $Y^3$ and $Y^4$ may be bonded to each other to form a ring.

In a case where a plurality of $Y^1$'s, a plurality of $Y^2$'s, a plurality of $Y^3$'s, and a plurality of $Y^4$'s are present, $Y^1$'s, $Y^2$'s, $Y^3$'s, or $Y^4$'s may be bonded to each other to form a ring.

p and s each independently represent an integer of 0 to 3.

q and r each independently represent an integer of 0 to 2.

Examples of the substituent represented by $R^1$, $R^2$, and $Y^1$ to $Y^4$ include the substituents described regarding Formula (1).

$R^3$ and $R^4$ each independently represent preferably a hydrogen atom, a methyl group, or an ethyl group, more preferably a hydrogen atom or a methyl group, and still more preferably a hydrogen atom.

$X^1$ and $X^2$ each independently an oxygen atom (—O—) or $-N(R^5)-$. $X^1$ and $X^2$ may be the same as or different from each other and is preferably the same as each other.

$R^5$ represents a hydrogen atom, an alkyl group, an aryl group, or a heteroaryl group.

$R^5$ represents preferably a hydrogen atom, an alkyl group, or an aryl group. The alkyl group, the aryl group, and the heteroaryl group represented by $R^5$ may be unsubstituted or may have a substituent. Examples of the substituent include the substituents described above regarding the Formula (1).

The number of carbon atoms in the alkyl group is preferably 1 to 20, more preferably 1 to 10, still more preferably 1 to 4, and even still more preferably 1 or 2. The alkyl group may be linear or branched.

The number of carbon atoms in the aryl group is preferably 6 to 20 and more preferably 6 to 12.

The heteroaryl group may be a monocycle or a polycycle. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. The number of carbon atoms constituting the ring of the heteroaryl group is preferably 3 to 30, more preferably 3 to 18, and still more preferably 3 to 12.

Specific examples of the squarylium dye include the following compounds.

Q-3

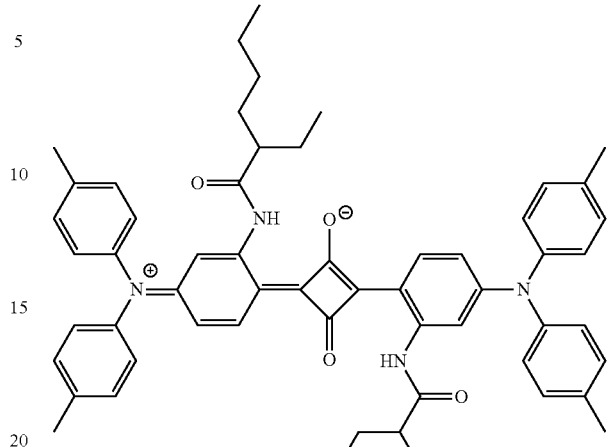

Q-11

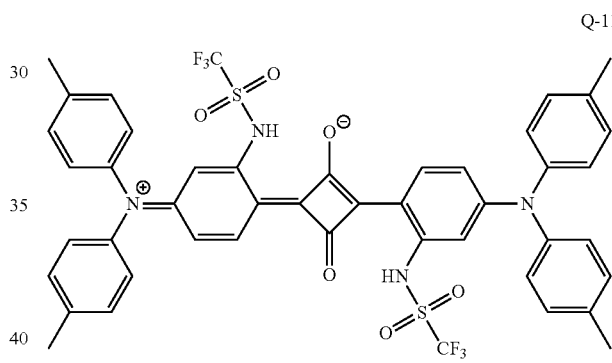

Q-17

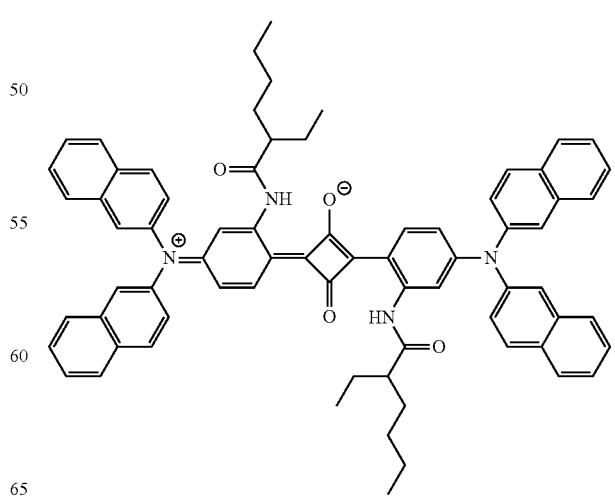

-continued
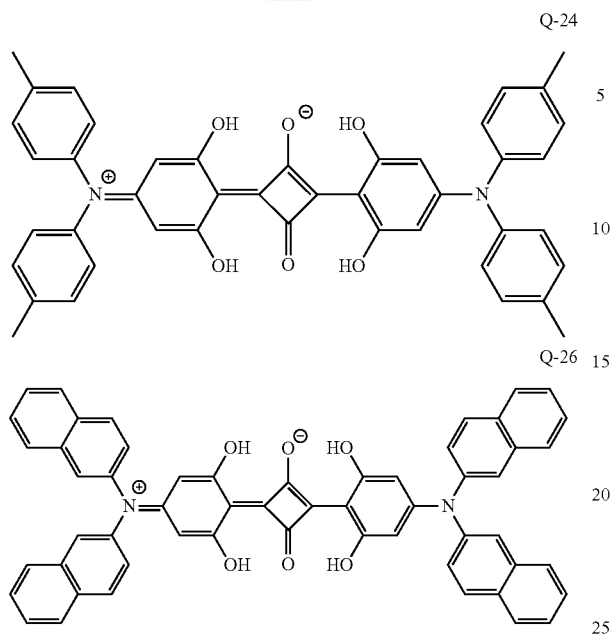
Q-24
Q-26
Q-28
Q-36
-continued
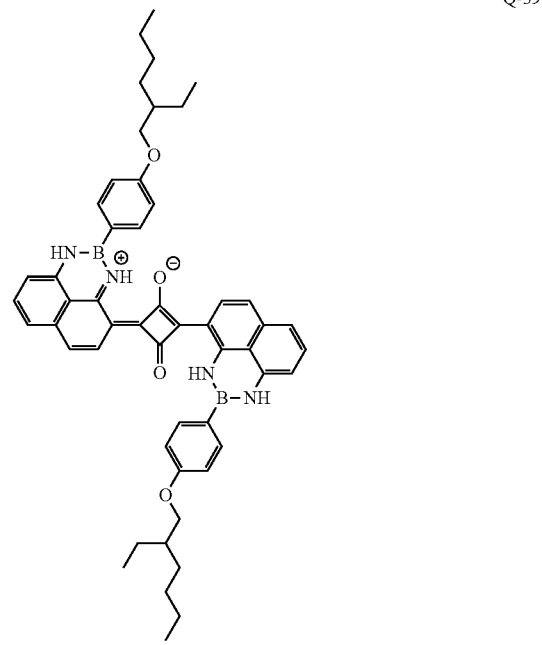
Q-39
Q-42
Q-49

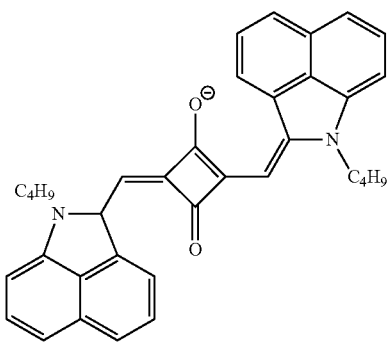

Q-51

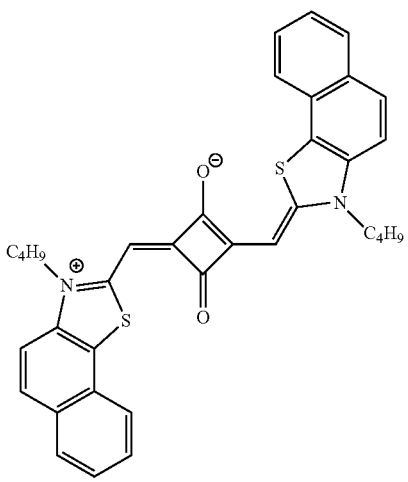

Q-54

(Cyanine Dye)

In the present invention, it is preferable that the cyanine dye is a compound represented by the following Formula (C).

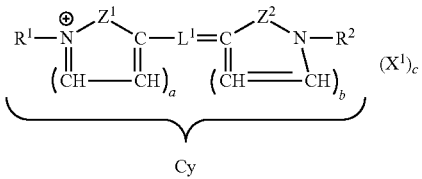

Formula (C)

In Formula (C), $Z^1$ and $Z^2$ each independently represent a non-metal atomic group for forming a 5- or 6-membered nitrogen-containing heterocycle which may be fused, $R^1$ and $R^2$ each independently represent an alkyl group, an alkenyl group, an alkynyl group, an aralkyl group, or an aryl group, $L^1$ represents a methine chain including an odd number of methine groups, and a and b each independently represent 0 or 1.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (C), $Z^1$ and $Z^2$ each independently represent a non-metal atomic group for forming a 5- or 6-membered nitrogen-containing heterocycle which may be fused.

Another heterocycle, an aromatic ring, or an aliphatic ring may be fused to the nitrogen-containing heterocycle. It is preferable that the nitrogen-containing heterocycle is a 5-membered ring. It is more preferable that a benzene ring or a naphthalene ring is fused to the 5-membered nitrogen-containing heterocycle. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable.

The nitrogen-containing heterocycle and a ring fused thereto may have a substituent. Examples of the substituent include the substituents described above regarding the Formula (1). Specific examples of the substituent include a halogen atom, a cyano group, a nitro group, an alkyl group, an alkenyl group, an alkynyl group, an aryl group, a heteroaryl group, an aralkyl group, —$OR^{10}$, —$COR^{11}$, —$COOR^{12}$, —$COOR^{13}$, —$NR^{14}R^{15}$, NHCOR$^{16}$, —$CONR^{17}R^{18}$, —$NHCONR^{19}R^{20}$, —$NHCOOR^{21}$, —$SR^{22}$, —$SO_2R^{23}$, —$SO_2OR^{24}$, —$NHSO_2R^{25}$, and —$SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in —$COOR^{12}$ represents a hydrogen atom (that is, a carboxyl group), the hydrogen atom may be dissociable (that is, a carbonate group) or may be in the form of a salt. In a case where $R^{24}$ in —$SO_2OR^{24}$ represents a hydrogen atom (that is, a sulfo group), the hydrogen atom may be dissociable (that is, a sulfonate group) or may be in the form of a salt. The details are the same as the ranges described above.

The alkyl group, the alkenyl group, the alkynyl group, the aralkyl group, the aryl group, and the heteroaryl group may have a substituent or may be unsubstituted. As the substituent, for example, a halogen atom, a hydroxyl group, a carboxyl group, a sulfo group, an alkoxy group, or an amino group is preferable, and a carboxyl group or a sulfo group is preferable, and a sulfo group is more preferable. In the carboxyl group and the sulfo group, a hydrogen atom may be dissociable or may be in the form of a salt.

In Formula (C), $R^1$ and $R^2$ each independently represent an alkyl group, an alkenyl group, an alkynyl group, an aralkyl group, or an aryl group.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In Formula (C), $L^1$ represents a methine chain including an odd number of methine groups. $L^1$ represents preferably a methine chain including 3, 5, or 7 methine groups and more preferably a methine chain including 5 or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by the following Formula (a). In addition, two substituents in the methine chain may be bonded to each other to form a 5-membered or 6-membered ring.

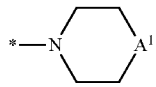

(a)

In Formula (a), * represents a linking portion to the methine chain, and $A^1$ represents an oxygen atom.

a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (C) will be shown below.

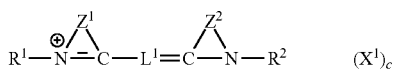

In a case where a site represented by Cy in Formula (C) is a cation site, $X^1$ represents an anion, and c represents the number of $X^1$'s for balancing charge. Examples of the anion include a halide ion (for example, $Cl^-$, $Br^-$, or $I^-$), a p-toluenesulfonate ion, an ethyl sulfate ion, $PF_6^-$, $BF_4^-$, $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyano borate anion.

In a case where a site represented by Cy in Formula (C) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, $Ag^+$, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidinium ion, and diazabicycloundecenium. As the cation, $Na^+$, $K^+$, $Mg^{2+}$, $Ca^{2+}$, $Zn^{2+}$, or diazabicycloundecenium is preferable.

In a case where charge of a site represented by Cy in Formula (C) is neutralized in a molecule, $X^1$ is not present. That is, c represents 0.

It is preferable that the cyanine dye is a compound represented by any one of the following (C-1) to (C-3).

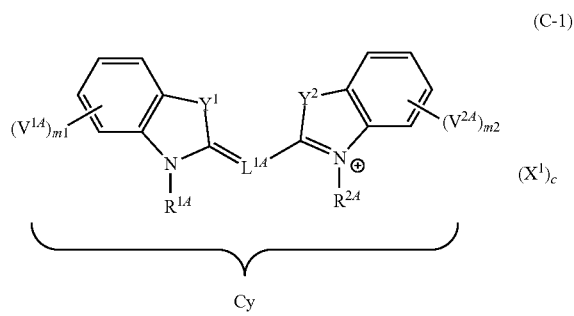

(C-1)

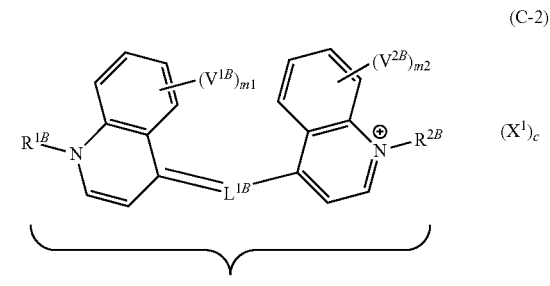

(C-2)

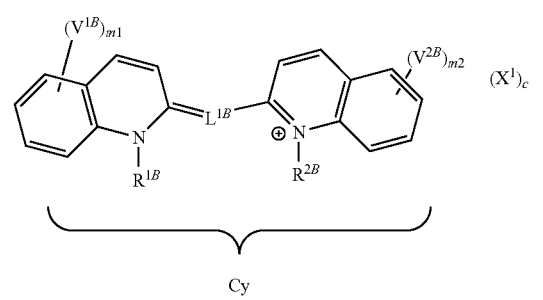

(C-3)

In the formulae, $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —NR$^{X1}$— or, —CR$^{X2}$R$^{X3}$—.

$R^{X1}$, $R^{X2}$, and $R^{X3}$ each independently represent a hydrogen atom or an alkyl group.

$V^{1A}$, $V^{2A}$, $V^{1B}$, and $V^{2B}$ each independently represent a substituent.

m1 and m2 each independently represent 0 to 4.

In a case where a site represented by Cy in the formula is a cation site, $X^1$ represents an anion, and c represents the number of $X^1$'s for balancing charge.

In a case where a site represented by Cy in the formula is an anion site, $X^1$ represents a cation, and c represents the number of $X^1$'s for balancing charge.

In a case where charge of a site represented by Cy in the formula is neutralized in a molecule, $X^1$ is not present.

The groups represented by $R^{1A}$, $R^{2A}$, $R^{1B}$, and $R^{2B}$ have the same definitions and the same preferable ranges as those of the alkyl group, the alkenyl group, the alkynyl group, the aralkyl group, and the aryl group described regarding $R^1$ and $R^2$ of Formula (C). These groups may be unsubstituted or may have a substituent. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt. In a case where $R^{1A}$, $R^{2A}$, $R^{1B}$, and $R^{2B}$ represent an alkyl group, it is more preferable that the alkyl group is linear.

$Y^1$ and $Y^2$ each independently represent —S—, —O—, —$NR^{X1}$— or, —$CR^{X2}R^{X3}$— and preferably —$R^{X1}$—, $R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (C).

Examples of the substituent represented by $V^{1A}$, $V^{2A}$, $V^{1B}$, and $V^{2B}$ include the substituents described regarding Formula (1), and preferable ranges thereof are also the same.

m1 and m2 each independently represent 0 to 4 and preferably 0 to 2.

The anion and the cation represented by $X^1$ have the same range and definitions and the same preferable ranges as those described regarding $X^1$ in Formula (C).

Specific examples of the cyanine dye include the following compounds.

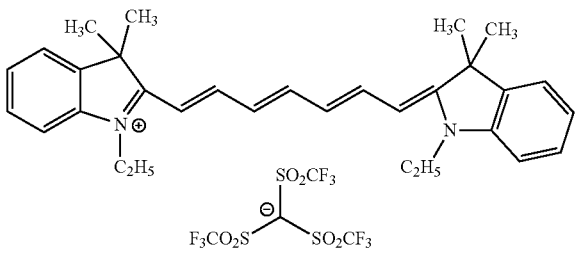

Cy-2

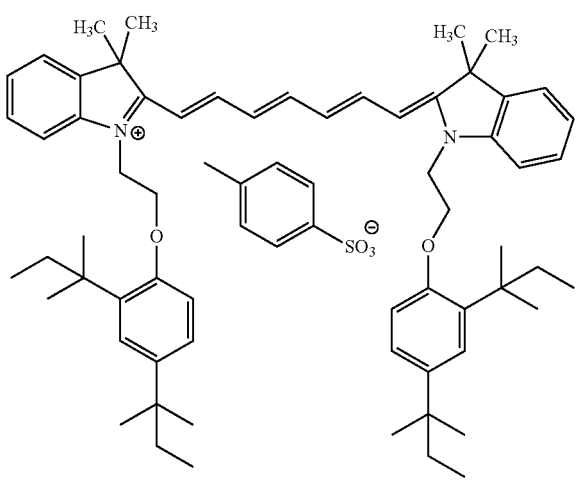

Cy-3

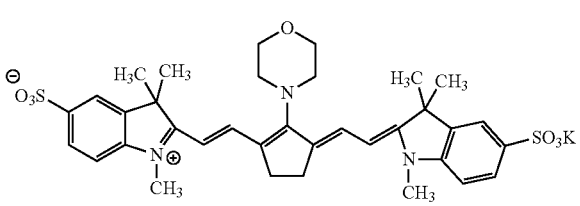

Cy-4

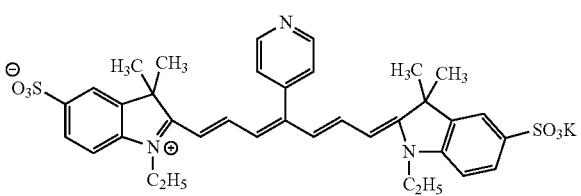

Cy-5

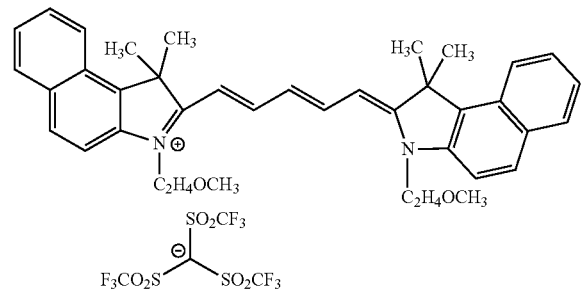

Cy-1

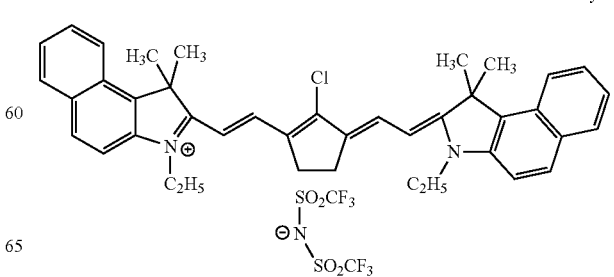

Cy-6

-continued
Cy-7
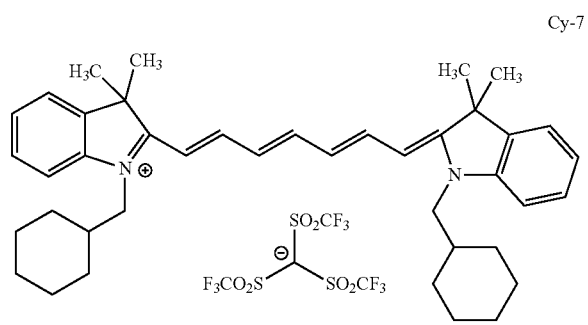
Cy-8
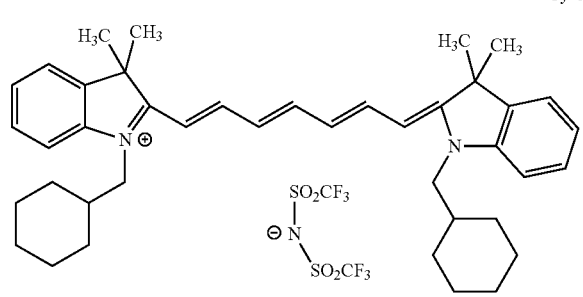
Cy-9
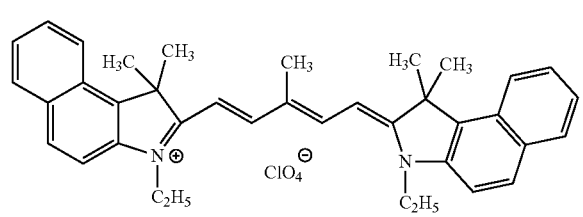
Cy-10
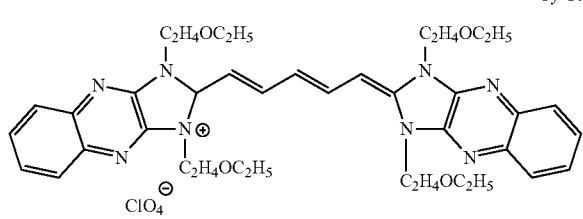
Cy-11
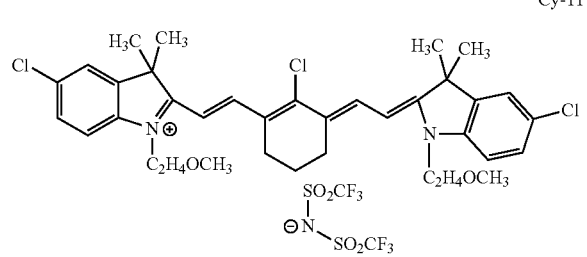
Cy-12
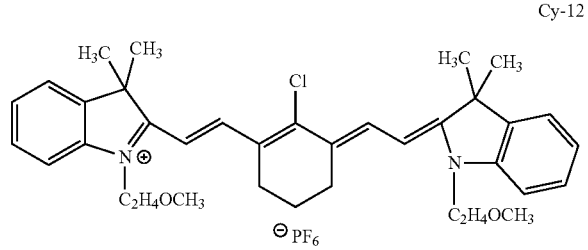
-continued
Cy-13
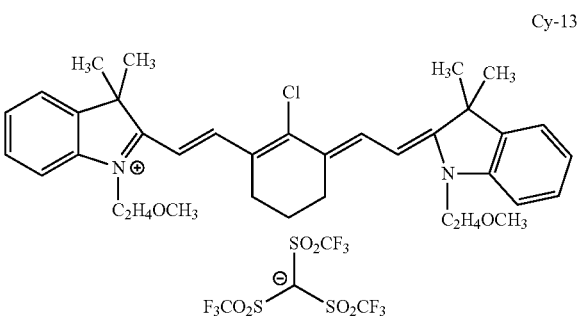
Cy-14
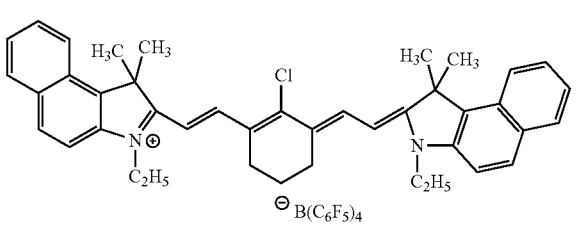
Cy-15
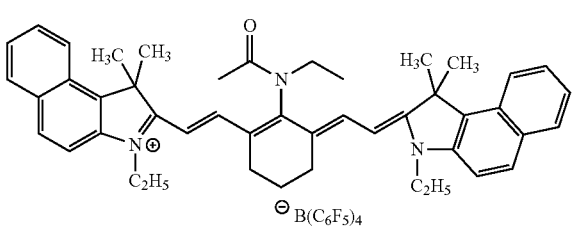
Cy-16
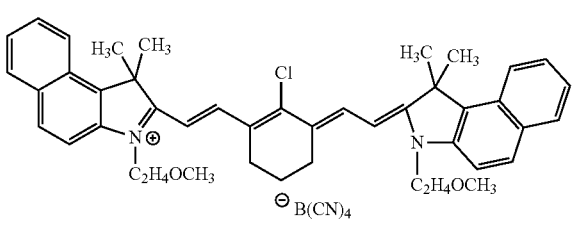
Cy-17
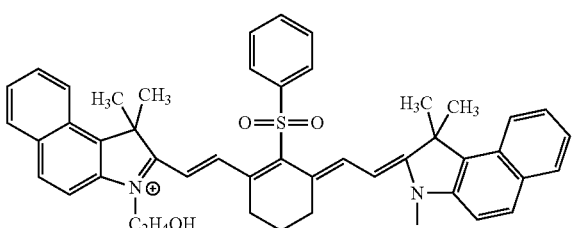
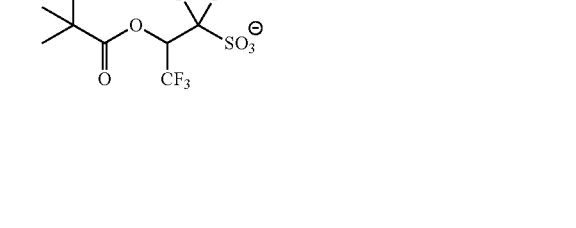
(Triarylmethane Dye)
Examples of the triarylmethane dye include a compound represented by the following Formula (TP).

Formula (TP)

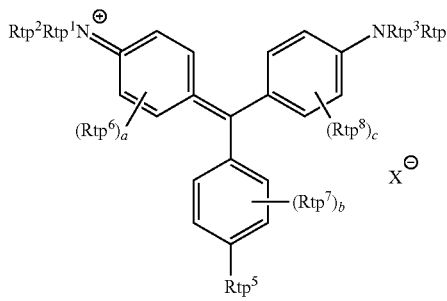

In Formula (TP), $Rtp^1$ to $Rtp^4$ each independently represent a hydrogen atom, an alkyl group, or an aryl group. $Rtp^5$ represents a hydrogen atom, an alkyl group, an aryl group, or $NRtp^9Rtp^{10}$ ($Rtp^9$ and $Rtp^{10}$ represents a hydrogen atom, an alkyl group, or an aryl group). $Rtp^6$, $Rtp^7$, and $Rtp^8$ represent a substituent. a, b, and c represent an integer of 0 to 4. In a case where a, b, and c represent 2 or more, $Rtp^6$'s, $Rtp^7$'s, and $Rtp^8$'s may be linked to each other to form a ring, respectively. X represents a counter anion. In a case where X is not present, at least one of $Rtp^1$, ..., or $Rtp^7$ includes an anion.

$Rtp^1$ to $Rtp^4$ represent preferably a hydrogen atom, a linear or branched alkyl group having 1 to 5 carbon atoms, or a phenyl group. $Rtp^5$ represents preferably a hydrogen atom or $NRtp^9Rtp^{10}$ and more preferably $NRtp^9Rtp^{10}$. $Rtp^9$ to $Rtp^{10}$ represent preferably a hydrogen atom, a linear or branched alkyl group having 1 to 5 carbon atoms, or a phenyl group. Examples of the substituent represented by $Rtp^6$, $Rtp^7$, and $Rtp^8$ include the substituents described regarding Formula (1).

In Formula (TP), X represents a counter anion. In a case where X is not present, at least one of $Rtp^1$, ..., or $Rtp^7$ includes an anion. It is preferable that at least one of $Rtp^1$, ..., or $Rtp^7$ includes an anion.

The counter anion is not particularly limited. The counter anion may be an organic anion or an inorganic anion and is preferably an organic anion. Examples of the counter anion include a fluorine anion, a chlorine anion, a bromine anion, an iodine anion, a cyanide ion, a perchlorate anion, and a non-nucleophilic anion. From the viewpoint of heat resistance, it is preferable that the counter anion is a non-nucleophilic anion. Examples of the counter anion include a well-known non-nucleophilic anion described in paragraph "0075" of JP2007-310315A, the content of which is incorporated herein by reference. Here, non-nucleophilic represents a property in which a coloring agent does not undergo nucleophilic attack during heating. As the counter anion, an imide anion (for example, a bis(sulfonyl)imide anion), a tris(sulfonyl)methyl anion, or an anion having a boron atom is preferable, a bis(sulfonyl)imide anion or a tris(sulfonyl)methyl anion is more preferable, and a bis(sulfonyl)imide anion is still more preferable.

In Formula (TP), a, b, and c each independently represent an integer of 0 to 4. In particular, a and c each independently represent preferably 0 or 1 and more preferably 0. b represents preferably an integer of 0 to 2 and more preferably 0 or 2.

In Formula (TP), in a case where at least one of $Rtp^1$, ..., or $Rtp^7$ includes an anion, as the anion, $—SO_3^-$, $—COO^-$, $—PO_4^-$, a bis(sulfonyl)imide anion, a tris(sulfonyl)methide anion, or a tetraaryl borate anion is preferable, a bis(sulfonyl)imide anion, a tris(sulfonyl)methide anion, or a tetraaryl borate anion is more preferable, and a bis(sulfonyl)imide anion or a tris(sulfonyl)methide anion is still more preferable.

Specific examples of the triarylmethane dye include the following compounds.

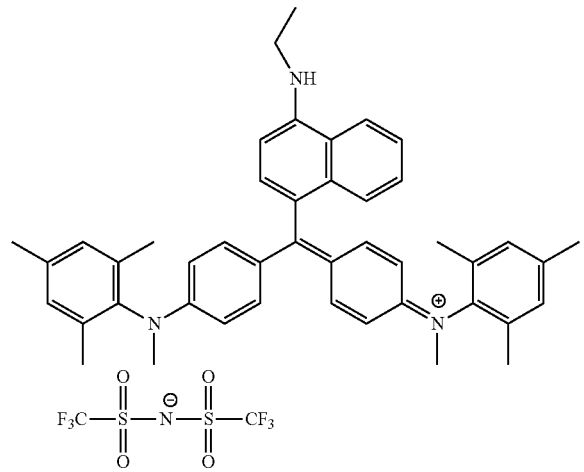

(Xanthene Dye)

Examples of the xanthene dye include a compound represented by the following Formula (J).

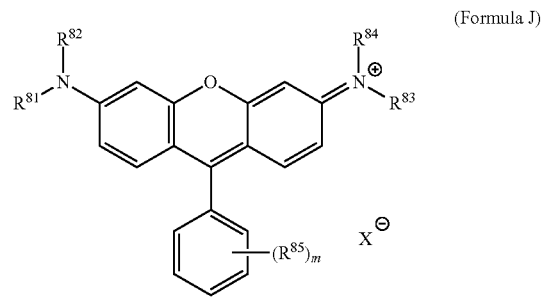

(Formula J)

In Formula (J), $R^{81}$, $R^{82}$, $R^{83}$, and $R^{84}$ each independently represent a hydrogen atom or a substituent, $R^{85}$'s each independently represent a monovalent substituent, and m represents an integer of 0 to 5. X represents a counter anion. In a case where X is not present, at least one of $R^{81}$, ..., or $R^{85}$ includes an anion.

Examples of the substituent which may be represented by $R^{81}$ to $R^{85}$ in Formula (J) include the substituents described regarding Formula (1). In Formula (J), $R^{81}$ and $R^{82}$, $R^{83}$ and $R^{84}$, and $R^{85}$'s (in a case where m represents 2 or more) may be each independently bonded to each other to form a 5-membered, 6-membered, or 7-membered saturated ring or a 5-membered, 6-membered, or 7-membered unsaturated ring. Examples of the formed ring include a pyrrole ring, a furan ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring. Among these, a benzene ring or a pyridine ring is preferable.

In a case where the formed ring is a group which can be further substituted, the ring may be substituted with the substituent described above regarding $R^{81}$ to $R^{85}$. In a case where the formed ring is substituted with two or more substituents, these substituents may be the same as or different from each other.

In Formula (J), X represents a counter anion. Examples of the counter anion include the counter anions described above regarding Formula (TP). In a case where X is not present, at least one of $R^{81}, \ldots,$ or $R^{85}$ includes an anion. In Formula (J), in a case where at least one of $R^{81}, \ldots,$ or $R^{85}$ includes an anion, examples of the anion include the anions described above regarding Formula (TP).

Specific examples of the xanthene dye include the following compounds.

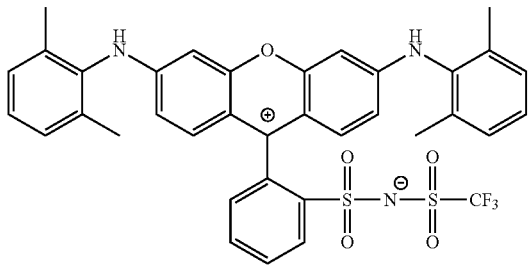 [SMILES: Cc1cccc(C)c1Nc1ccc2c(c1)oc1cc(Nc3c(C)cccc3C)ccc1[c+]2-c1ccccc1S(=O)(=O)[N-]S(=O)(=O)C(F)(F)F]

(Pyrromethene Dye)

As the pyrromethene dye, a compound represented the following Formula (PM) is preferable.

Formula (PM)

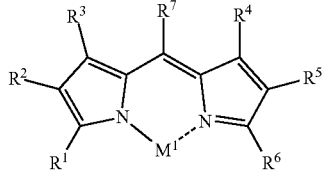

In Formula (I), $R^1$, $R^2$, $R^3$, $R^4$, $R^5$, and $R^6$ each independently represent a hydrogen atom or a substituent, and $R^7$ represents a hydrogen atom, a halogen atom, an alkyl group, an aryl group, or a heterocyclic group. Examples of the substituent include the substituents described above regarding the Formula (1). $M^1$ represents Fe, Zn, Mg, Si, Pt, Pd, Mo, Mn, Cu, Ni, Co, TiO, B, or VO.

Specific examples of the pyrromethene dye include the following compounds.

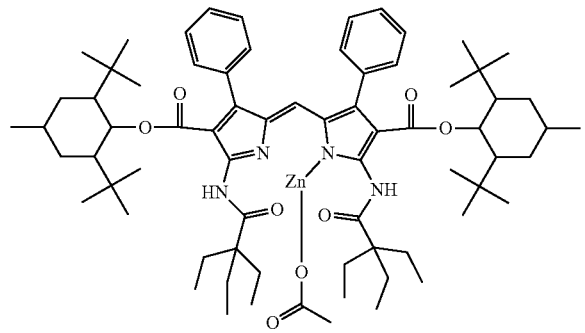

<<Resin>>

The film according to the present invention includes a resin. A glass transition temperature of the resin is preferably 0° C. to 100° C. The lower limit is more preferably 10° C. or higher and still more preferably 20° C. or higher. The upper limit is more preferably 95° C. or lower and still more preferably 90° C. or lower. In the present invention, the glass transition temperature of the resin is a theoretical value obtained from the following expression.

$$1/Tg=(W1/Tg1)+(W2/Tg2)+\ldots+(Wn/Tgn)$$

In the expression, Tg represents the glass transition temperature (unit: K) of the resin, Tgi represents a glass transition temperature (unit: K) of a homopolymer of a monomer i, and Wi represents a mass fraction of the monomer i in the all the monomer components (i=1, 2, ..., and n). The expression is a calculation expression for a case where the resin is formed of n kinds of monomer components including a monomer 1, a monomer 2, ..., and a monomer n.

The weight-average molecular weight (Mw) of the resin is preferably 20000 to 60000. The lower limit is more preferably 25000 or higher. The upper limit is more preferably 55000 or lower.

The dispersity (Mw/Mn) of the resin is preferably 1.1 to 10.0. The lower limit is more preferably 1.3 or higher and still more preferably 1.5 or higher. The upper limit is more preferably 8.0 or lower and still more preferably 6.0 or lower.

The details of the resin will be described regarding a composition described below.

<<Pigment>>

The film according to the present invention may include a pigment. As the pigment, for example, various well-known pigments of the related art can be used. The pigment may be an inorganic pigment or an organic pigment. In addition, the pigment may be a chromatic pigment, a black pigment, or a white pigment. In the present invention, the chromatic pigment denotes a pigment other than a white pigment and a black pigment. It is preferable that the chromatic pigment is a pigment having an absorption maximum in a wavelength range of 400 nm or longer and shorter than 650 nm. In addition, in the present invention, the color of the white pigment includes not only pure white but also bright gray (for example, grayish white or light gray) similar to white.

The chromatic pigment is not particularly limited, and a well-known chromatic pigment can be used. For example, the following compound can be used:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments); C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

As the inorganic pigment, for example, a metal compound such as a metal, a metal oxide, or a metal complex salt can be used, and specific examples thereof include an oxide of a metal such as iron, cobalt, aluminum, cadmium, lead, copper, titanium, magnesium, chromium, zinc, or antimony; and a composite oxide of the metal. In addition, for example, a white pigment such as titanium oxide, strontium titanate, zinc oxide, magnesium oxide, zirconium oxide, aluminum oxide, barium sulfate, silica, talc, mica, aluminum hydroxide, calcium silicate, aluminum silicate, hollow resin particles, or zinc sulfide, a black pigment such as carbon black, titanium black, or graphite, and a tungsten oxide compound can also be used. As the tungsten oxide compound, a compound represented by the following Formula (compositional formula) (W-1) is preferable.

$$M_xW_yO_z \qquad \text{(W-1)}$$

M represents metal, W represents tungsten, and O represents oxygen.
$0.001 \leq x/y \leq 1.1$
$2.2 \leq x/y \leq 3.0$ Examples of the metal represented by M include an alkali metal, an alkali earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi. Among these, an alkali metal is preferable, Rb or Cs is more preferable, and Cs is still more preferable. As the metal represented by M, one kind or two or more kinds may be used.

Specific examples of the tungsten oxide compound include $Cs_{0.33}WO_3$, $Rb_{0.33}WO_3$, $K_{0.33}WO_3$, and $Ba_{0.33}WO_3$. Among these, $Cs_{0.33}WO_3$ or $Rb_{0.33}WO_3$ is preferable, and $Cs_{0.33}WO_3$ is more preferable. The tungsten oxide compound is available in the form of, for example, a dispersion of tungsten particles such as YMF-02 (manufactured by Sumitomo Metal Mining Co., Ltd.).

<<Coloring Material that Allows Transmission of at Least Part of Light in Infrared Range and Shields Light in Visible Range (Coloring Material that Shields Visible Light)>>

The film according to the present invention may also include a coloring material that allows transmission of at least a part of light in an infrared range and shields light in a visible range (hereinafter, also referred to as "coloring material that shields visible light"). The film including the coloring material that shields visible light can be preferably used as, for example, an infrared transmitting filter. The content of a pigment in the coloring material that shields visible light is preferably 90 mass % or higher, more preferably 95 mass % or higher, and still more preferably 99 mass % or higher with respect to the total mass of the coloring material that shields visible light. In addition, it is preferable that black, gray, or a color similar to black or gray is exhibited using a combination of a plurality of coloring materials that shields visible light. In addition, it is preferable that the coloring material that shields visible light is a material that absorbs light in a wavelength range of violet to red. In addition, it is preferable that the coloring material that shields visible light is a material that shields light in a wavelength range of 450 to 650 nm. In a case where the coloring material that shields visible light is a dye, the dye aggregate may be the coloring material that shields visible light.

In the present invention, it is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes an organic black colorant In addition, in the present invention, the organic black colorant as the coloring material that shields visible light denotes a material that absorbs light in a visible range and allows transmission of at least a part of light in an infrared range. Accordingly, in the present invention, the organic black colorant as the coloring material that shields visible light does not denote a black colorant that absorbs both light in an infrared range and light in a visible range, for example, carbon black or titanium black.

Examples of the chromatic colorant include the chromatic pigment and a dye having an absorption in a visible range. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

In the present invention, it is preferable that the coloring material that shields visible light is a material in which a ratio A/B of a minimum value A of an absorbance in a wavelength range of 450 to 650 nm to a minimum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the coloring material that shields visible light includes two or more chromatic colorants, it is preferable that the chromatic colorants are selected from the group consisting of a red colorant, a green colorant, a blue colorant, a yellow colorant, a violet colorant, and an orange colorant.

In a case where the coloring material that shields visible light is formed using a combination of two or more chromatic colorants, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant For example, ratios (mass ratios) between the respective colorants are as follows.

TABLE 1

| No. | Yellow Colorant | Green Colorant | Blue Colorant | Violet Colorant | Red Colorant | Orange Colorant |
| --- | --- | --- | --- | --- | --- | --- |
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

<<Other Components>>

The film according to the present invention may further include materials described below regarding a composition that can be used in a film forming method according to the present invention, or components derived from the materials. For example, in a case where a composition including a polymerizable compound is used, the film according to the present invention may include an unreacted polymerizable compound, a polymer of a polymerizable compound, or the like.

The film according to the present invention can be preferably used as, for example, a color filter, an infrared cut filter, or an infrared transmitting filter. In a case where the film according to the present invention is used as a color filter, it is preferable that the film according to the present invention includes a chromatic colorant. In a case where the film according to the present invention is used as an infrared cut filter, it is preferable that the film according to the present invention includes a compound having an absorption maximum in a wavelength range of 650 to 1000 nm. In addition, in a case where the film according to the present invention is used as an infrared transmitting filter, it is preferable that the film according to the present invention includes a coloring material that shields visible light.

<Film Forming Method>

Next, a film forming method according to the present invention will be described. The film forming method according to the present invention is a method of forming the above-described film, the film forming method including: a step of applying a composition including a dye, a resin, and a solvent to a support to form a composition layer on the support; and a step of causing the dye included in the composition layer to aggregate. First, the composition used in the film forming method according to the present invention will be described.

<<Composition>>

<<<Dye>>>

The composition used in the film forming method according to the present invention includes a dye. Examples of the dye include the materials described above regarding the film. The content of the dye in the composition is preferably 1 to 50 mass % with respect to the total solid content of the composition. The upper limit is more preferably 40 mass % or lower and still more preferably 30 mass % or lower. The lower limit is more preferably 5 mass % or higher and still more preferably 10 mass % or higher. In a case where the content of the dye is in the above-described range, a film having excellent heat resistance can be easily formed.

<<<Resin>>>

The composition used in the film forming method according to the present invention includes a resin. The resin is mixed, for example, in order to disperse the pigment and the like in the composition and to be added as a binder. The resin which is mainly used to disperse the pigments and the like will also be called a dispersant. However, the above-described uses of the resin are merely exemplary, and the resin can be used for purposes other than the uses.

A glass transition temperature of the resin is preferably 0° C. to 100° C. The lower limit is more preferably 10° C. or higher and still more preferably 20° C. or higher. The upper limit is more preferably 95° C. or lower and still more preferably 90° C. or lower.

The weight-average molecular weight (Mw) of the resin is preferably 20000 to 60000. The lower limit is more preferably 25000 or higher. The upper limit is more preferably 55000 or lower.

The dispersity (Mw/Mn) of the resin is preferably 1.1 to 10.0. The lower limit is more preferably 1.3 or higher and still more preferably 1.5 or higher. The upper limit is more preferably 8.0 or lower and still more preferably 6.0 or lower.

Examples of the resin include a (meth)acrylic resin, an epoxy resin, an enethiol resin, a polycarbonate resin, a polyether resin, a polyarylate resin, a polysulfone resin, a polyethersulfone resin, a polyparaphenylene resin, a polyarylene ether phosphine oxide resin, a polyimide resin, a polyamide imide resin, a polyolefin resin, a cyclic olefin resin, and a polyester resin. Among these resins, one kind may be used alone, or a mixture of two or more kinds may be used.

Examples of the (meth)acrylic resin include a polymer including a constitutional unit derived from (meth)acrylic acid and/or an ester thereof. Specific examples of the (meth) acrylic resin include a polymer obtained by polymerization of at least one selected from the group consisting of (meth) acrylic acid, a (meth)acrylic acid ester, a (meth)acrylamide, and a (meth)acrylonitrile.

Examples of the polyester resin include: a polymer obtained by a reaction of a polyol (for example, ethylene glycol, propylene glycol, glycerin, or trimethylolpropane) and a polybasic acid (for example, an aromatic dicarboxylic acid such as terephthalic acid, isophthalic acid, or naphthalenedicarboxylic acid, an aromatic dicarboxylic acid in which a hydrogen atom bonded to an aromatic ring in the above-described aromatic dicarboxylic acid is substituted with a methyl group, an ethyl group, a phenyl group, or the like, an aliphatic dicarboxylic acid having 2 to 20 carbon atoms such as adipic acid, sebacic acid, or dodecanedicarboxylic acid, or an alicyclic dicarboxylic acid such as cyclohexanedicarboxylic acid); and a polymer (for example, polycaprolactone) obtained by ring-opening polymerization of a cyclic ester compound such as a caprolactone monomer.

In addition, the resin may have an acid group. Examples of the acid group include a carboxyl group, a phosphate group, a sulfonate group, and a phenolic hydroxyl group. Among these acid groups, one kind may be used alone, or two or more kinds may be used in combination. The resin having an acid group can also be used as an alkali-soluble resin.

As the resin having an acid group, a polymer having a carboxyl group at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable. Examples of the other monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphtyl (meth)acrylate, cyclohexyl (meth) acrylate, glycidyl methacrylate, and tetrahydrofurfuryl methacrylate. Examples of the vinyl compound include styrene, α-methylstyrene, vinyl toluene, acrylonitrile, vinyl acetate, N-vinylpyrrolidone, a polystyrene macromonomer, and a polymethyl methacrylate macromonomer. In addition, as other monomers, a N-position-substituted maleimide monomer such as N-phenylmaleimide or N-cyclohexylmaleimide described in JP1998-300922A (JP-H10-300922A) can also be used. Among these monomers which are copolymerizable with the (meth)acrylic acid, one kind may be used alone, or two or more kinds may be used in combination.

As the resin having an acid group, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the resin having an acid group, a polymer obtained by polymerization of monomer components including a compound represented by the following Formula (ED1) and/or a compound represented by the following Formula (ED2) (hereinafter, these compounds will also be referred to as "ether dimer") is also preferable.

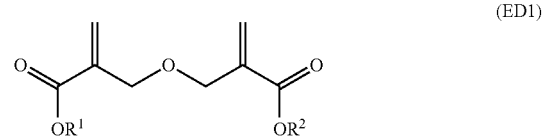

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A.

The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination. A structure derived from the ether dimer may be copolymerized with other monomers.

The resin having an acid group may include a structural unit which is derived from a compound represented by the following Formula (X).

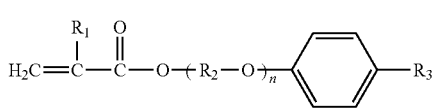
(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. In addition, the number of carbon atoms in the alkyl group of $R_3$ is 1 to 20 and preferably 1 to 10, and the alkyl group of $R_3$ may have a benzene ring. Examples of the alkyl group having a benzene ring represented by $R_3$ include a benzyl group and a 2-phenyl(iso)propyl group.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference.

The acid value of the resin having an acid group is preferably 30 to 200 mgKOH/g. The lower limit is more preferably 50 mgKOH/g or higher and still more preferably 70 mgKOH/g or higher. The upper limit is more preferably 150 mgKOH/g or lower and still more preferably 120 mgKOH/g or lower.

The resin may have a polymerizable group. By using a resin having a polymerizable group, the aggregation of the dye in the aggregation step can be easily adjusted, and the average particle size of the dye aggregate present in the film can be easily adjusted. Examples of the polymerizable group include a group having an ethylenically unsaturated bond. Examples of the constitutional unit having a polymerizable group include the following Formulae (A2-1) to (A2-4).

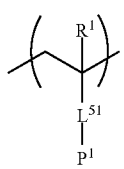
(A2-1)

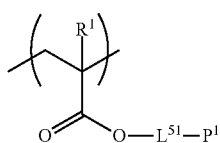
(A2-2)

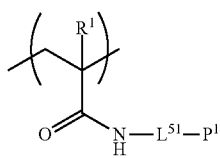
(A2-3)

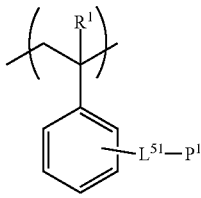
(A2-4)

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include an alkylene group, an arylene group, —O—, —S—, —CO—, —COO—, —OCO—, —$SO_2$—, —$NR^{10}$— ($R^{10}$ represents a hydrogen atom or an alkyl group and preferably a hydrogen atom), and a group including a combination thereof. Among these, a group including a combination —O— and at least one of an alkylene group, an arylene group, or an alkylene group is preferable. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. The number of carbon atoms in the arylene group is preferably 6 to 18, more preferably 6 to 14, and still more preferably 6 to 10.

$P^1$ represents a polymerizable group. Examples of the polymerizable group include a group having an ethylenically unsaturated bond such as a vinyl group, a (meth)allyl group, a (meth)acryloyl group, or a (meth)acryloyloxy group.

Examples of the resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.). Specific examples of the resin having a polymerizable group include the following compounds.

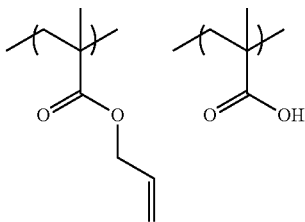

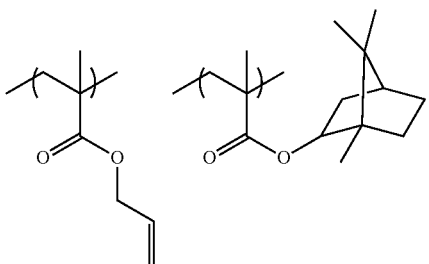
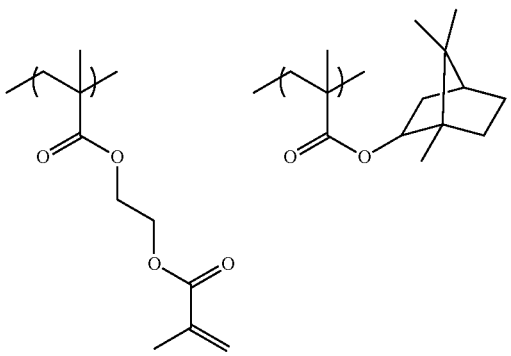
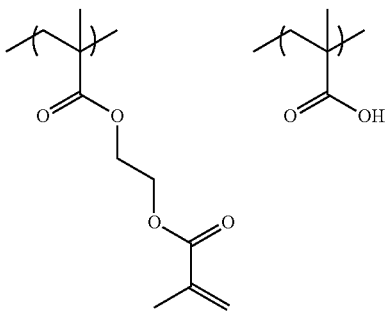
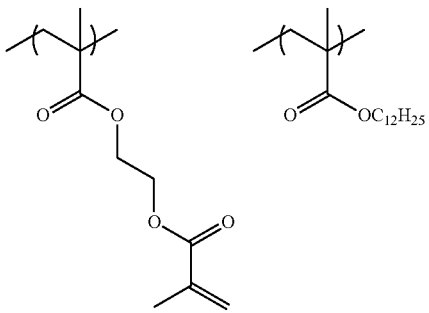
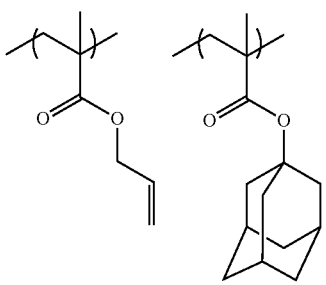

It is also preferable that the resin has a constitutional unit represented by any one of Formulae (A3-1) to (A3-7).

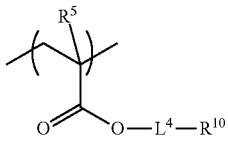

(A3-1)

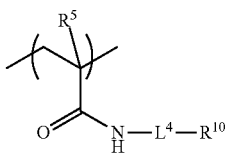

(A3-2)

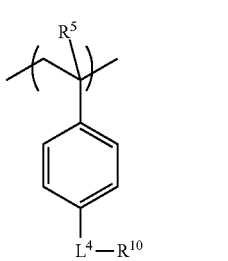

(A3-3)

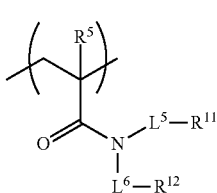

(A3-4)

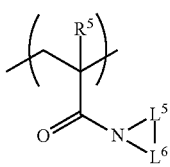

(A3-5)

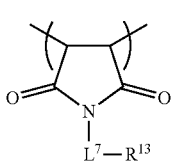

(A3-6)

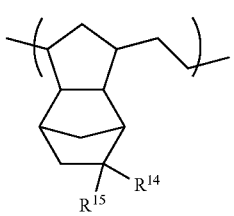

(A3-7)

In the formulae, $R^5$ represents a hydrogen atom or an alkyl group, $L^4$ to $L^7$ each independently represent a single bond or a divalent linking group, and $R^{10}$ to $R^{13}$ each independently represent a hydrocarbon group. $R^{14}$ and $R^{15}$ each independently represent a hydrogen atom or a substituent.

$R^5$ has the same definition and the same preferable range as $R^1$ in Formulae (A2-1) to (A2-4).

$L^4$ to $L^7$ have the same definition and the same preferable range as $L^{51}$ in Formulae (A2-1) to (A2-4).

The hydrocarbon group represented by $R^{10}$ to $R^{13}$ is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic hydrocarbon group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group (aralkyl group) substituted with an aryl group such as benzyl. In particular, from the viewpoint of copolymerization with the constitutional unit having a polymerizable group for the adjustment of Tg, an alicyclic hydrocarbon group such as isobornyl or adamantyl is preferable.

Examples of the substituent represented by $R^{14}$ and $R^{15}$ include the groups described above regarding $G^A$ and $G^B$ in Formula (SQ). In particular, it is preferable that at least one of $R^{14}$ or $R^{15}$ represents a cyano group or —COORa. Ra represents a hydrogen atom or a substituent. Examples of the substituent include the groups described above regarding $G^A$ and $G^B$ in Formula (SQ). Among these, an alkyl group or an aryl group is preferable.

Examples of the resin including the constitutional unit include the resins described above as the specific examples of the resin having a polymerizable group, and the following resins. Examples of a commercially available product of the resin having a constitutional unit represented by (A3-7) include ARTON F4520 (manufactured by JSR Corporation).

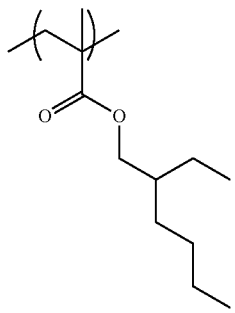

In addition, it is also preferable that MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) is used as the resin.

The content of the resin in the composition used in the film forming method according to the present invention is preferably 1 to 80 mass % with respect to the total solid content of the composition. The lower limit is more preferably 10 mass % or higher and still more preferably 20 mass % or higher. The upper limit is more preferably 70 mass % or lower and still more preferably 60 mass % or lower.

<<Solvent>>

The composition used in the film forming method according to the present invention includes a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Preferable examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkoxyacetate (for example, methyl alkoxyacetate, ethyl alkoxyacetate, or butyl alkoxyacetate (for example, methyl methoxyacetate, ethyl methoxyacetate, butyl methoxyacetate, methyl ethoxyacetate, or ethyl ethoxyacetate)), alkyl 3-alkoxypropionate (for example, methyl 3-alkoxypropionate or ethyl 3-alkoxypropionate (for example, 3-methyl methoxypropionate, 3-ethyl methoxypropionate, 3-methyl ethoxypropionate, or 3-ethyl ethoxypropionate)), alkyl 2-alkoxypropionate (for example, methyl 2-alkoxypropionate, ethyl 2-alkoxypropionate, or propyl 2-alkoxypropionate, (for example, methyl 2-methoxypropionate, ethyl 2-methoxypropionate, propyl 2-methoxypropionate, methyl 2-ethoxypropionate, or 2-ethyl ethoxypropionate)), methyl 2-alkoxy-2-methylpropionate, ethyl 2-alkoxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination. In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, ethyl carbitol acetate, butyl carbitol acetate, propylene glycol methyl ether, and propylene glycol methyl ether acetate.

In the present invention, a solvent having a low metal content is preferable. For example, the metal content in the solvent is preferably 10 ppb or lower. Optionally, a solvent having a metal content at a ppt level may be used. For example, such a high-purity solvent is available from Toyo Gosei Co., Ltd.

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent in the composition used in the film forming method according to the present invention is preferably 50 to 95 mass %, more preferably 60 to 90 mass %, and still more preferably 70 to 90 mass % with respect to the total mass of the composition.

<<Polymerizable Compounds>>

It is preferable that the coloring composition used in the film forming method according to the present invention includes a polymerizable compound. As the polymerizable compound, a well-known compound which is curable by a radical, an acid, or heat can be used. Examples of the compound include a compound which has a group having an ethylenically unsaturated bond. Examples of the group having an ethylenically unsaturated bond include a vinyl group, a (meth)allyl group, a (meth)acryloyl group, and a (meth)acryloyloxy group.

It is preferable that the polymerizable compound is a monomer. The molecular weight of the polymerizable compound is preferably 100 to 3000. The upper limit is more preferably 2000 or lower and still more preferably 1500 or lower. The lower limit is more preferably 150 or higher and still more preferably 250 or higher. In addition, the polymerizable compound is preferably a (meth)acrylate compound having 3 to 15 functional groups and more preferably a (meth)acrylate compound having 3 to 6 functional groups.

Examples of the polymerizable compound can be found in paragraphs "0033" and "0034" of JP2013-253224A, the content of which is incorporated herein by reference. As the compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used. In addition, the compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference.

In addition, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfo group, or a phosphate group. Examples of the compound having an acid group include an ester of an aliphatic polyhydroxy compound and an unsaturated carboxylic acid. A compound having an acid group obtained by causing a nonaromatic carboxylic anhydride to react with an unreacted hydroxyl group of an aliphatic polyhydroxy compound is preferable. In particular, it is more preferable that, in this ester, the aliphatic polyhydroxy compound is pentaerythritol and/or dipentaerythritol. Examples of a commercially available product of the monomer having an acid group include M-305, M-510, and M-520 of ARONIX series as polybasic acid-modified acrylic oligomer (manufactured by Toagosei Co., Ltd.). The acid value of the compound having an acid group is preferably 0.1 to 40 mgKOH/g. The lower limit is more preferably 5 mgKOH/g or higher. The upper limit is more preferably 30 mgKOH/g or lower.

In addition, a compound having a caprolactone structure is also preferable as the polymerizable compound. The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having an ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, the compound which has a group having an ethylenically unsaturated bond can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, AI-600, and LIGHT ACRYLATE DCP-A (manufactured by Kyoeisha Chemical Co., Ltd.).

In addition, as the polymerizable compound, an isocyanuric acid ethylene oxide (EO)-modified monomer such as ARONIX M-215, M-313, and M-315 (manufactured by Toagosei Co., Ltd.), SR-368 (manufactured by Sartomer), or A-9300 (manufactured by Shin-Nakamura Chemical Co., Ltd.) can be preferably used.

In a case where the composition used in the film forming method according to the present invention includes a polymerizable compound, the content of the polymerizable compound is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the polymerizable compound, one kind may be used alone, or two or more kinds may be used in combination. In a case where two or more polymerizable compounds are used in combination, it is preferable that the total content of the polymerizable compounds is in the above-described range.

In addition, a mass ratio resin/polymerizable compound of the resin to the polymerizable compound is preferably 0.5 to 15 and more preferably 2 to 10. In a case where the mass ratio of the resin to the polymerizable compound is in the above-described range, the particle size of the dye aggregate in the formed film can be easily adjusted.

<<Photopolymerization Initiator>>

The composition used in the film forming method according to the present invention may include a photopolymerization initiator. In particular, in a case where the composition includes a radically polymerizable component such as a resin having a polymerizable group or a polymerizable compound, it is preferable that the composition includes a photopolymerization initiator. The photopolymerization initiator is not particularly limited and can be appropriately selected from well-known photopolymerization initiators. For example, a photopolymerization initiator having photosensitivity to light in a range from the ultraviolet range to the visible range is preferable. It is preferable that the photopolymerization initiator is a photoradical polymerization initiator. In addition, it is preferable that the photopolymerization initiator is at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon derivative having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A.

In addition, from the viewpoint of exposure sensitivity, a compound selected from the group consisting of a trihalomethyltriazine compound, a benzyldimethylketanol compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine initiator described in JP4225898B can also be used.

As the hydroxyacetophenone initiator, for example, IRGACURE-184, DAROCUR-1173, IRGACURE-500, IRGACURE-2959, or IRGACURE-127 (trade name, all of which are manufactured by BASF SE) can be used. As the aminoacetophenone initiator, IRGACURE-907, IRGACURE-369, or IRGACURE-379EG (trade name, all of which are manufactured by BASF SE) which is a commercially available product can be used.

As the aminoacetophenone initiator, a compound described in JP2009-191179A whose absorption wavelength is adjusted to match with that of a light source having a long wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable. Specific examples of the oxime compound include a compound described in JP2001-233842A, a compound described in JP2000-80068A, and a compound described in JP2006-342166A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluenesulfonyloxy)iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, JP2000-66385A, JP2000-80068A, JP2004-534797A, or JP2006-342166A. As a commercially available product of the oxime compound, IRGACURE-OXE01 (manufactured by BASF SE) and IRGACURE-OXE02 (manufactured by BASF SE) can also be preferably used. In addition, TR-PBG-304 (manufactured by Changzhou Tronly New Electronic Materials Co., Ltd.), and ADEKA ARKLS NCI-930 (manufactured by Adeka Corporation) can also be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-15025A or US2009/292039A in which a nitro group is introduced into a coloring agent site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays, or a compound described in paragraphs "0076" to "0079" of JP2014-137466A may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

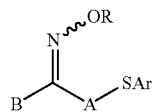

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, an oxime compound having a fluorene ring can also be used as the photopolymerization initiator. Specific examples of the oxime compound having a fluorene ring include a compound described in JP2014-137466A. The content is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, as the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, paragraphs "0007" to 0025" of JP4223071B, and ADEKA ARKLS NCI-831 (manufactured by Adeka Corporation).

Hereinafter, specific examples of the oxime compound which are preferably used in the present invention are shown below, but the present invention is not limited thereto.

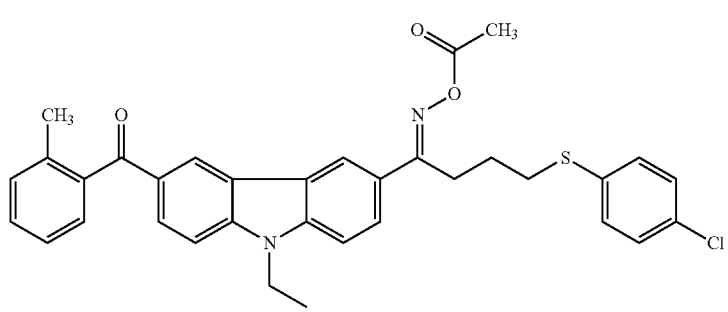

(C-1)

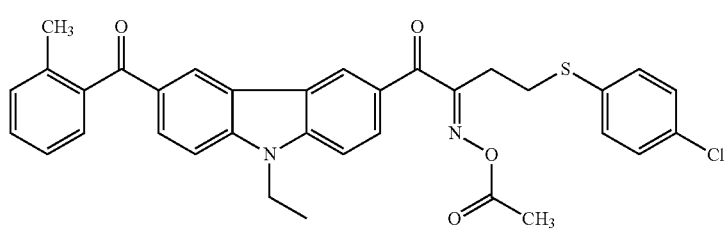

(C-2)

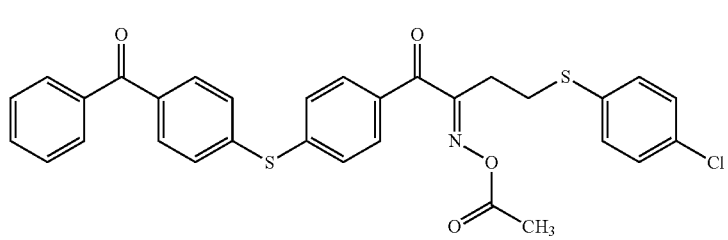

(C-3)

-continued
(C-4)
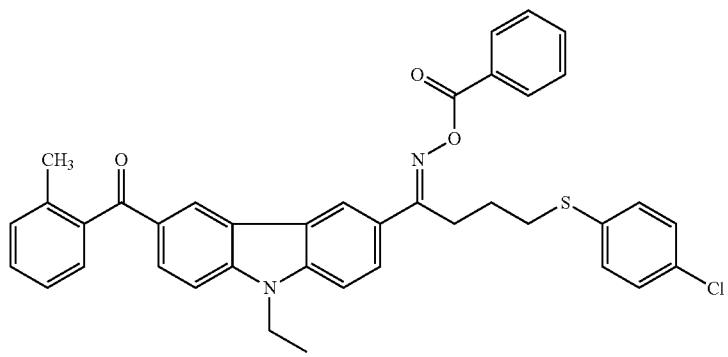
(C-5)
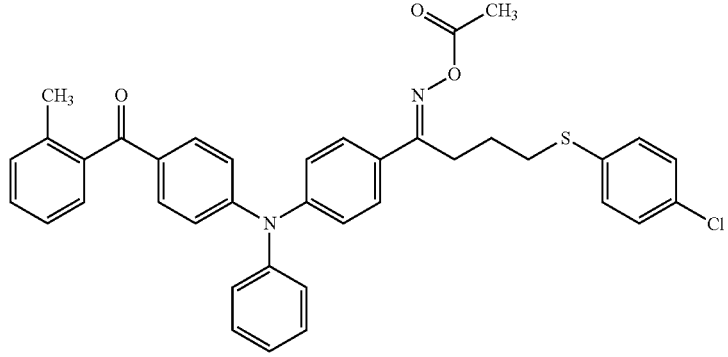
(C-6)
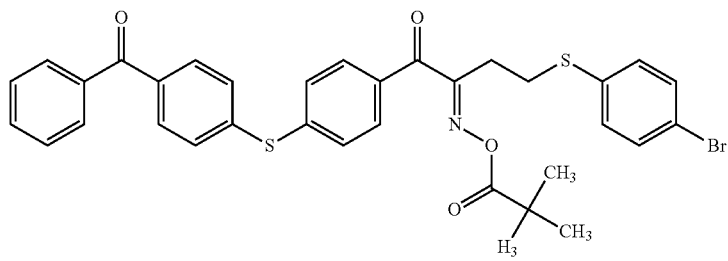
(C-7)
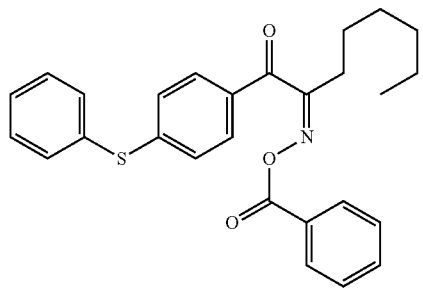
(C-8)
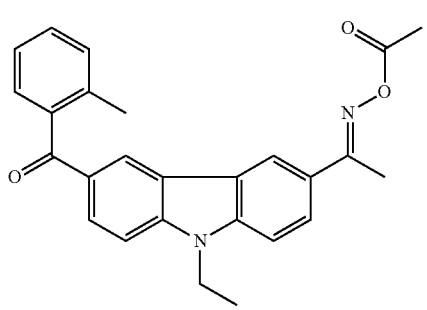
(C-9)
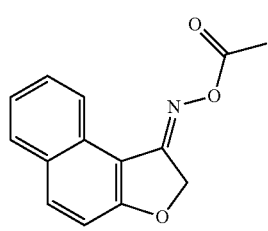
(C-10)
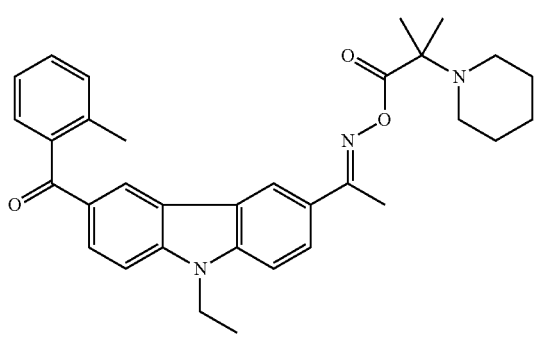

-continued

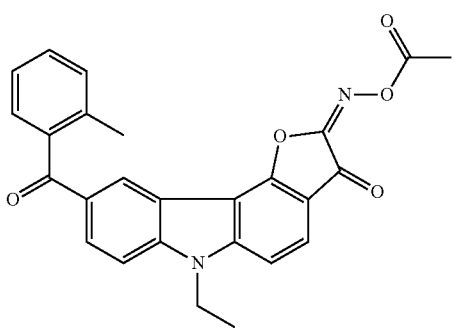
(C-11)

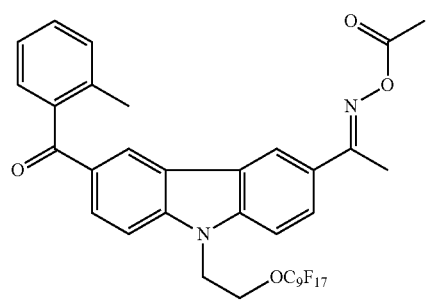
(C-12)

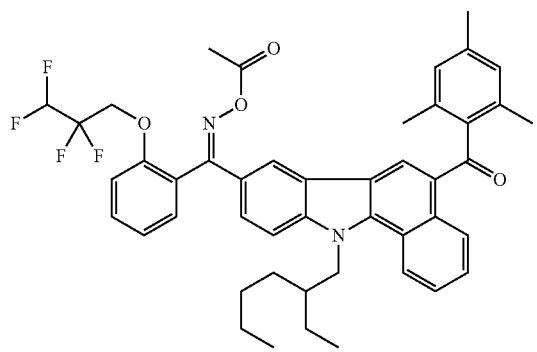
(C-13)

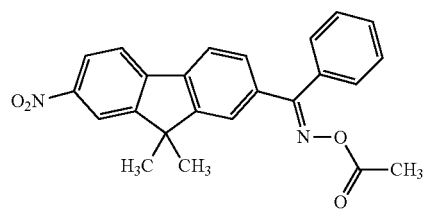
(C-14)

As the oxime compound, a compound having an absorption maximum in a wavelength range of 350 nm to 500 nm is preferable, a compound having an absorption wavelength in a wavelength range of 360 nm to 480 nm is more preferable, and a compound having a high absorbance at 365 nm and 405 nm is still more preferable.

The molar absorption coefficient of the oxime compound at 365 nm or 405 nm is preferably 1000 to 300000, more preferably 2000 to 300000, and still more preferably 5000 to 200000 from the viewpoint of sensitivity. The molar absorption coefficient of the compound can be measured using a well-known method. Specifically, for example, it is preferable that the molar absorption coefficient of the compound is measured using an ultraviolet-visible spectrophotometer (Cary-5 spectrophotometer, manufactured by Varian Medical Systems, Inc.) and an ethyl acetate solvent at a concentration of 0.01 g/L.

It is preferable that an oxime compound and an acetophenone compound are used as the photopolymerization initiator. According to this aspect, a residue after pattern formation can be easily reduced. In a case where the oxime compound and the acetophenone compound are used in combination, the content of the acetophenone compound is preferably 10 to 1000 parts by mass and more preferably 20 to 500 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition used in the film forming method according to the present invention. In the above-described range, excellent sensitivity and pattern formability can be obtained. The composition according to the present invention may include one photopolymerization initiator or two or more photopolymerization initiators. In a case where the composition includes two or more photopolymerization initiators, it is preferable that the total content of the two or more photopolymerization initiators is in the above-described range.

<Curing Accelerator>

A curing accelerator may be added to the composition used in the film forming method according to the present invention in order to promote a reaction of a polymerizable compound or to lower a curing temperature. Examples of the curing accelerator include a polyfunctional thiol compound (polyfunctional mercapto compound) having two or more mercapto groups in a molecule. The polyfunctional thiol compound may be added in order to improve stability, odor, resolution, developability, adhesiveness, and the like. The polyfunctional thiol compound is preferably a secondary alkanethiol and more preferably a compound having a structure represented by the following Formula (T1).

Formula (T1)

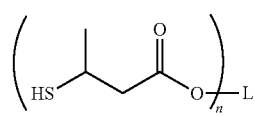

(In Formula (T1), n represents an integer of 2 to 4, and L represents a divalent to tetravalent linking group.)

In Formula (T1), it is preferable that a linking group L is an aliphatic group having 2 to 12 carbon atoms, and it is more preferable that n represents 2 and L represents an alkylene group having 2 to 12 carbon atoms. Specific examples of the polyfunctional thiol compound include compounds represented by the following Structural Formulae (T2) to (T4). Among these, a compound represented by Structural Formula (T2) is preferable. Among these polyfunctional thiol compounds, one kind may be used alone, or two or more kinds may be used in combination.

(T2)
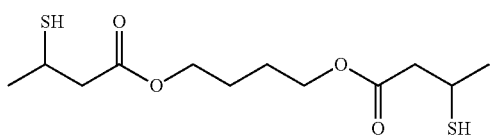

(T3)
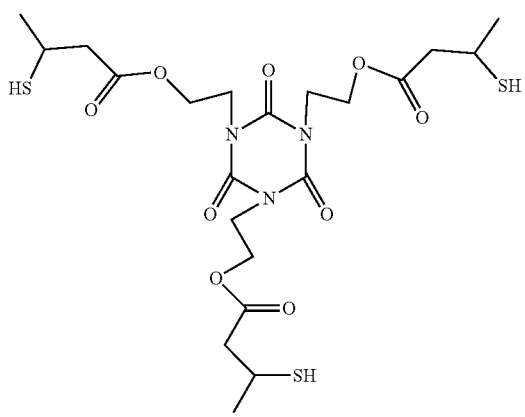

(T4)
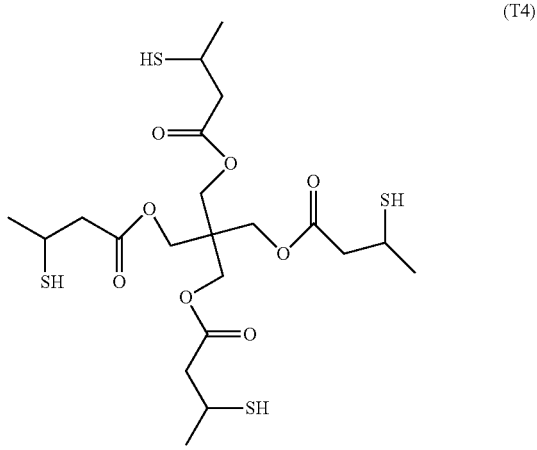

In addition, as the curing accelerator, a methylol compound (for example, a compound described as an example of a crosslinking agent in paragraph "0246" of JP2015-34963A), an amine, a phosphonium, an amidine, or an amide compound (all of which are curing agents described in paragraph "0186" of JP2013-41165A), a base generator (for example, an ionic compound described in JP2014-55114A), a cyanate compound (for example, a compound described in paragraph "0071" of JP2012-150180A), an alkoxysilane compound (for example, an alkoxysilane compound having an epoxy group described in JP2011-253054A), or an onium salt compound (for example, a compound described as an example of an acid generator in paragraph "0216" of JP2015-34963A, or a compound described in JP2009-180949A) can also be used.

The content of the curing accelerator is preferably 0.3 to 8.9 mass % and more preferably 0.8 to 6.4 mass % with respect to the total solid content of the composition used in the film forming method according to the present invention.

<<<Compound Having Epoxy Group>>>

It is also preferable that the coloring composition used in the film forming method according to the present invention includes a compound having an epoxy group.

As the compound having an epoxy group, a compound having two or more epoxy groups in one molecule is preferable. The number of epoxy groups in one molecule is preferably 2 to 10, more preferably 2 to 5, and still more preferably 3.

As the compound having an epoxy group, a compound having a structure in which two benzene rings are linked through a hydrocarbon group can be preferably used. As the hydrocarbon group, an alkylene group having 1 to 6 carbon atoms is preferable.

In addition, it is preferable that the epoxy groups are linked to each other through a linking group. Examples of the linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from —$SO_2$—, —CO—, —O—, and —S—.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecule weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference.

Examples of a commercially available product of the compound having an epoxy group include "EHPE3150" (manufactured by Daicel Corporation) and "EPICLON N660" (manufactured by DIC Corporation).

The content of the compound having an epoxy group is preferably 0.1 to 40 mass % with respect to the total solid content of the composition used in the film forming method according to the present invention. For example, the lower limit is preferably 0.5 mass % or higher and more preferably 1 mass % or higher. For example, the upper limit is more preferably 30 mass % or lower and still more preferably 20 mass % or lower. As the compound having an epoxy group, one kind may be used alone, or two or more kinds may be used in combination. In a case where two or more compounds having an epoxy group are used in combination, it is preferable that the total content of the compounds having an epoxy group is in the above-described range.

<<<Pigment>>>

The composition used in the film forming method according to the present invention may include a pigment. Examples of the pigment include the materials described above regarding the film. The content of the pigment in the composition is preferably 1 to 50 mass % with respect to the total solid content of the composition. The upper limit is more preferably 45 mass % or lower and still more preferably 40 mass % or lower. The lower limit is more preferably 5 mass % or higher and still more preferably 10 mass % or higher.

In addition, the content of the pigment is preferably 1 to 1000 parts by mass and more preferably 10 to 500 parts by mass with respect to 100 parts by mass of the dye. In addition, the composition may also not substantially include the pigment. In the present invention, "substantially not including the pigment" represents that the content of the pigment is preferably 0.1 mass % or lower, more preferably 0.01 mass % or lower, and still more preferably 0% with respect to the total solid content of the composition.

<<<Coloring Material that Shields Visible Light>>>

The composition used in the film forming method according to the present invention may include a coloring material that shields visible light. Examples of the coloring material that shields visible light include the materials described above regarding the film. The content of the coloring material that shields visible light in the composition is preferably 1 to 50 mass % with respect to the total solid content of the composition. The upper limit is more preferably 45 mass % or lower and still more preferably 40 mass % or lower. The lower limit is more preferably 5 mass % or higher and still more preferably 10 mass % or higher.

<<Polymerization Inhibitor>>

The composition used in the film forming method according to the present invention may include a polymerization inhibitor. Examples of the polymerization inhibitor include a phenol hydroxyl group-containing compound, a N-oxide compound, a piperidine-1-oxyl free-radical compound, a pyrrolidine-1-oxyl free-radical compound, a N-nitrosophenylhydroxyamine, a diazonium compound, a cationic dye, a sulfide group-containing compound, a nitro group-containing compound, a phosphorus compound, a lactone compound, and a transition metal compound (for example, $FeCl_3$ or $CuCl_2$). In addition, the compounds may be composite compounds in which a plurality of structures which exhibit a polymerization inhibition function such as a phenol skeleton or a phosphorus-containing skeleton are present in the same molecule. For example, a compound described in JP1998-46035A (JP-H10-46035A) is also preferably used. Specific examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.01 to 5 mass % with respect to the total solid content of the composition used in the film forming method according to the present invention.

<<Surfactant>>

The composition used in the film forming method according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved. That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-41318A (paragraphs "0060" to "0064" of corresponding WO2014/17669) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and PolyFox, PF636, PF656, PF6320, PF6520, and PF7002 (all of which are manufactured by OMNOVA Solutions Inc.).

As the fluorine surfactant, a block polymer can also be used, and specific examples thereof include a compound described in JP2011-89090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

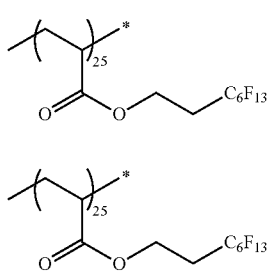 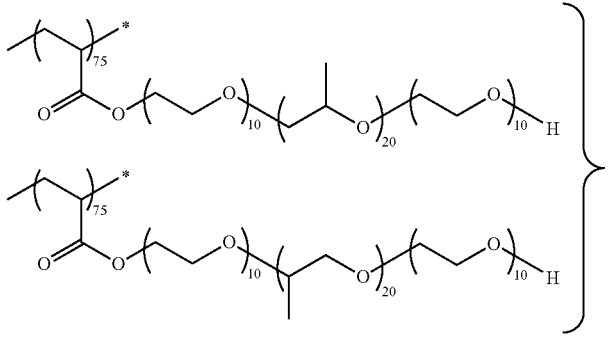

Mixture

The weight-average molecular weight of the compound is preferably 3000 to 50000 and, for example, 14000.

In addition, a fluorine-containing polymer having an ethylenically unsaturated group at a side chain can also be preferably used as the fluorine surfactant. Specific examples include compounds described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Specific examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE)); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co., Ltd.), an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the composition used in the film forming method according to the present invention.

<<Ultraviolet Absorber>>

The composition used in the film forming method according to the present invention may include an ultraviolet absorber. The ultraviolet absorber is preferably a conjugated diene compound and more preferably a compound represented by the following Formula (1).

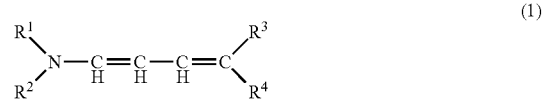

(1)

In Formula (I), $R^1$ and $R^2$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^1$ and $R^2$ may form a cyclic amino group with a nitrogen atom bonded to $R^1$ and $R^2$. Examples of the cyclic amino group include a piperidino group, a morpholino group, a pyrrolidino group, a hexahydroazepino group, and a piperazino group.

$R^1$ and $R^2$ each independently represent preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ represent an electron-withdrawing group. Here, the electron-withdrawing group is a substituent having a Hammett substituent constant $\sigma_p$ value (hereinafter, simply referred to as "$\sigma_p$ value") of 0.20 to 1.0. The electron-withdrawing group is preferably a substituent having a $\sigma_p$ value of 0.30 to 0.8. $R^3$ and $R^4$ may be bonded to each other to form a ring. $R^3$ and $R^4$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

At least one of $R^1, \ldots,$ or $R^4$ may represent a polymer obtained from a monomer which is bonded to a vinyl group through a linking group. At least one of $R^1, \ldots,$ or $R^4$ may represent a copolymer obtained from the above polymer and another monomer. The details of Formula (1) can be found in paragraphs "0148" to "0158" of JP2010-049029A, the content of which is incorporated herein by reference. Specific examples of the compound represented by Formula (1) include a compound described in paragraphs "0160" to "0162" of JP2010-049029A, the content of which is incorporated herein by reference.

Examples of a commercially available product of the ultraviolet absorber include UV503 (manufactured by Daito Chemical Co., Ltd.).

The content of the ultraviolet absorber is preferably 0.01 to 10 mass % and more preferably 0.01 to 5 mass % with respect to the total solid content of the composition used in the film forming method according to the present invention.

<<Silane Coupling Agent>>

The composition used in the film forming method according to the present invention may further include a silane coupling agent in addition to the polymerizable compound. In the present invention, the silane coupling agent is a different component from the polymerizable compound. In the present invention, the silane coupling agent refers to a silane compound having a functional group other than a hydrolyzable group. The hydrolyzable group refers to a substituent directly linked to a silicon atom and capable of forming a siloxane bond due to a hydrolysis reaction and/or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group has a group which interacts with the resin or forms a bond with the resin to exhibit affinity. Examples of the functional group other than a hydrolyzable group include a (meth)acryloyl group, a phenyl group, a mercapto group, an epoxy group, and an oxetanyl group. Among these, a (meth)acryloyl group or an epoxy group is preferable. That is, it is preferable that the silane coupling agent is a compound having an alkoxysilyl group and a (meth)acryloyl group and/or an epoxy group.

Specific examples of the silane coupling agent include γ-methacryloxypropyl trimethoxy silane, γ-methacryloxypropyl triethoxy silane, γ-acryloxy propyl trimethoxy silane, γ-acryloxy propyl triethoxy silane, γ-mercaptopropyl trimethoxysilane, γ-aminopropyl triethoxysilane, phenyl trimethoxysilane, methyl trimethoxysilane, dimethyl dimethoxysilane, methyltriethoxysilane, dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysane, 3-glycidoxypropylmethyldiethoxysilane, 3-glycidoxypropyltriethoxysane, p-styryltrimethoxysilane, 3-methacryloxypropylmethyldimethoxysilane, 3-methacryloxypropyltrimethoxysilane, 3-methacryloxypropylethyldimethoxysilane, 3-methacryloxypropyltriethoxysilane, 3-acryloxypropyltrimethoxysane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatepropyltriethoxysilane. In addition to the above-described examples, an alkoxy oligomer can be used. In addition, the following compounds can also be used.

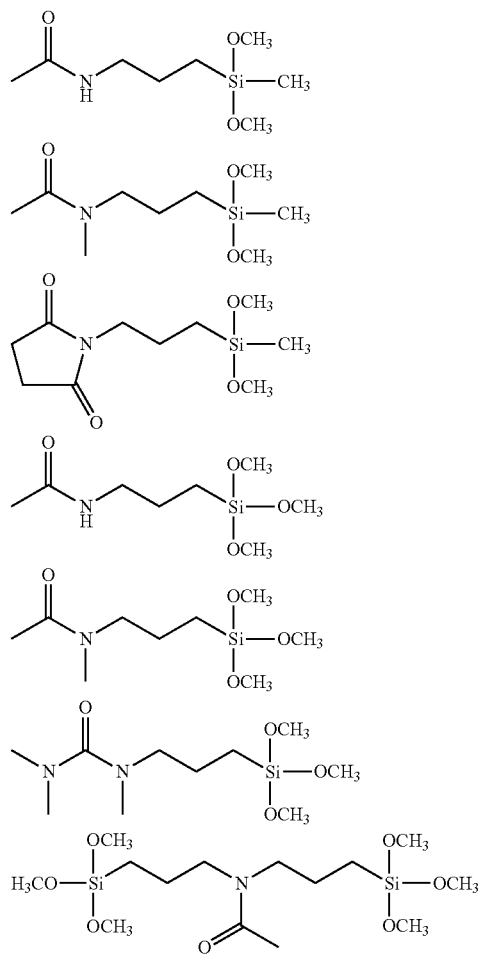

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.). In addition, examples of the silane coupling agent include a compound described in paragraphs "0018" to "0036" of JP2009-288703A and a compound described in paragraphs "0056"

to "0066" of JP2009-242604A, the content of which is incorporated herein by reference.

The content of the silane coupling agent is preferably 0.01 to 15.0 mass % and more preferably 0.05 to 10.0 mass % with respect to the total solid content of the composition used in the film forming method according to the present invention. As the silane coupling agent, one kind may be used alone, or two or more kinds may be used. In a case where two or more silane coupling agents are used in combination, it is preferable that the total content of the two or more silane coupling agents is in the above-described range.

<<Other Components>>

Optionally, the composition used in the film forming method according to the present invention may further include a dispersant, a sensitizer, a curing accelerator, a filler, a thermal curing accelerator, a thermal polymerization inhibitor, a plasticizer, an adhesion accelerator, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the infrared absorbing composition appropriately including the components, desired stability, film properties, and the like of an optical filter such as a near infrared cut filter can be adjusted. The details of the components can be found in, for example, paragraph "0183" of JP2012-003225A (corresponding to "0237" of US2013/0034812A) and paragraphs "0101" to "0104" and "0107" to "0109" of JP2008-250074A, the content of which is incorporated herein by reference. In addition, examples of the antioxidant include a phenol compound, a phosphite compound, and a thioether compound. A phenol compound having a molecular weight of 500 or higher, a phosphite compound having a molecular weight of 500 or higher, or a thioether compound having a molecular weight of 500 or higher is more preferable. Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho position) adjacent to a phenolic hydroxyl group is preferable. As the substituent, a substituted or unsubstituted alkyl group having 1 to 22 carbon atoms is preferable, and a methyl group, an ethyl group, a propyl group, an isopropyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. In addition, a compound (antioxidant) having a phenol group and a phosphite group in the same molecule is also preferable. In addition, as the antioxidant, a phosphorus antioxidant can also be preferably used. Examples of the phosphorus antioxidant include tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl)phosphite. The phosphorus antioxidant is easily commercially available, and examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the total solid content of the composition used in the film forming method according to the present invention. As the antioxidant, one kind may be used alone, or two or more kinds may be used. In a case where two or more antioxidants are used in combination, it is preferable that the total content of the two or more antioxidants is in the above-described range.

(Method of Preparing Composition)

The composition used in the film forming method according to the present invention can be prepared by mixing the above-described components with each other.

During the preparation of the composition, the respective components may be mixed with each other collectively, or may be mixed with each other sequentially after dissolved and/or dispersed in a solvent. In addition, during mixing, the order of addition or working conditions are not particularly limited. For example, all the components may be dissolved and/or dispersed in a solvent at the same time to prepare the composition. Optionally, two or more solutions or dispersions may be appropriately prepared using the respective components, and the solutions or dispersions may be mixed with each other during use (during application) to prepare the composition.

During the preparation of the composition, it is preferable that the composition is filtered through a filter, for example, in order to remove foreign matter or to reduce defects. As a material of the filter, any material which is used in the related art for filtering or the like can be used without any particular limitation. Examples of the filter include filters formed of the following materials including: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including polypropylene having a high density and an ultrahigh molecular weight) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter, which inhibits manufacturing of a uniform composition or formation of a smooth film in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

<Film Forming Method According to Present Invention>

Next, the film forming method according to the present invention will be described.

The film forming method according to the present invention includes:

a step of applying a composition including a dye, a resin, and a solvent to a support to form a composition layer on the support; and a step of causing the dye included in the composition layer to aggregate.

(Step of Forming Composition Layer)

First, a composition layer is formed on a support using a composition. The support is not particularly limited, and can be appropriately selected according to the use. Examples of the support include non-alkali glass, soda glass, PYREX (registered trade name) glass, or quartz glass which is used in a liquid crystal display device; a substrate obtained by attaching a transparent conductive film to the above-described substrate; and a complementary metal-oxide semiconductor (CMOS) such as a photoelectric conversion substrate or a silicon substrate used for a solid image pickup element. In addition, optionally, an undercoat layer may be provided on the support to improve adhesion with a layer above the support, to prevent diffusion of materials, or to make a surface flat.

As a method of applying the composition to the support, various methods such as slit coating, an ink jet method, spin coating, cast coating, roll coating, or screen printing can be used.

(Step of Causing Dye to Aggregate)

Next, the dye included in the composition layer formed on the support is caused to aggregate. It is preferable that the dye is caused to aggregate under conditions where the average particle size of the dye aggregate included in the film is 30 to 450 nm. A method of causing the dye to aggregate is not particularly limited. Examples of the method include a heat treatment, a vacuum treatment, and a spin treatment. By performing the above-described treatment, the solvent is removed from the composition layer. At this time, dye molecules aggregate. The heating treatment is preferable because the average particle size of the dye aggregate can be easily adjusted.

It is preferable that the heat treatment is performed at a temperature of 60° C. to 150° C. for 5 to 300 seconds. The lower limit of the heating temperature is more preferably 70° C. or higher and still more preferably 80° C. or higher. The upper limit is more preferably 140° C. or lower and still more preferably 130° C. or lower. The lower limit of the heating time is more preferably 10 seconds or longer and still more preferably 20 seconds or longer. The upper limit is more preferably 240 seconds or shorter and still more preferably 180 seconds or shorter.

In addition, the heat treatment may be performed at a temperature of 40° C. to 50° C. for 0.5 to 2 hours (preferably 0.5 to 1.5 hours).

In addition, it is also preferable that the heat treatment is performed at a temperature which is higher than the glass transition temperature of the resin included in the composition by 20° C. to 80° C. (preferably by 25° C. to 75° C. and more preferably 20° C. to 70° C.). According to this aspect, the aggregation of the dye can be appropriately progressed, and the average particle size of the dye can be easily adjusted to be 30 to 450 nm. In this case, the heating time is preferably 10 seconds or longer and more preferably 20 seconds or longer. The upper limit is preferably 240 seconds or shorter and more preferably 180 seconds or shorter.

It is preferable that the vacuum treatment is performed at a vacuum degree of 0.1 to 1.0 kPa at a temperature of 10° C. to 50° C. for 0.5 to 2 hours. The upper limit of the vacuum degree is more preferably 0.5 kPa or lower. The lower limit of the treatment temperature is more preferably 15° C. or higher and still more preferably 20° C. or higher. The upper limit is more preferably 45° C. or lower and still more preferably 40° C. or lower. The lower limit of the treatment time is more preferably 1 hour or longer. The upper limit is more preferably 1.5 hours or shorter.

It is preferable that the spin treatment is performed at a rotation speed of 1000 to 3000 rpm for 10 to 150 seconds. The lower limit of the rotation speed is more preferably 2000 rpm or higher. The lower limit of the treatment time is more preferably 20 seconds or longer. The upper limit is more preferably 120 seconds or shorter and still more preferably 60 seconds or shorter.

(Exposure Step)

In a case where a composition including a photopolymerization initiator and at least one radically polymerizable component selected from the group consisting of a resin having a polymerizable group and a polymerizable compound other than the resin is used in the film forming method according to the present invention, it is preferable that the film forming method further includes a step of exposing the composition layer after the step of causing the dye included in the composition layer to aggregate. According to this aspect, the dye aggregate included in the composition layer is fixed to the film by the exposure, and the average particle size of the dye aggregate included in the obtained film can be easily adjusted to be in the above-described range.

As radiation (light) used during the exposure, ultraviolet rays such as g-rays or i-rays are preferably used, and i-rays are more preferably used. The irradiation dose (exposure dose) is preferably 0.03 to 2.5 $J/cm^2$, and more preferably 0.05 to 1.0 $J/cm^2$.

The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 $W/m^2$ to 100000 $W/m^2$ (for example, 5000 $W/m^2$, 15000 $W/m^2$, or 35000 $W/m^2$). Conditions of the oxygen concentration and conditions of the exposure illuminance may be appropriately combined. For example, conditions are oxygen concentration: 10 vol % and illuminance: 10000 $W/m^2$, or oxygen concentration: 35 vol % and illuminance: 20000 $W/m^2$.

The film forming method according to the present invention may further include a step of forming a pattern. The step of forming a pattern may be a step of forming a pattern using a photolithography method or a step of forming a pattern using a dry etching method.

It is preferable that the pattern formation using the photolithography method includes: a step of forming a composition layer on a support using a composition; a step of exposing the composition layer in a pattern shape; and a step of forming a pattern by removing a non-exposed portion by development. Optionally, the pattern formation further includes: a step (pre-baking step) of baking the composition layer; and a step (post-baking step) of baking the developed pattern.

In addition, It is preferable that the pattern formation using the dry etching method includes: a step of forming a composition layer on a support using a composition and curing the cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

(Case where Pattern is Formed Using Photolithography Method)

In a case where a pattern is formed using a photolithography method, the composition layer having undergone the step of causing the dye to aggregate is exposed in a pattern shape (exposure step). For example, the composition layer is exposed in a pattern shape using an exposure device such as a stepper through a mask having a predetermined mask pattern, thereby exposing a pattern. As a result, an exposed portion can be cured. Examples of exposure conditions include the above-described exposure conditions.

Next, a pattern is formed by removing a non-exposed portion by development. The non-exposed portion can be removed by development using a developer. As a result, a non-exposed portion of the composition layer in the exposure step is eluted into the developer, and only the photo-cured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, 1,8-di azabicyclo-[5.4.0]-7-undec ene, or dimethyl bis(2-hydroxyethyl)ammonium hydroxide. As the developer, an alkaline aqueous solution is preferably used in which the above alkaline agent is diluted with pure water such that a concentration thereof is 0.001 to 10 mass % and preferably 0.01 to 1 mass %.

In addition, an inorganic alkali may be used as the developer. Preferable examples of the inorganic alkali include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the composition. Among these, a nonionic surfactant is preferable.

In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher.

The film after the development is post-baked continuously or batchwise using heating means such as a hot plate, a convection oven (hot air circulation dryer), and a high-frequency heater under the above-described conditions. In addition, in a case where a pattern is formed through a low-temperature process, post-baking is not necessarily performed.

(Case where Pattern is Formed Using Dry Etching Method)

The pattern formation using the dry etching method can be performed by curing the composition layer formed on the support to form a cured composition layer, forming a photoresist layer on the cured composition layer, patterning the photoresist layer to form a mask, and dry-etching the cured composition layer with etching gas by using the patterned photoresist layer as a mask.

As a method of forming the photoresist layer, a method of applying a positive type or negative type radiation sensitive composition to the cured composition layer and drying the positive type or negative type radiation sensitive composition is preferable. It is preferable that pre-baking is further performed in order to form the photoresist layer. In particular, in a preferable aspect, as a process of forming the photoresist, baking after exposure or baking after development (post-baking) is performed.

As the photoresist layer, a positive type radiation sensitive composition, which is reactive with radiation including ultraviolet rays (g-rays, h-rays, i-rays), far ultraviolet rays such as excimer laser, electron beams, ion beams, and X-rays, is preferably used. Among the radiations, g-rays, h-rays, or i-rays are preferable, and i-rays are more preferable.

Specifically, as the positive type radiation sensitive composition, a composition including a quinonediazide compound and an alkali-soluble resin is preferable. The positive type radiation sensitive composition including a quinonediazide compound and an alkali-soluble resin uses a configuration in which a quinonediazide group is decomposed into a carboxyl group by irradiation of light having a wavelength of 500 nm or shorter such that the state of the composition is converted from alkali-insoluble to alkali-soluble. The positive type photoresist has significantly high resolution and thus is used to prepare an integrated circuit such as an integrated circuit (IC) or a large scale integration (LSI). Examples of the quinonediazide compound include a naphthoquinonediazide compound. Examples of a commercially available product of the quinonediazide compound include "FHi622BC" (manufactured by Fujifilm Electronic Materials Co., Ltd.).

The thickness of the photoresist layer is preferably 0.1 to 3 more preferably 0.2 to 2.5 μm, and still more preferably 0.3 to 2 As a method of applying the positive type radiation sensitive composition, the above-described methods of applying the composition is preferable.

Next, by exposing and developing the photoresist layer, a resist pattern (patterned photoresist layer) including a group of resist through-holes is formed. The formation of the resist pattern is not particularly limited and can be appropriately optimized and performed using a well-known photolithography technique of the related art. By providing the group of resist through-holes in the photoresist layer by exposure and development, a resist pattern used as an etching mask in the next etching is provided on the cured composition layer.

The exposure of the photoresist layer can be performed by exposing the positive type or negative type radiation sensitive composition with g-rays, h-rays, i-rays, or the like (preferably i-rays) through a predetermined mask pattern. By performing development using a developer after exposure, a photoresist is removed from a region where a color pattern is desired to be formed.

As the developer, any developer can be used as long as it has no effect on a cured composition layer including a colorant and an exposed portion of a positive resist and a non-cured portion of a negative resist are soluble therein. For example, a combination of various solvents or an alkaline aqueous solution can be used. It is preferable that the alkaline aqueous solution is prepared by dissolving an alkaline compound such that the concentration thereof is 0.001 to 10 mass % and preferably 0.01 to 5 mass %. Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, 1,8-diazabicyclo[5.4.0]-7-undecene, and dimethyl bis(2-hydroxyethyl)ammonium hydroxide. In a case where an alkaline aqueous solution is used, in general, a rinsing treatment using water is performed after development.

Next, patterning is performed by dry-etching the cured composition layer using the resist pattern as an etching mask so as to form a group of through-holes in the cured composition layer.

From the viewpoint of forming a pattern cross-section in a substantially rectangular shape or the viewpoint of further reducing damages to the support, it is preferable that dry etching is performed according to the following embodiment.

In the preferable embodiment, first etching, second etching, and over etching is performed. In the first etching, etching is performed using a mixed gas of fluorine gas and oxygen gas ($O_2$) up to a region (depth) where the support is not exposed. In the second etching, after the first etching, etching is performed using a mixed gas of nitrogen gas ($N_2$) and oxygen gas ($O_2$) preferably up to a region (depth) where the support is exposed. In the over etching, etching is performed after the support is exposed. Hereinafter, a specific method of dry etching, the first etching, the second etching, and the over etching will be described.

The dry etching is performed after obtaining etching conditions in advance using the following method.

(1) An etching rate (nm/min) in the first etching, and an etching rate (nm/min) in the second etching are calculated, respectively.

(2) A time required to perform etching up to a desired thickness in the first etching, and a time required to perform etching up to a desired thickness in the second etching are calculated, respectively.

(3) The first etching is performed for the etching time calculated in (2).

(4) The second etching is performed for the etching time calculated in (2). Alternatively, an etching time may be determined based on a detected end point, and the second etching may be performed for the determined etching time.

(5) An over etching time is calculated in consideration of the total etching time of (3) and (4), and the over etching is performed for the calculated over etching time.

From the viewpoint of processing an organic material, which is a film to be etched, in a rectangular shape, it is preferable that a mixed gas used in the first etching step includes fluorine gas and oxygen gas ($O_2$). In addition, by performing etching up to a region where the support is not exposed in the first etching step, damages to the support can be avoided. In addition, after etching is performed using a mixed gas of fluorine gas and oxygen gas up to a region where the support is not exposed in the first etching step, in second etching step and the over etching step, it is preferable that etching is performed using a mixed gas of nitrogen gas and oxygen gas from the viewpoint of avoiding damages to the support.

It is important to determine a ratio between the etching amount in the first etching step and the etching amount in the second etching step such that the rectangularity obtained by etching in the first etching step does not deteriorate. A latter ratio in the total etching amount (the sum of the etching amount in the first etching step and the etching amount in the second etching step) is preferably higher than 0% and 50% or lower and more preferably 10% to 20%. The etching amount refers to a value which is calculated from a difference between the thickness of a film to be etched before etching and the thickness of the film remaining after etching.

In addition, it is preferable that the etching includes over etching. It is preferable that the over etching is performed after setting an over etching ratio. In addition, it is preferable that the over etching ratio is calculated based on a first etching time. The over etching ratio can be set to a given value and is preferably 30% or lower, more preferably 5 to 25%, and still more preferably 10 to 15% with respect to the total etching time of the etching process from the viewpoints of obtaining etching resistance of a photoresist and maintaining rectangularity of an etched pattern.

Next, the resist pattern (that is, the etching mask) remaining after etching is removed. It is preferable that the removal of the resist pattern includes: a step of applying a peeling solution or a solvent to the resist pattern such that the resist pattern can be removed; and a step of removing the resist pattern using rinse water.

Examples of the step applying a peeling solution or a solvent to the resist pattern such that the resist pattern can be removed include a step of applying a peeling solution or a solvent to the resist pattern and holding the peeling solution and the solvent for a predetermined time to perform puddle development. The time for which the peeling solution or the solvent is held is not particularly limited and is preferably several tens of seconds to several minutes.

In addition, examples of the step of removing the resist pattern using rinse water include a step of spraying rinse water to the resist pattern through a spray type or shower type spray nozzle to remove the resist pattern. As the rinse water, pure water is preferably used. In addition, examples of the spray nozzle include: a spray nozzle in which a spraying range includes the entire region of the support; and a movable spray nozzle in which a movable range includes the entire region of the support. In a case where the spray nozzle is movable, the nozzle moves twice or more in a region from the center of the support to end portions of the support to spray rinse water during the step of removing the resist pattern. As a result, the resist pattern can be more effectively removed.

In general, the peeling solution may further include an organic solvent or an inorganic solvent. Examples of the organic solvent include (1) a hydrocarbon compound, (2) a halogenated hydrocarbon compound, (3) an alcohol compound, (4) an ether or acetal compound, (5) a ketone or aldehyde compound, (6) an ester compound, (7) a polyhydric alcohol compound, (8), a carboxylic acid or acid anhydride compound, (9) a phenol compound, (10) a nitrogen-containing compound, (11) a sulfur-containing compound, and (12) a fluorine-containing compound. It is preferable that the peeling solution includes a nitrogen-containing compound, and it is more preferable that the peeling solution includes an acyclic nitrogen-containing compound and a cyclic nitrogen-containing compound.

It is preferable that the acyclic nitrogen-containing compound is an acyclic nitrogen-containing compound having a hydroxyl group. Specific examples of the acyclic nitrogen-containing compound having a hydroxyl group include monoisopropanolamine, diisopropanolamine, triisopropanolamine, N-ethylethanolamine, N,N-dibutylethanolamine, N-butylethanolamine, monoethanolamine, diethanolamine, and triethanolamine. Among these, monoethanolamine, diethanolamine, or triethanolamine is preferable, and monoethanolamine ($H_2NCH_2CH_2OH$) is more preferable. In addition, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-picoline, 3-picoline, 4-picoline, piperazine, piperidine, pyrazine, pyridine, pyrrolidine, N-methyl-2-pyrrolidone, N-phenylmorpholine, 2,4-lutidine, and 2,6-lutidine. Among these, N-methyl-2-pyrrolidone or N-ethylmorpholine is preferable, and N-methyl-2-pyrrolidone (NMP) is more preferable.

It is preferable that the peeling solution includes an acyclic nitrogen-containing compound and a cyclic nitrogen-containing compound. It is more preferable that the peeling solution includes, as an acyclic nitrogen-containing compound, at least one selected from the group consisting of monoethanolamine, diethanolamine, and triethanolamine and includes, as a cyclic nitrogen-containing compound, at least one cyclic nitrogen-containing compound selected from N-methyl-2-pyrrolidone and N-ethylmorpholine. It is still more preferable that the peeling solution includes monoethanolamine and N-methyl-2-pyrrolidone.

In a case where the peeling solution is removed, the resist pattern formed on the pattern only has to be removed. Even in a case where a deposit as an etching product is attached to a side wall of the pattern, it is not necessary to completely remove the deposit. The deposit refers to an etching product which is attached and deposited to a side wall of the cured composition layer.

In the peeling solution, the content of the acyclic nitrogen-containing compound is preferably 9 parts by mass to 11 parts by mass with respect to 100 parts by mass of the peeling solution, and the content of the cyclic nitrogen-containing compound is preferably 65 parts by mass to 70 parts by mass with respect to 100 parts by mass of the peeling solution. In addition, it is preferable that the peeling solution is obtained by diluting a mixture of the acyclic nitrogen-containing compound and the cyclic nitrogen-containing compound with pure water.

<Optical Filter>

Next, an optical filter according to the present invention will be described. The optical filter according to the present invention includes the film according to the present invention. The optical filter according to the present invention can be preferably used as at least one selected from the group consisting of a color filter, an infrared cut filter, and an infrared transmitting filter. The optical filter according to the present invention may be a film having a pattern or a film (flat film) not having a pattern. In addition, the optical filter according to the present invention may be used in a state where it is laminated on a support, or may be used after peeling off the film from a support. In the present invention, "infrared cut filter" refers to a filter that allows transmission of light (visible light) in the visible range and shields light (infrared light) in the infrared range. The infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, "infrared transmitting filter" refers to a filter that shields light (visible light) in the visible range and allows transmission of at least a part of light (infrared light) in the infrared range. In addition, in the present invention, "color filter" refers to a filter that allows transmission of light in a specific wavelength range of the visible range and shields light in another specific wavelength range of the visible range.

In a case where the optical filter according to the present invention is used as an infrared cut filter, the optical filter may further include, for example, an antireflection film or an ultraviolet absorbing film in addition to the film according to the present invention.

The details of the ultraviolet absorbing film can be found in the description of an absorbing layer described in paragraphs "0040" to "0070" and paragraphs "0119" to "0145" of WO2015/099060, the content of which is incorporated herein by reference.

Examples of the antireflection film include a laminate (for example, a dielectric multi-layer film) in which a high refractive index layer and a low refractive index layer are alternately laminated. The spectral characteristics of the antireflection film can be appropriately selected depending on the wavelength of a light source, the spectral characteristics of the optical filter, and the like. By using the film according to the present invention and the antireflection film in combination, a wide range of infrared light can also be shielded. The details of the antireflection film can be found in paragraphs "0255" to "0259" of JP2014-41318A, the content of which is incorporated herein by reference.

The optical filter according to the present invention can be used in various devices including a solid image pickup element such as a charge coupled device (CCD) or a complementary metal-oxide semiconductor (CMOS), an infrared sensor, or an image display device. In addition, the film according to the present invention can be used, for example, as a lens that has a function to absorb or cut near infrared light (a camera lens for a digital camera, a mobile phone, or a vehicle-mounted camera, or an optical lens such as an f-θ lens or a pickup lens), an optical filter for a semiconductor light receiving element, a near infrared absorbing film or a near infrared absorbing plate that shields heat rays for energy saving, an agricultural coating agent for selective use of sunlight, a recording medium using heat absorbed from near infrared light, a near infrared light for an electronic apparatus or a picture, an eye protector, sunglasses, a heat ray shielding filter, a filter for reading and recording an optical character, a filter for preventing classified documents from being copied, an electrophotographic photoreceptor, or a filter for laser welding. In addition, the near infrared cut filter according to the present invention is also useful as a noise cut filter for a CCD camera or a filter for a CMOS image sensor.

In addition, it is also preferable that the optical filter according to the present invention includes a pixel which is formed using the film (preferably, a film including a coloring material that shields visible light) according to the present invention and a pixel selected from the group consisting of a red pixel, a green pixel, a blue pixel, a magenta pixel, a yellow pixel, a cyan pixel, a black pixel, and an achromatic pixel.

<Laminate>

In addition, a laminate according to the present invention includes: the film according to the present invention; and a color filter that includes a chromatic colorant. In the laminate according to the present invention, the film according to the present invention and the color filter may be or may not be adjacent to the color filter in the thickness direction. In a case where the film according to the present invention is not adjacent to the color filter in the thickness direction, the film according to the present invention may be formed on another substrate other than a substrate on which the color filter is formed, or another member (for example, a microlens or a planarizing layer) constituting a solid image pickup element may be interposed between the film according to the present invention and the color filter.

<Solid Image Pickup Element>

A solid image pickup element according to the present invention includes the film according to the present invention. The solid image pickup element according to the present invention is configured to include the film according to the present invention. The configuration of the solid image pickup element is not particularly limited as long as the solid image pickup element functions. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the color filter, the infrared cut filter, or the like is formed on the device protective film.

Further, a configuration in which light collecting means (for example, a microlens; hereinafter, the same shall be applied) is provided above the device protective film and below the color filter or the infrared cut filter (on a side thereof close the support), or a configuration in which light collecting means is provided on the color filter or the infrared cut filter may be adopted. In addition, the color filter may have a structure in which a cured film which forms each color pixel is embedded in a space which is partitioned in, for example, a lattice shape by a partition wall. In this case, it is preferable that the partition wall has a low refractive index with respect to each color pixel. Examples of an imaging device having such a structure include a device described in JP2012-227478A and JP2014-179577A.

<Image Display Device>

The film according to the present invention can also be used in an image display device such as a liquid crystal display device or an organic electroluminescence (organic EL) display device. For example, by using the film according to the present invention in combination with the respective colored pixels (for example, red, green, blue), the infrared cut filter can be used in order to shield infrared light included in light emitted from a backlight (for example, a white light emitting diode (white LED)) of an image display device to prevent a malfunction of a peripheral device. In addition, the film according to the present invention can also be used in order to form an infrared pixel in addition to the colored pixels.

The definition of the image display device and the details of each image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326 to 328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 to 485 nm), a green range (530 to 580 nm), and a yellow range (580 to 620 nm). It is more preferable that the spectrum has a maximum emission peak in a red range (650 nm to 700 nm) in addition to the above-described emission peaks.

<Infrared Sensor>

An infrared sensor according to the present invention includes the film according to the present invention. The configuration of the infrared sensor according to the present invention is not particularly limited as long as it includes the film according to the present invention and functions as an infrared sensor.

Hereinafter, an embodiment of the infrared sensor according to the present invention will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 111. Microlenses 115 are disposed on an incidence ray hv side of the color filters 112 and the infrared transmitting filters 114. A planarizing layer 116 is formed so as to cover the microlenses 115.

Characteristics of the infrared cut filters 111 can be selected depending on the emission wavelength of an infrared light emitting diode (infrared LED) described below.

For example, it is preferable that the infrared cut filters 111 is a filter that allows transmission of visible light (for example, light in a wavelength range of 400 to 650 nm) and shields at least a part of light in a wavelength range of longer than 700 nm (preferably at least a part of light in a wavelength range of 700 to 1300 nm and more preferably at least a part of light in a wavelength range of 700 to 1000 nm). The infrared cut filter 111 can be formed using, for example, the film according to the present invention.

The color filters 112 is not particularly limited as long as pixels which allow transmission of light having a specific wavelength in the visible range and absorbs the light are formed therein, and well-known color filters of the related art for forming an image can be used. For example, pixels of red (R), green (G), and blue (B) are formed in the color filters. For example, the details of the color filters can be found in paragraphs "0214" to "0263" of JP2014-043556A, the content of which is incorporated herein by reference. In addition, the color filter can also be formed using the film according to the present invention.

Characteristics of the infrared transmitting filters 114 can be selected depending on the emission wavelength of the infrared LED described below.

For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm. The maximum value of the light transmittance in a wavelength range of 400 to 650 nm is typically 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 µM or less, more preferably 15 µm or less, still more preferably 5 µm or less, and even still more preferably 1 or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

The infrared transmitting filter 114 having the above-described spectral characteristics can be formed using a composition including the coloring material that shields visible light. The details of the coloring material that shields visible light are the same as the range described above regarding the composition according to the present invention. In addition, the infrared transmitting filter 114 can also be formed using the film according to the present invention.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a composition including the coloring material that shields visible light and a near infrared absorbing compound having an absorption maximum in a wavelength range of 750 to 950 nm. The details of the coloring material that shields visible light are the same as the range described above regarding the composition according to the present invention. Examples of the near infrared absorbing compound include the dye having an absorption in a near infrared range described above regarding the composition according to the present invention. In addition, the infrared transmitting filter 114 can also be formed using the film according to the present invention.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %". In addition, PGMEA is an abbreviation for propylene glycol monomethyl ether acetate.

<Measurement of Weight-Average Molecular Weight (Mw) and Number-Average Molecular Weight (Mn)>

The weight-average molecular weight (Mw) and the number-average molecular weight (Mn) were measured using the following method.

Kind of Column: TSKgel Super HZ4000 (manufactured by Tosoh Corporation, 4.6 mm (Inner diameter)×15 cm)

Developing solvent: tetrahydrofuran

Column temperature: 40° C.

Flow rate (sample injection volume): 60 µL

Device name: High-Speed GPC (HLC-8220GPC), manufactured by Tosoh Corporation

Calibration curve base resin: polystyrene

<Glass Transition Temperature of Resin>

The glass transition temperature of the resin is a theoretical value obtained from the following expression.

$$1/Tg = (W1/Tg1) + (W2/Tg2) + \ldots + (Wn/Tgn)$$

In the expression, Tg represents the glass transition temperature (unit: K) of the resin, Tgi represents a glass transition temperature (unit: K) of a homopolymer of a monomer i, and Wi represents a mass fraction of the monomer i in the all the monomer components (i=1, 2, . . . , and n). The expression is a calculation expression for a case where the resin is formed of n kinds of monomer components including a monomer 1, a monomer 2, . . . , and a monomer n.

<Measurement of Average Particle Size of Dye Aggregate>

The film surface was observed (magnification: 30000 times) using a scanning electron microscope (SEM) (S-4800, manufactured by Hitachi High-Technologies Corporation). Particle sizes of 50 aggregates were measured, and an average value thereof was obtained as the average particle size of the aggregate.

<Preparation of Composition>

Respective materials were mixed at a ratio shown in the following formula and stirred, and the obtained mixture was filtered through a nylon filter (manufactured by Pall Corporation) having a pore size of 0.45 µm to prepare a composition.

(Formula 1)
Dye: a dye shown in the following table 3.36 parts
Resin: a resin shown in the following table 9.82 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 2)
Dye: a dye shown in the following table 3.36 parts
Resin: a resin shown in the following table 6.86 parts
Polymerizable compound: KAYARAD DPHA (manufactured by Nippon Kayaku Co., Ltd.) 1.41 parts
Photopolymerization initiator: initiator 1 (compound having the following structure) 1.55 parts

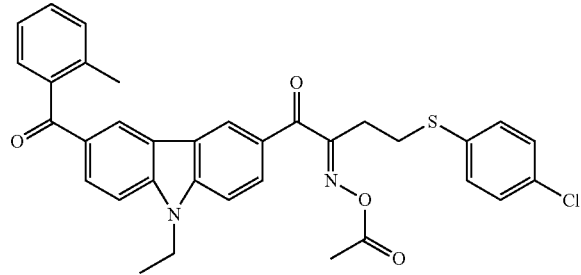 [SMILES: CCn1c2ccc(C(=O)/C(CCSc3ccc(Cl)cc3)=N/OC(C)=O)cc2c2cc(C(=O)c3ccccc3C)ccc21]

Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 3)
Dye: a dye shown in the following table 3.36 parts
Resin: a resin shown in the following table 3.17 parts
Polymerizable compound: KAYARAD DPHA (manufactured by Nippon Kayaku Co., Ltd.) 3.17 parts
Photopolymerization initiator: initiator 1 3.48 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 4)
Dye: a dye shown in the following table 3.36 parts
Resin: a resin shown in the following table 5.78 parts
Polymerizable compound: KAYARAD DPHA (manufactured by Nippon Kayaku Co., Ltd.) 1.93 parts
Photopolymerization initiator: initiator 1 2.12 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 5)
Dye: a dye shown in the following table 3.36 parts
Resin: a resin shown in the following table 8.12 parts
Polymerizable compound: KAYARAD DPHA (manufactured by Nippon Kayaku Co., Ltd.) 0.81 parts
Photopolymerization initiator: initiator 1 0.89 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 6)
Dye: a dye shown in the following table 3.36 parts
Resin: a resin shown in the following table 8.37 parts
Polymerizable compound: KAYARAD DPHA (manufactured by Nippon Kayaku Co., Ltd.) 0.70 parts
Photopolymerization initiator: initiator 1 0.77 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 7)
Dye: a dye shown in the following table 3.36 parts
Polymerizable compound: KAYARAD DPHA (manufactured by Nippon Kayaku Co., Ltd.) 9.82 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 8)
Dye: a dye shown in the following table 3.36 parts
Resin: a resin shown in the following table 6.86 parts
Polymerizable compound: M-313 (manufactured by Toagosei Co., Ltd.) 1.41 parts
Photopolymerization initiator: initiator 1 1.55 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclohexanone 84.11 parts
(Formula 9)
Dye: a dye shown in the following table 3.36 parts
Resin: a resin shown in the following table 6.86 parts
Polymerizable compound: M-215 (manufactured by Toagosei Co., Ltd.) 1.41 parts
Photopolymerization initiator: initiator 1 1.55 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclopentanone 84.11 parts
(Formula 10)
Dye: a dye shown in the following table 3.36 parts
Resin: a resin shown in the following table 6.86 parts
POLYMERIZABLE compound: LIGHT ACRYLATE DCP-A (manufactured by Kyoeisha Chemical Co., Ltd.) 1.41 parts
Photopolymerization initiator: initiator 1 1.55 parts
Surfactant: MEGAFACE RS-72-K (manufactured by DIC Corporation, 30% PGMEA solution) 2.71 parts
Polymerization inhibitor: p-methoxyphenol 0.001 parts
Solvent: cyclohexanone 84.11 parts
(Formula 11)
Dye: a dye shown in the following table 3.36 parts
Resin: a resin shown in the following table 6.86 parts
POLYMERIZABLE compound: LIGHT ACRYLATE DCP-A (manufactured by Kyoeisha Chemical Co., Ltd.) 1.41 parts
Photopolymerization initiator: initiator 1 1.35 parts
Photopolymerization Initiator: IRGACURE 369 (manufactured by BASF SE) 0.25 parts
Surfactant: MEGAFACE RS-72-K (manufactured by DIC Corporation, 30% PGMEA solution) 2.71 parts
Polymerization inhibitor: p-methoxyphenol 0.001 parts
Solvent: PGMEA 84.11 parts
(Formula 12)
Dye: a dye shown in the following table 3.36 parts
Resin: a resin shown in the following table 6.86 parts
Polymerizable compound: M-315 (manufactured by Toagosei Co., Ltd.) 1.41 parts Photopolymerization initiator: initiator 1 0.75 parts Photopolymerization Initiator: IRGACURE 369 (manufactured by BASF SE) 0.80 parts Surfactant: MEGAFACE RS-72-K (manufactured by DIC Corporation, 30% PGMEA solution) 2.71 parts Polymerization inhibitor: p-methoxyphenol 0.001 parts Solvent: PGMEA 84.11 parts (Film Forming Process 1)

A composition shown in the following table was applied to a glass substrate or a 8-inch (=200 mm) silicon wafer using a spin coating method to form a composition layer such that the thickness of the formed film was 0.7 μm. An aggregation step shown in the following table was performed on the composition layer to form a film.

(Film Forming Process 2)

A composition shown in the following table was applied to a glass substrate or a 8-inch (=200 mm) silicon wafer using a spin coating method to form a composition layer such that the thickness of the formed film was 0.7 μm. An aggregation step shown in the following table was performed on the composition layer to form a film. Next, the entire surface of the film was exposed using an i-ray stepper exposure device FPA-3000 i5+(manufactured by Canon Corporation) at 1000 mJ/cm$^2$. Next, the substrate was heated using a hot plate at 220° C. for 5 minutes to form a film.

(Aggregation Step 1)

The composition layer was heated using a hot plate at 100° C. for 120 seconds.

(Aggregation Step 2)

The composition layer was heated using a hot plate at 60° C. for 120 seconds.

(Aggregation Step 3)

The composition layer was heated using a hot plate at 80° C. for 120 seconds.

(Aggregation Step 4)

The composition layer was heated using a hot plate at 130° C. for 120 seconds.

(Aggregation Step 5)

The composition layer was heated using a hot plate at 150° C. for 120 seconds.

(Aggregation Step 6)

The composition layer was heated using a hot plate at 40° C. for 1 hour.

(Aggregation Step 7)

The composition layer was spun at 3000 rpm for 150 seconds.

(Aggregation Step 8)

The composition layer was left to stand at a vacuum degree of 0.1 kPa at a temperature of 23° C. for 1 hour.

(Aggregation Step 9)

The composition layer was heated using a hot plate at 200° C. for 120 seconds.

(Light Fastness Evaluation)

The light transmittance of the obtained film in a wavelength range of 400 to 1300 nm was measured using an ultraviolet-visible-near infrared spectrophotometer U-4100 (manufactured by Hitachi High-Technologies Corporation). The film was irradiated with light using a xenon lamp at 100000 lux for 20 hours (corresponding to 2000000 lux·h). A maximum value (ΔT) of a change in transmittance at each wavelength in a wavelength range of 400 to 1300 nm before and after the irradiation of the xenon lamp was measured and was set as an index indicating light fastness. The lower the value of ΔT, the higher the light fastness. The evaluation criteria are as follows.

Change (ΔT) in Transmittance=|Transmittance (%) of Film before Test-Transmittance (%) of Film after Test|

—Evaluation Criteria—

5: ΔT<1

4: 1≤ΔT<3

3: 3≤ΔT<5

2: 5≤ΔT<10

1: 10≤ΔT (Evaluation of Heat Resistance)

The light transmittance of the obtained film in a wavelength range of 400 to 1300 nm was measured using an ultraviolet-visible-near infrared spectrophotometer U-4100 (manufactured by Hitachi High-Technologies Corporation). The film was heated using a hot plate at 240° C. for 300 seconds. A maximum value (ΔT) of a change in transmittance at each wavelength in a wavelength range of 400 to 1300 nm before and after heating at 240° C. for 300 seconds was measured and was set as an index indicating heat resistance. The lower the value of ΔT, the higher the heat resistance. The evaluation criteria are as follows.

Change (ΔT) in Transmittance=|Transmittance (%) of Film before Test-Transmittance (%) of Film after Test|

—Evaluation Criteria—

5: ΔT<1

4: 1≤ΔT<3

3: 3≤ΔT<5

2: 5≤ΔT<10

1: 10≤ΔT (Defect Evaluation 1)

A 1.2 μm dot pattern was formed on the obtained film using a dry etching method. In the substrate on which the pattern was formed, the number of defects having a size of 0.6 μm or more per 8-inch (=200 mm) wafer using a defect evaluation device ComPLUS. The evaluation standards are as follows.

—Evaluation Criteria—

5: Defect<50

4: 50≤Defect<100

3: 100≤Defect<500

2: 500≤Defect<1000

1: 1000≤Defect (Defect Evaluation 2)

Using each of the compositions, a 1.2 μm dot pattern was formed using a lithography method under the following conditions. That is, each of the compositions was applied using a spin coating method to form a composition layer such that the thickness of the formed film was 0.7 μm. Each aggregation step shown in the following table was performed on the composition layer to form a film. Next, the entire surface of the film was exposed using an i-ray stepper exposure device FPA-3000 i5+(manufactured by Canon Corporation) at 1000 mJ/cm$^2$. Next, the substrate was heated using a hot plate at 220° C. for 5 minutes to form a film. Next, using an i-ray stepper exposure device FPA-3000 i5+(manufactured by Canon Corporation), a 1.2 μm dot pattern was exposed through a mask at an exposure dose of 1000 mJ/cm$^2$. Next, puddle development was performed at 23° C. for 60 seconds using a tetramethylammonium hydroxide (TMAH) 0.3 mass % aqueous solution. Next, the substrate was rinsed by spin showering, was washed with pure water, and was heated using a hot plate at 220° C. for 5 minutes. As a result, a 1.2 μm dot pattern was obtained. In the substrate on which the pattern was formed, the number of defects having a size of 0.6 μm or more per 8-inch (=200 mm) wafer using a defect evaluation device ComPLUS. The evaluation standards are as follows.

—Evaluation Criteria—
  5: Defect<50
  4: 50≤Defect<100
  3: 100≤Defect<500
  2: 500≤Defect<1000
  1: 1000≤Defect

TABLE 2

| | Dye | Dye 2 | Mass Ratio between Dyes (Dye 1/Dye 2) | Formula | Film Forming Process | Aggregation Step | Resin | Mass Ratio Resin/Polymerizable Compound | Average Particle Size of Dye Aggregate nm | Light Fastness | Heat Resistance | Defect Evaluation 1 | Defect Evaluation 2 |
|---|---|---|---|---|---|---|---|---|---|---|---|---|---|
| Example 1 | Pyrrolopyrrole Dye 1 | — | — | Formula 1 | Film Forming Process 1 | Aggregation Step 1 | Resin 1 | — | 150 nm | 5 | 4 | 4 | — |
| Example 2 | Pyrrolopyrrole Dye 1 | Pyrrolopyrrole Dye 2 | (15/9) | Formula 1 | Film Forming Process 1 | Aggregation Step 1 | Resin 1 | — | 150 nm | 5 | 4 | 4 | — |
| Example 3 | Pyrrolopyrrole Dye 1 | Pyrrolopyrrole Dye 3 | (15/9) | Formula 1 | Film Forming Process 1 | Aggregation Step 1 | Resin 1 | — | 150 nm | 5 | 4 | 4 | — |
| Example 4 | Pyrrolopyrrole Dye 4 | — | — | Formula 1 | Film Forming Process 1 | Aggregation Step 1 | Resin 1 | — | 150 nm | 5 | 4 | 4 | — |
| Example 5 | Pyrrolopyrrole Dye 5 | — | — | Formula 1 | Film Forming Process 1 | Aggregation Step 1 | Resin 1 | — | 150 nm | 5 | 4 | 4 | — |
| Example 6 | Cyanine Dye 1 | — | — | Formula 1 | Film Forming Process 1 | Aggregation Step 1 | Resin 1 | — | 150 nm | 5 | 4 | 4 | — |
| Example 7 | Squarylium Dye 1 | — | — | Formula 1 | Film Forming Process 1 | Aggregation Step 1 | Resin 1 | — | 150 nm | 5 | 4 | 4 | — |
| Example 8 | Xanthene Dye 1 | — | — | Formula 1 | Film Forming Process 1 | Aggregation Step 1 | Resin 1 | — | 150 nm | 5 | 4 | 4 | — |
| Example 9 | Pyrrolopyrrole Dye 7 | — | — | Formula 1 | Film Forming Process 1 | Aggregation Step 1 | Resin 1 | — | 150 nm | 5 | 4 | 4 | — |
| Example 10 | Triarylmethane Dye 1 | — | — | Formula 1 | Film Forming Process 1 | Aggregation Step 1 | Resin 1 | — | 150 nm | 5 | 4 | 4 | — |
| Example 11 | Pyrrolopyrrole Dye 7 | — | — | Formula 1 | Film Forming Process 1 | Aggregation Step 1 | Resin 2 | — | 100 nm | 5 | 4 | 4 | — |
| Example 12 | Pyrrolopyrrole Dye 7 | — | — | Formula 1 | Film Forming Process 1 | Aggregation Step 1 | Resin 3 | — | 75 nm | 5 | 4 | 4 | — |
| Example 13 | Pyrrolopyrrole Dye 7 | — | — | Formula 1 | Film Forming Process 1 | Aggregation Step 1 | Resin 4 | — | 200 nm | 5 | 4 | 4 | — |
| Example 14 | Pyrrolopyrrole Dye 7 | — | — | Formula 1 | Film Forming Process 1 | Aggregation Step 1 | Resin 5 | — | 250 nm | 5 | 4 | 4 | — |
| Example 15 | Pyrrolopyrrole Dye 7 | — | — | Formula 1 | Film Forming Process 1 | Aggregation Step 1 | Resin 6 | — | 350 nm | 5 | 4 | 3 | — |
| Example 16 | Pyrrolopyrrole Dye 7 | — | — | Formula 1 | Film Forming Process 1 | Aggregation Step 1 | Resin 7 | — | 450 nm | 5 | 4 | 3 | — |
| Example 17 | Pyrrolopyrrole Dye 7 | — | — | Formula 1 | Film Forming Process 1 | Aggregation Step 1 | Resin 8 | — | 40 nm | 4 | 4 | 4 | — |
| Example 18 | Pyrrolopyrrole Dye 7 | — | — | Formula 1 | Film Forming Process 1 | Aggregation Step 1 | Resin 9 | — | 30 nm | 4 | 4 | 4 | — |
| Example 19 | Pyrrolopyrrole Dye 7 | — | — | Formula 1 | Film Forming Process 1 | Aggregation Step 1 | Resin 10 | — | 150 nm | 5 | 4 | 4 | — |
| Example 20 | Pyrrolopyrrole Dye 7 | — | — | Formula 1 | Film Forming Process 1 | Aggregation Step 1 | Resin 11 | — | 350 nm | 5 | 4 | 3 | — |
| Example 21 | Pyrrolopyrrole Dye 7 | — | — | Formula 1 | Film Forming Process 1 | Aggregation Step 1 | Resin 12 | — | 150 nm | 5 | 4 | 4 | — |
| Example 22 | Pyrrolopyrrole Dye 7 | — | — | Formula 1 | Film Forming Process 1 | Aggregation Step 1 | Resin 13 | — | 40 nm | 4 | 4 | 4 | — |
| Example 23 | Pyrrolopyrrole Dye 7 | — | — | Formula 1 | Film Forming Process 1 | Aggregation Step 1 | Resin 14 | — | 350 nm | 5 | 4 | 3 | — |
| Example 24 | Pyrrolopyrrole Dye 7 | — | — | Formula 1 | Film Forming Process 1 | Aggregation Step 1 | Resin 15 | — | 40 nm | 4 | 4 | 4 | — |
| Example 25 | Pyrrolopyrrole Dye 7 | — | — | Formula 1 | Film Forming Process 1 | Aggregation Step 1 | Resin 16 | — | 40 nm | 4 | 4 | 4 | — |
| Example 26 | Pyrrolopyrrole Dye 1 | Pyrrolopyrrole Dye 3 | (17/7) | Formula 1 | Film Forming Process 1 | Aggregation Step 1 | Resin 17 | — | 150 nm | 5 | 4 | 4 | — |
| Example 27 | Pyrrolopyrrole Dye 1 | Pyrrolopyrrole Dye 6 | (18/6) | Formula 1 | Film Forming Process 1 | Aggregation Step 1 | Resin 18 | — | 150 nm | 5 | 4 | 4 | — |
| Example 28 | Pyrrolopyrrole Dye 1 | Pyrrolopyrrole Dye 3 | (17/7) | Formula 1 | Film Forming Process 1 | Aggregation Step 1 | Resin 19 | — | 250 nm | 5 | 4 | 4 | — |
| Example 29 | Pyrrolopyrrole Dye 1 | — | — | Formula 1 | Film Forming Process 1 | Aggregation Step 2 | Resin 1 | — | 40 nm | 4 | 4 | 4 | — |
| Example 30 | Pyrrolopyrrole Dye 1 | — | — | Formula 1 | Film Forming Process 1 | Aggregation Step 3 | Resin 1 | — | 100 nm | 5 | 4 | 4 | — |
| Example 31 | Pyrrolopyrrole Dye 1 | — | — | Formula 1 | Film Forming Process 1 | Aggregation Step 4 | Resin 1 | — | 250 nm | 5 | 4 | 4 | — |
| Example 32 | Pyrrolopyrrole Dye 1 | — | — | Formula 1 | Film Forming Process 1 | Aggregation Step 5 | Resin 1 | — | 450 nm | 5 | 4 | 3 | — |
| Example 33 | Pyrrolopyrrole Dye 1 | — | — | Formula 1 | Film Forming Process 1 | Aggregation Step 6 | Resin 1 | — | 50 nm | 4 | 4 | 4 | — |
| Example 34 | Pyrrolopyrrole Dye 1 | — | — | Formula 1 | Film Forming Process 1 | Aggregation Step 7 | Resin 1 | — | 30 nm | 4 | 4 | 4 | — |
| Example 35 | Pyrrolopyrrole Dye 1 | — | — | Formula 1 | Film Forming Process 1 | Aggregation Step 8 | Resin 1 | — | 40 nm | 4 | 4 | 4 | — |
| Example 36 | Pyrrolopyrrole Dye 1 | Pyrrolopyrrole Dye 2 | (15/9) | Formula 1 | Film Forming Process 1 | Aggregation Step 6 | Resin 1 | — | 50 nm | 4 | 4 | 4 | — |
| Example 37 | Pyrrolopyrrole Dye 1 | Pyrrolopyrrole Dye 2 | (15/9) | Formula 1 | Film Forming Process 1 | Aggregation Step 7 | Resin 1 | — | 30 nm | 4 | 4 | 4 | — |
| Example 38 | Pyrrolopyrrole Dye 1 | Pyrrolopyrrole Dye 2 | (15/9) | Formula 1 | Film Forming Process 1 | Aggregation Step 8 | Resin 1 | — | 40 nm | 4 | 4 | 4 | — |

TABLE 3

| | Dye 1 | Dye 2 | Mass Ratio Dyes (Dye 1/Dye 2) | Formula | Film Forming Process | Aggregation Step | Resin | Mass Ratio Resin/Polymerizable Compound | Average Particle Size of Dye Aggregate (nm) | Light Fastness | Heat Resistance | Defect Evaluation 1 | Defect Evaluation 2 |
|---|---|---|---|---|---|---|---|---|---|---|---|---|---|
| Example 39 | Pyrrolopyrrole Dye 1 | — | — | Formula 2 | Film Forming Process 2 | Aggregation Step 1 | Resin 1 | 4.9 | 150 nm | 5 | 5 | 4 | 4 |
| Example 40 | Pyrrolopyrrole Dye 1 | Pyrrolopyrrole Dye 2 | (15/9) | Formula 2 | Film Forming Process 2 | Aggregation Step 1 | Resin 1 | 4.9 | 150 nm | 5 | 5 | 4 | 4 |
| Example 41 | Pyrrolopyrrole Dye 1 | Pyrrolopyrrole Dye 3 | (15/9) | Formula 2 | Film Forming Process 2 | Aggregation Step 1 | Resin 1 | 4.9 | 150 nm | 5 | 5 | 5 | 4 |
| Example 42 | Pyrrolopyrrole Dye 4 | — | — | Formula 2 | Film Forming Process 2 | Aggregation Step 1 | Resin 1 | 4.9 | 150 nm | 5 | 5 | 4 | 4 |
| Example 43 | Pyrrolopyrrole Dye 5 | — | — | Formula 2 | Film Forming Process 2 | Aggregation Step 1 | Resin 1 | 4.9 | 150 nm | 5 | 5 | 4 | 4 |
| Example 44 | Cyanine Dye 1 | — | — | Formula 2 | Film Forming Process 2 | Aggregation Step 1 | Resin 1 | 4.9 | 150 nm | 5 | 5 | 4 | 4 |
| Example 45 | Squarylium Dye 1 | — | — | Formula 2 | Film Forming Process 2 | Aggregation Step 1 | Resin 1 | 4.9 | 150 nm | 5 | 5 | 4 | 4 |
| Example 46 | Xanthene Dye 1 | — | — | Formula 2 | Film Forming Process 2 | Aggregation Step 1 | Resin 1 | 4.9 | 150 nm | 5 | 5 | 4 | 4 |
| Example 47 | Pyrromethene Dye 1 | — | — | Formula 2 | Film Forming Process 2 | Aggregation Step 1 | Resin 1 | 4.9 | 150 nm | 5 | 5 | 4 | 4 |
| Example 48 | Triarylmethane Dye 1 | — | — | Formula 2 | Film Forming Process 2 | Aggregation Step 1 | Resin 1 | 4.9 | 150 nm | 5 | 5 | 4 | 4 |
| Example 49 | Pyrrolopyrrole Dye 1 | — | — | Formula 3 | Film Forming Process 2 | Aggregation Step 1 | Resin 1 | 1 | 450 nm | 3 | 5 | 3 | 4 |
| Example 50 | Pyrrolopyrrole Dye 1 | — | — | Formula 4 | Film Forming Process 2 | Aggregation Step 1 | Resin 1 | 3 | 150 nm | 5 | 5 | 4 | 4 |
| Example 51 | Pyrrolopyrrole Dye 1 | — | — | Formula 5 | Film Forming Process 2 | Aggregation Step 1 | Resin 1 | 10 | 100 nm | 5 | 5 | 4 | 4 |
| Example 52 | Pyrrolopyrrole Dye 1 | — | — | Formula 6 | Film Forming Process 2 | Aggregation Step 1 | Resin 1 | 12 | 40 nm | 4 | 5 | 4 | 4 |
| Example 53 | Pyrrolopyrrole Dye 1 | Pyrrolopyrrole Dye 3 | (17/7) | Formula 8 | Film Forming Process 2 | Aggregation Step 1 | Resin 1 | 4.9 | 150 nm | 5 | 5 | 4 | 4 |
| Example 54 | Pyrrolopyrrole Dye 1 | Pyrrolopyrrole Dye 3 | (17/7) | Formula 9 | Film Forming Process 2 | Aggregation Step 1 | Resin 1 | 4.9 | 150 nm | 5 | 5 | 4 | 4 |
| Example 55 | Pyrrolopyrrole Dye 1 | Pyrrolopyrrole Dye 6 | (18/6) | Formula 10 | Film Forming Process 2 | Aggregation Step 1 | Resin 1 | 4.9 | 150 nm | 5 | 5 | 4 | 4 |
| Example 56 | Pyrrolopyrrole Dye 1 | Pyrrolopyrrole Dye 3 | (17/7) | Formula 11 | Film Forming Process 2 | Aggregation Step 1 | Resin 1 | 4.9 | 150 nm | 5 | 5 | 4 | 4 |
| Example 57 | Pyrrolopyrrole Dye 1 | Pyrrolopyrrole Dye 6 | (18/6) | Formula 12 | Film Forming Process 2 | Aggregation Step 1 | Resin 1 | 4.9 | 150 nm | 5 | 5 | 4 | 4 |

TABLE 4

| | Dye 1 | Formula | Film Forming Process | Aggregation Step | Resin | Mass Ratio Resin/Polymerizable Compound | Average Particle Size of Dye Aggregate (nm) | Light Fastness | Heat Resistance | Defect Evaluation 1 | Defect Evaluation 2 |
|---|---|---|---|---|---|---|---|---|---|---|---|
| Comparative Example 1 | Pyrrolopyrrole Dye 7 | Formula 7 | Film Forming Process 1 | Aggregation Step 1 | — | — | 600 nm | 3 | 3 | 1 | — |
| Comparative Example 2 | Pyrrolopyrrole Dye 4 | Formula 7 | Film Forming Process 1 | Aggregation Step 1 | — | — | 700 nm | 3 | 3 | 1 | — |
| Comparative Example 3 | Pyrrolopyrrole Dye 5 | Formula 7 | Film Forming Process 1 | Aggregation Step 1 | — | — | 1000 nm | 3 | 1 | 1 | — |
| Comparative Example 4 | Cyanine Dye 1 | Formula 7 | Film Forming Process 1 | Aggregation Step 1 | — | — | 500 nm | 3 | 1 | 1 | — |
| Comparative Example 5 | Squarylium Dye 1 | Formula 7 | Film Forming Process 1 | Aggregation Step 1 | — | — | 1000 nm | 3 | 3 | 1 | — |
| Comparative Example 6 | Xanthene Dye 1 | Formula 7 | Film Forming Process 1 | Aggregation Step 1 | — | — | 600 nm | 3 | 3 | 1 | — |
| Comparative Example 7 | Pyrromethene Dye 1 | Formula 7 | Film Forming Process 1 | Aggregation Step 1 | — | — | 900 nm | 3 | 3 | 1 | — |
| Comparative Example 8 | Triarylmethane Dye 1 | Formula 7 | Film Forming Process 1 | Aggregation Step 1 | — | — | 900 nm | 3 | 3 | 1 | — |

TABLE 4-continued

| | Dye 1 | Formula | Film Forming Process | Aggregation Step | Resin | Mass Ratio Resin/Polymerizable Compound | Average Particle Size of Dye Aggregate (nm) | Light Fastness | Heat Resistance | Defect Evaluation 1 | Defect Evaluation 2 |
|---|---|---|---|---|---|---|---|---|---|---|---|
| Comparative Example 9 | Pyrrolopyrrole Dye 7 | Formula 1 | Film Forming Process 1 | None | Resin 1 | — | 0 nm | 1 | 1 | 3 | — |
| Comparative Example 10 | Pyrrolopyrrole Dye 4 | Formula 1 | Film Forming Process 1 | None | Resin 1 | — | 0 nm | 1 | 1 | 3 | — |
| Comparative Example 11 | Pyrrolopyrrole Dye 5 | Formula 1 | Film Forming Process 1 | None | Resin 1 | — | 10 nm | 1 | 1 | 3 | — |
| Comparative Example 12 | Cyanine Dye 1 | Formula 1 | Film Forming Process 1 | None | Resin 1 | — | 10 nm | 1 | 1 | 3 | — |
| Comparative Example 13 | Squarylium Dye 1 | Formula 1 | Film Forming Process 1 | None | Resin 1 | — | 20 nm | 1 | 1 | 3 | — |
| Comparative Example 14 | Xanthene Dye 1 | Formula 1 | Film Forming Process 1 | None | Resin 1 | — | 10 nm | 1 | 1 | 3 | — |
| Comparative Example 15 | Pyrromethene Dye 1 | Formula 1 | Film Forming Process 1 | None | Resin 1 | — | 10 nm | 1 | 1 | 3 | — |
| Comparative Example 16 | Triarylmethane Dye 1 | Formula 1 | Film Forming Process 1 | None | Resin 1 | — | 0 nm | 1 | 1 | 3 | — |
| Comparative Example 17 | Pyrrolopyrrole Dye 7 | Formula 1 | Film Forming Process 1 | Aggregation Step 9 | Resin 1 | — | 700 nm | 3 | 3 | 1 | — |
| Comparative Example 18 | Pyrrolopyrrole Dye 7 | Formula 2 | Film Forming Process 1 | Aggregation Step 9 | Resin 1 | 4.9 | 700 nm | 3 | 3 | 1 | 1 |

As shown above in the tables, in the films obtained in Examples, the evaluation results of light fastness, heat resistance, and defects were excellent. On the other hand, in the films obtained in Comparative Examples, the evaluation results of heat resistance was poorer than that of Examples.

In Examples, by further adding a coloring material that shields visible light, an infrared transmitting filter having excellent spectral variation resistance was obtained.

The materials shown above in the tables are as follows.

Pyrrolopyrrole Dye 1: the following structure

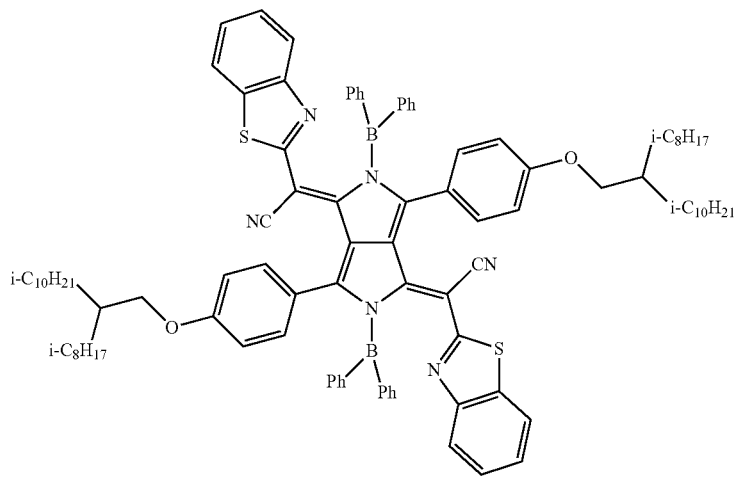

Pyrrolopyrrole Dye 2: the following structure
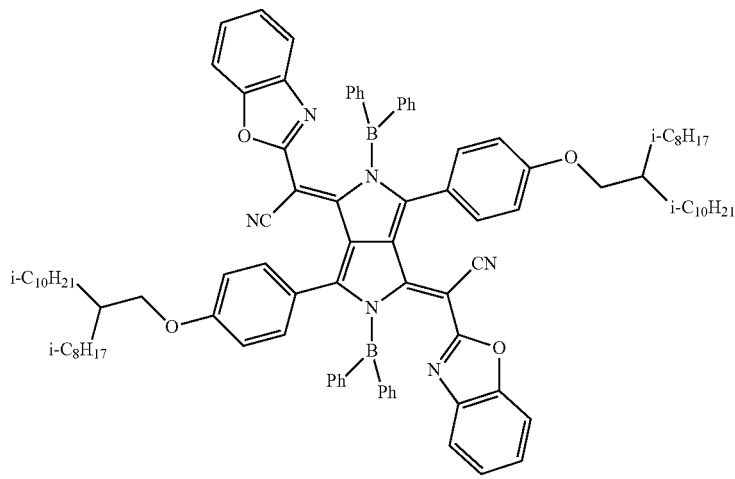
Pyrrolopyrrole Dye 3: the following structure
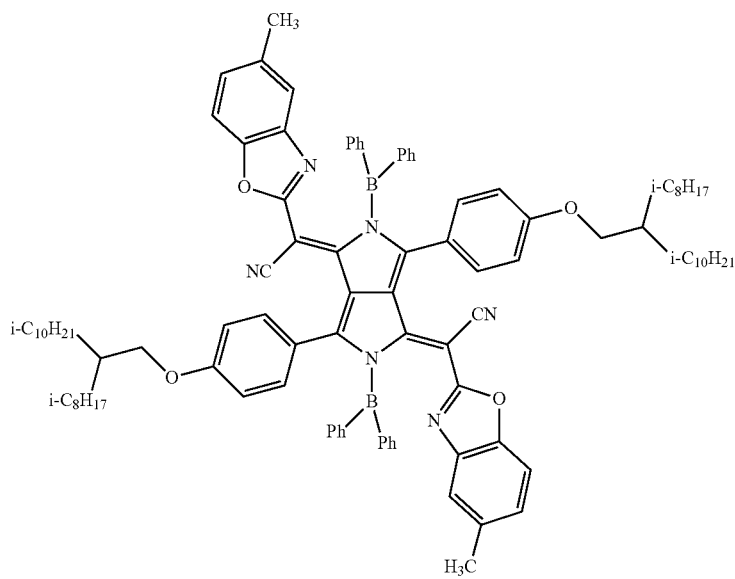

Pyrrolopyrrole Dye 4: the following structure
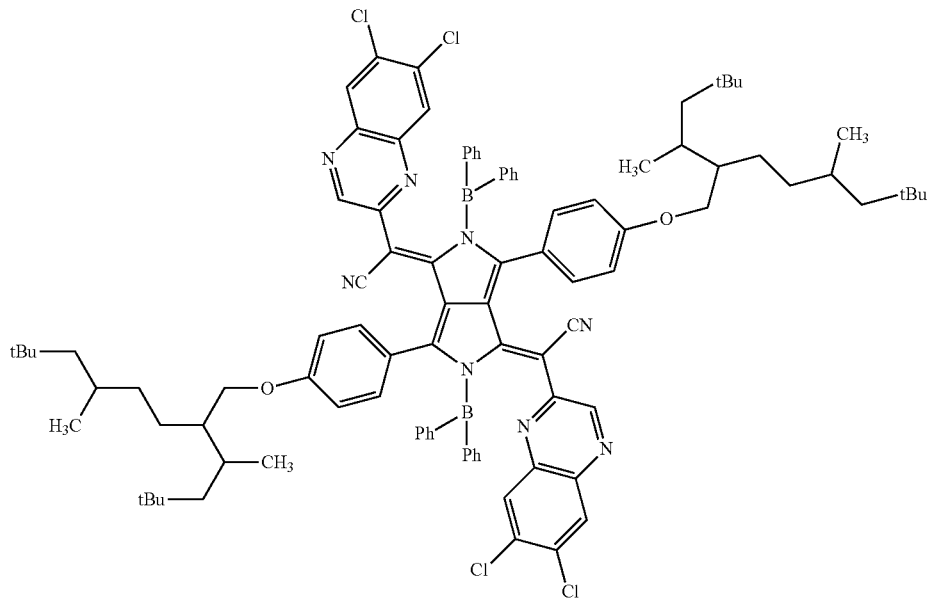
Pyrrolopyrrole Dye 5: the following structure
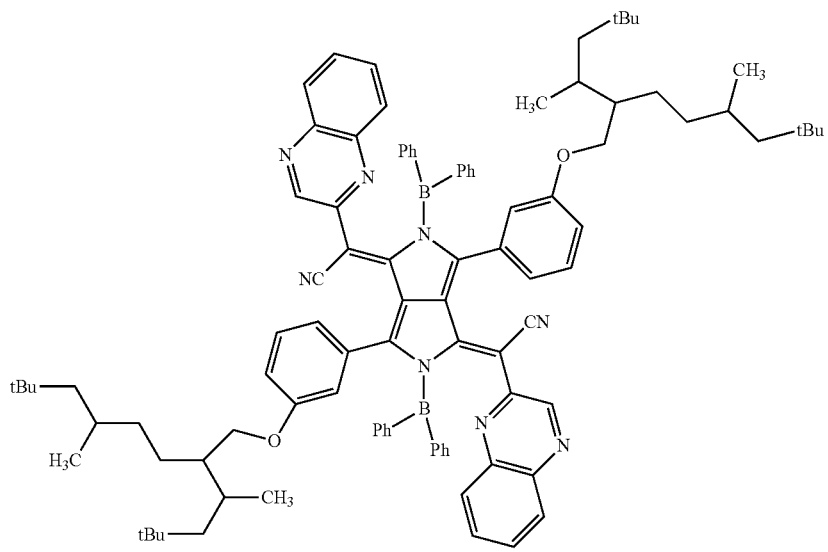

-continued
Pyrrolopyrrole Dye 6: the following structure
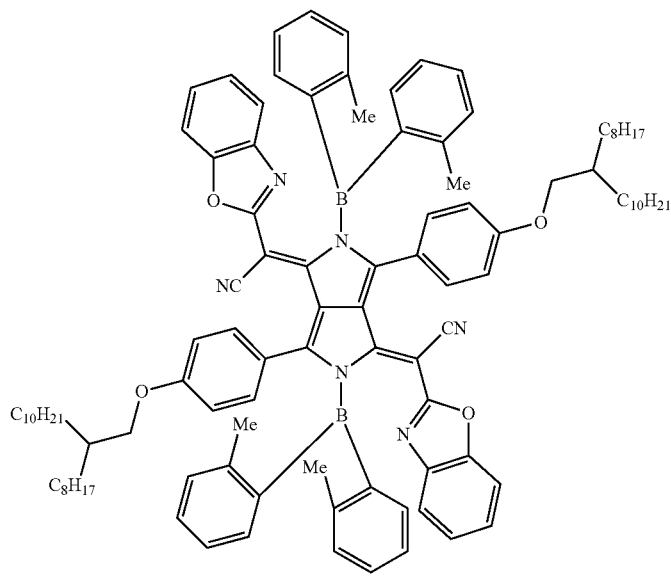
Pyrrolopyrrole Dye 7: the following structure
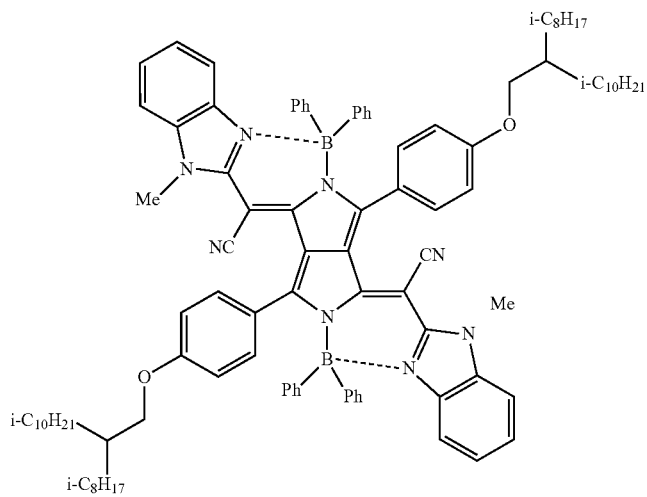
Cyanine dye 1: the following structure
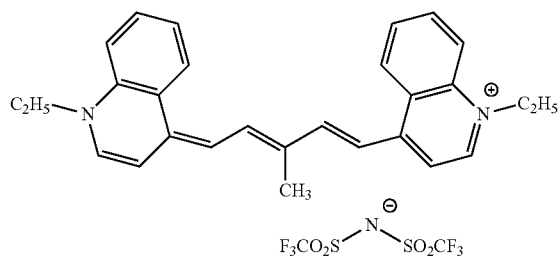

-continued
Squarylium dye 1: the following structure
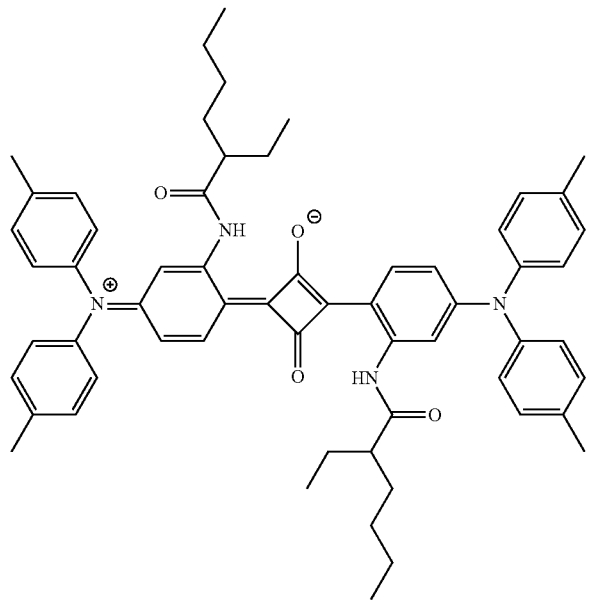
Xanthene dye 1: the following structure
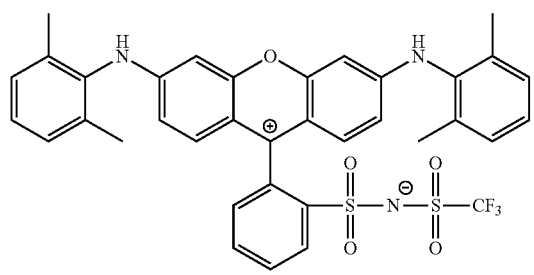
Pyrromethene dye 1: the following structure
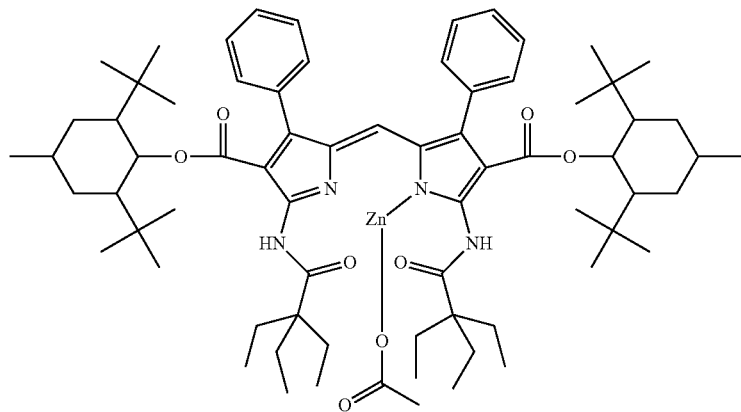

-continued
Triarylmethane dye 1: the following structure
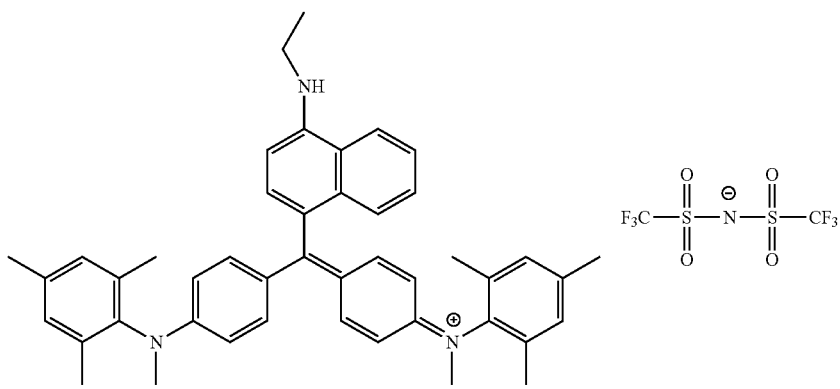
TABLE 5
| Kind | Structure | Glass Transition Temperature | Weight-Average Molecular Weight |
|---|---|---|---|
| Resin 1 | 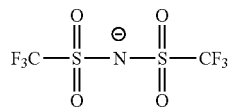 | 53° C. | 40000 |
| Resin 2 | | 68° C. | 25000 |
| Resin 3 | | 84° C. | 25000 |

TABLE 5-continued

| Kind | Structure | Glass Transition Temperature | Weight-Average Molecular Weight |
|---|---|---|---|
| Resin 4 | | 17° C. | 25000 |
| Resin 5 | | 3° C. | 25000 |
| Resin 6 | | −10° C. | 25000 |

In the structural formulae, numerical values added to main chains represent molar ratios.

TABLE 6

| Kind | Structure | Glass Transition Temperature | Weight-Average Molecular Weight |
|---|---|---|---|
| Resin 7 | | −26° C. | 25000 |

TABLE 6-continued

| Kind | Structure | Glass Transition Temperature | Weight-Average Molecular Weight |
|---|---|---|---|
| Resin 8 | [structure: copolymer with allyl ester (70) and adamantyl ester (30)] | 101° C. | 25000 |
| Resin 9 | [structure: copolymer with allyl ester (50) and bornyl ester (50)] | 114° C. | 25000 |
| Resin 10 | Same Structure as Resin 1 | 53° C. | 20000 |
| Resin 11 | Same Structure as Resin 1 | 53° C. | 10000 |
| Resin 12 | Same Structure as Resin 1 | 53° C. | 60000 |
| Resin 13 | Same Structure as Resin 1 | 53° C. | 80000 |
| Resin 14 | [structure: poly(isobutyl acrylate)-like with OCH2CH(CH3)2] | 53° C. | 19000 |
| Resin 15 | [structure: phenyl ester acrylate polymer] | 54° C. | 61000 |
| Resin 16 | Same Structure as Resin 1 | 53° C. | 62000 |
| Resin 17 | Same Structure as Resin 14 | 53° C. | 40000 |
| Resin 18 | Same Structure as Resin 15 | 54° C. | 50000 |
| Resin 19 | [structure: poly(methyl acrylate), OCH3] | 10° C. | 45000 |

In the structural formulae, numerical values added to main chains represent molar ratios.

EXPLANATION OF REFERENCES

110: solid image pickup element
111: infrared cut filter
112: color filter
114: infrared transmitting filter
115: microlens
116: planarizing layer

What is claimed is:

1. A film comprising:
   an aggregate of a dye;
   a coloring material that allows transmission of at least a part of light in an infrared range and shields light in a visible range; and
   a resin,
   wherein the aggregate of the dye has an average particle size of 30 to 450 nm, and
   the coloring material is a material that shields light in a wavelength range of 450 to 650 nm.

2. The film according to claim 1,
wherein the resin has a glass transition temperature of 0° C. to 100° C.

3. The film according to claim 1,
wherein the resin has a weight-average molecular weight of 20000 to 60000.

4. The film according to claim 1,
wherein the dye is a compound having an absorption maximum in a wavelength range of 650 to 1000 nm.

5. The film according to claim 1,
wherein the dye is at least one selected from the group consisting of a pyrrolopyrrole dye, a cyanine dye, and a squarylium dye.

6. A laminate comprising:
an infrared cut filter that includes the film according to claim 1; and
a color filter that includes a chromatic colorant.

7. A solid image pickup element comprising:
the film according to claim 1.

8. An image display device comprising:
the film according to claim 1.

9. An infrared sensor comprising:
the film according to claim 1.

10. The film according to claim 1, wherein the average particle size of the aggregate of the dye is 50 to 450 nm.

11. The film according to claim 1, wherein a content of a pigment in the coloring material is 90 mass % or higher with respect to the total mass of the coloring material.

12. The film according to claim 1, wherein the coloring material is a material in which a ratio A/B of a minimum value A of an absorbance in a wavelength range of 450 to 650 nm to a minimum value B of an absorbance in a wavelength range of 900 to 1300 nm is 4.5 or higher.

13. The film according to claim 1, wherein the resin contains at least one constituent unit selected from a unit represented by formulae (A 2-1) to (A 2-4):

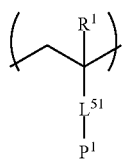

(A2-1)

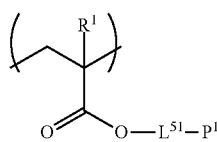

(A2-2)

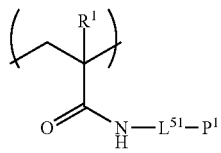

(A2-3)

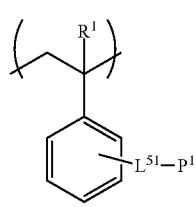

(A2-4)

wherein $R^1$ represents a hydrogen atom or an alkyl group;
$L^{51}$ represents a single bond or a divalent linking group;
$P^1$ represents a vinyl group, a (meth)allyl group, a (meth)acryloyl group, or a (meth)acryloyloxy group.

14. The film according to claim 1, wherein the dye has a solubility of 1 mass % or higher in at least one solvent selected from the group consisting of cyclopentanone, cyclohexanone, and propylene glycol monomethyl ether acetate at 23° C.

15. The film according to claim 1, wherein the dye is a pyrrolopyrrole dye.

16. The film according to claim 1, wherein the average particle size of the aggregate of the dye is 75 to 450 nm.

17. A film forming method for forming a film comprising an aggregate of a dye that has an average particle size of 30 to 450 nm and a resin, the film forming method comprising:
applying a composition including a dye, a resin, and a solvent to a support to form a composition layer on the support; and
causing the dye included in the composition layer to aggregate;
wherein the causing the dye included in the composition layer to aggregate is performed by heating the composition layer at a temperature that is higher than the glass transition temperature of the resin by 20° C. to 80° C.

18. The film forming method according to claim 17,
wherein the resin includes a resin having a polymerizable group and the composition further includes a photopolymerization initiator; or
the composition includes a polymerizable compound other than the resin and a photopolymerization initiator, and
the film forming method further comprises exposing the composition layer after the causing the dye included in the composition layer to aggregate.

19. The film forming method according to claim 18,
wherein the composition includes the polymerizable compound, and
a mass ratio resin/polymerizable compound of the resin to the polymerizable compound is 3 to 10.

20. The film forming method according to claim 17, further comprising:
forming a pattern.

21. The film forming method according to claim 17, wherein the dye has a solubility of 1 mass % or higher in at least one solvent selected from the group consisting of cyclopentanone, cyclohexanone, and propylene glycol monomethyl ether acetate at 23° C.

22. The film forming method according to claim 17, wherein the dye is a pyrrolopyrrole dye.

23. The film forming method according to claim 17, wherein the average particle size of the aggregate of the dye is 75 to 450 nm.

24. An optical filter comprising:
a pixel selected from the group consisting of a red pixel, a green pixel, a blue pixel, a magenta pixel, a yellow pixel, a cyan pixel, a black pixel, and an achromatic pixel; and
a pixel that includes a film comprising an aggregate of a dye and a resin,
wherein the aggregate of the dye has an average particle size of 30 to 450 nm, and
the dye is at least one selected from the group consisting of a pyrrolopyrrole dye, a cyanine dye, and a squarylium dye.

25. The optical filter according to claim 24,
wherein the optical filter is a color filter, an infrared cut filter, or an infrared transmitting filter.

26. The optical filter according to claim 24, further comprising:
an antireflection film.

27. The optical filter according to claim 24, wherein the dye has a solubility of 1 mass % or higher in at least one solvent selected from the group consisting of cyclopentanone, cyclohexanone, and propylene glycol monomethyl ether acetate at 23° C.

28. The optical filter according to claim 24, wherein the dye is a pyrrolopyrrole dye.

29. The optical filter according to claim 24, wherein the average particle size of the aggregate of the dye is 75 to 450 nm.

* * * * *